United States Patent
Yokoi

(10) Patent No.: US 11,326,006 B2
(45) Date of Patent: May 10, 2022

(54) ORGANIC THIN-FILM TRANSISTOR AND POLYMER COMPOUND

(71) Applicant: SUMITOMO CHEMICAL COMPANY, LIMITED, Tokyo (JP)

(72) Inventor: Yuki Yokoi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 352 days.

(21) Appl. No.: 16/620,137

(22) PCT Filed: Jun. 27, 2018

(86) PCT No.: PCT/JP2018/024335
§ 371 (c)(1),
(2) Date: Dec. 6, 2019

(87) PCT Pub. No.: WO2019/009152
PCT Pub. Date: Jan. 10, 2019

(65) Prior Publication Data
US 2021/0151680 A1  May 20, 2021

(30) Foreign Application Priority Data

Jul. 4, 2017  (JP) .............................. JP2017-130925

(51) Int. Cl.
*C08F 212/08* (2006.01)
*C08G 18/80* (2006.01)
(Continued)

(52) U.S. Cl.
CPC ........ *C08F 212/08* (2013.01); *C08F 220/365* (2020.02); *C08G 18/80* (2013.01);
(Continued)

(58) Field of Classification Search
CPC ... C08F 212/08; H01L 51/0036; H01L 51/004
See application file for complete search history.

(56) References Cited

U.S. PATENT DOCUMENTS

2011/0147726 A1  6/2011  Yahagi
2011/0297920 A1  12/2011  Fukuda

FOREIGN PATENT DOCUMENTS

JP  2011-253990 A  12/2011
JP  2013-504186 A  2/2013
(Continued)

OTHER PUBLICATIONS

Sheng-Xia Li et al—"Application of thermal azide-alkyne cycloaddition(TAAC) reaction as a low temperature cross-linking method in polymer gate dielectrics for organic field-effect transistors"; Journal of Material Chemistry C; pp. 3517-3520.
(Continued)

*Primary Examiner* — Anthony Ho
(74) *Attorney, Agent, or Firm* — Foley & Lardner LLP

(57) ABSTRACT

A gate insulation film composed of a polymer compound containing at least one repeating unit selected from the group consisting of a repeating unit of formula (2) and a repeating unit of formula (3); a repeating unit of formula (4) and a repeating unit of formula (1), or composed of a composition containing the polymer compound, wherein the molar ratio of the repeating unit of formula (4) to the sum of the repeating unit of formula (2) and the repeating unit of formula (3) is 50/100 to 200/100 with the total charging amount (molar quantity) of the repeating unit of formula (2) and the repeating unit of formula (3) being 100 and the content of the repeating unit of the following formula (1) is 75% by mol or more with the total content of all repeating units in the polymer compound being 100% by mol.

9 Claims, 2 Drawing Sheets

(51) Int. Cl.
*H01L 51/00* (2006.01)
*H01L 51/05* (2006.01)
*C08F 220/36* (2006.01)

(52) U.S. Cl.
CPC ........ *H01L 51/004* (2013.01); *H01L 51/0036* (2013.01); *H01L 51/0074* (2013.01); *H01L 51/0541* (2013.01)

(56) References Cited

FOREIGN PATENT DOCUMENTS

| JP | 2016-033182 A | 3/2016 |
|---|---|---|
| JP | 2017-092453 A | 5/2017 |
| WO | WO-2010/001758 A1 | 1/2010 |
| WO | WO-2012/108327 A1 | 8/2012 |
| WO | WO-2012/161106 A1 | 11/2012 |
| WO | WO-2017/141933 A1 | 8/2017 |

OTHER PUBLICATIONS

Li et al., "Application of thermal azide-alkyne cycloaddition (TAAC) reaction as a low temperature cross-linking method in polymer gate dielectrics for organic field-effect transistors," Journal of Materials Chemistry C, vol. 2, 2014, pp. 3517-3520.

International Searching Authority, "International Search Report," issued in connection with International Patent Application No. PCT/JP2018/024335, dated Sep. 18, 2018.

International Searching Authority, "Written Opinion," issued in connection with International Patent Application No. PCT/JP2018/024335, dated Sep. 18, 2018.

[Fig. 1]
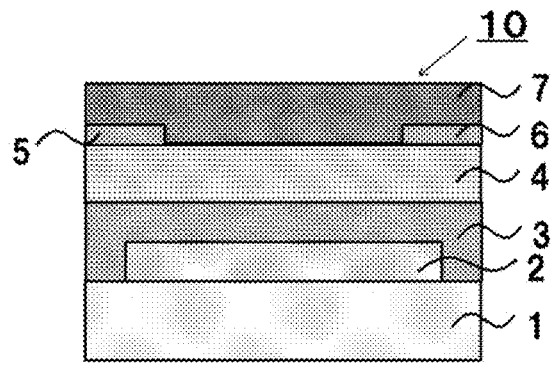
[Fig. 2]
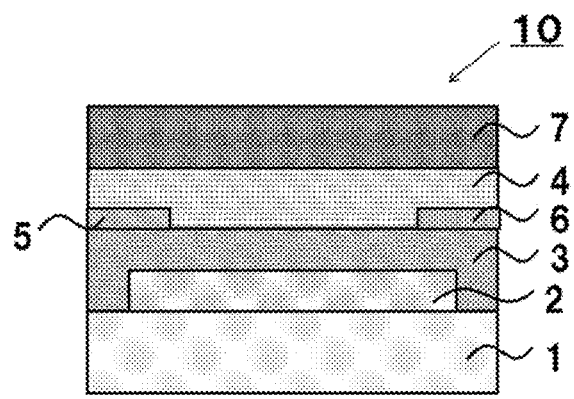
[Fig. 3]
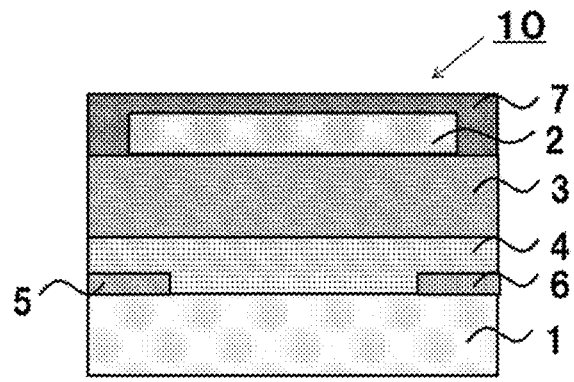

[Fig. 4]
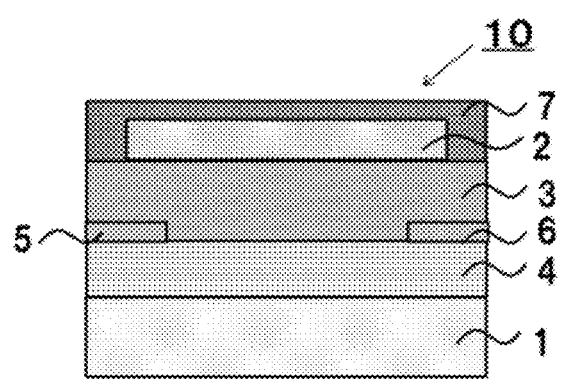

ORGANIC THIN-FILM TRANSISTOR AND POLYMER COMPOUND

RELATED APPLICATIONS

The present application claims priority under 37 U.S.C. § 371 to International Patent Application No. PCT/JP2018/024335, filed Jun. 27, 2018, which claims priority to and the benefit of Japanese Patent Application No. 2017-130925, filed on Jul. 4, 2017. The contents of these applications are hereby incorporated by reference in their entireties

TECHNICAL FIELD

The present invention relates to an organic thin-film transistor and a polymer compound.

BACKGROUND ART

As a driving device for driving a light emitting device such as an electroluminescent device, a thin film field-effect transistor in which a voltage applied to a gate electrode (in the present specification, described as gate voltage in some cases) acts on a semiconductor layer via a gate insulating layer to control on/off of a drain current (in the present specification, described as organic thin-film transistor in some cases) has attracted attention.

As the organic thin-film transistor, for example, an organic thin-film transistor having a gate electrode, a source electrode, a drain electrode, an organic semiconductor layer and a gate insulation layer in which the gate insulation layer is a layer composed of a composition containing a polymer compound, and the above-described polymer compound is a polymer compound containing a repeating unit having a crosslinkable group and a repeating unit represented by the following formula in which the content of the repeating unit represented by the following formula is 50% by mol with the total content of all repeating units contained in the above-described polymer compound being 100% by mol has been reported (Non-Patent Document 1).

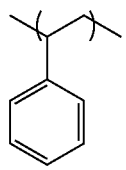

PRIOR ART DOCUMENT

Patent Document

[Patent Document 1] Japanese Translation of PCT International Application Publication (JP-T) No. 2013-504186
[Non-Patent Document 1] Journal of Materials Chemistry C, 2014, 2, p. 3517-3520

SUMMARY OF THE INVENTION

Problem to be Solved by the Invention

It is known that an organic thin-film transistor in which a protective layer is further laminated on a gate insulation layer is desirable (Patent Document 1). In such an organic thin-film transistor, it is required to improve the solvent resistance of a gate insulation film since an ink as a material of the protective layer is applied on the gate insulation film to form a protective film.

The present invention has an object of providing a gate insulation film giving an organic thin-film transistor excellent in carrier mobility and having high solvent resistance, a polymer compound which is useful for the gate insulation film, or a composition containing the polymer compound.

Means for Solving the Problem

That is, the present invention provides the following [1] to [9].

[1] A gate insulation film composed of a polymer compound containing at least one repeating unit selected from the group consisting of a repeating unit represented by the formula (2) and a repeating unit represented by the formula (3); a repeating unit represented by the formula (4) and a repeating unit represented by the following formula (1), or composed of a composition containing the polymer compound, wherein the above-described polymer compound is a polymer compound in which the molar ratio of the repeating unit represented by the formula (4) to the sum of the repeating unit represented by the formula (2) and the repeating unit represented by the formula (3) is 50/100 to 200/100 with the total charging amount (molar quantity) of the repeating unit represented by the formula (2) and the repeating unit represented by the formula (3) being 100 and the content of the repeating unit represented by the following formula (1) is 75% by mol or more with the total content of all repeating units contained in the above-described polymer compound being 100% by mol, and in the above-described composition, the total mass of the above-described polymer compound is 80% by mass or more with respect to the whole composition and the total mass of compounds having two or more amino groups is 4.5% by mass or less with respect to the above-described polymer compound:

[Chemical Formula 1]

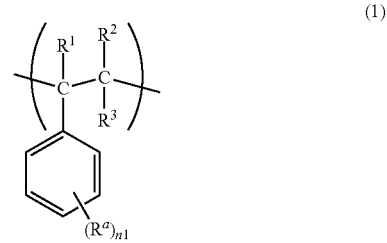

(1)

(in the formula (1), $R^1$, $R^2$ and $R^3$ each independently represent a hydrogen atom or a methyl group.

$R^a$ represents a monovalent hydrocarbon group having a number of carbon atoms of 1 to 6, and a plurality of $R^a$ may be combined together to form a ring together with carbon atoms to which they are attached.

n1 represents an integer of 0 to 5.)

[Chemical Formula 2]

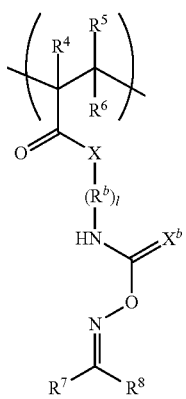

(2)

[Chemical Formula 3]

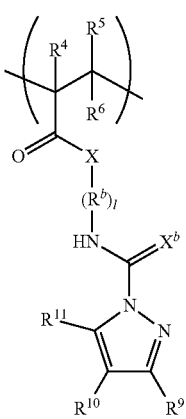

(3)

(in the formulae (2) and (3), $R^4$, $R^5$ and $R^6$ each independently represent a hydrogen atom or a methyl group.

$X^b$ represents an oxygen atom or a sulfur atom.

$R^7$ to $R^{11}$ each independently represent a hydrogen atom or a monovalent organic group having a number of carbon atoms of 1 to 20.

$R^b$ represents a divalent organic group having a number of carbon atoms of 1 to 20.

X represents an oxygen atom or a group represented by —NR″—.

R″ represents a hydrogen atom or a monovalent organic group having a number of carbon atoms of 1 to 20.

l represents an integer of 1 to 6.

When a plurality of $R^b$ are present, they may be mutually different.)

[Chemical Formula 4]

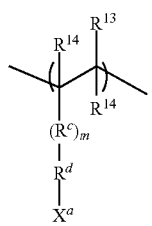

(4)

(in the formula (4), $R^{12}$, $R^{13}$ and $R^{14}$ each independently represent a hydrogen atom or a methyl group.

$R^C$ represents a divalent organic group having a number of carbon atoms of 1 to 20, a group represented by —O—, a group represented by —CO—, a group represented by —COO—, a group represented by —NHCO— or a group represented by —NHCOO—. Any of respective two connecting bonds of these groups may be situated at the side of a carbon atom to which $R^{12}$ is bonded.

$R^d$ represents a single bond or a divalent organic group having a number of carbon atoms of 1 to 20.

m represents an integer of 0 to 6.

$X^a$ represents a hydroxy group or a carboxy group.

When a plurality of $R^C$ are present, they may be mutually different.).

[2] The gate insulation film according to [1], wherein the above-described polymer compound is a polymer compound in which the total content of a repeating unit represented by the formula (1), a repeating unit represented by the formula (2) or (3) and a repeating unit represented by the formula (4) is 90% by mol or more with the total content of all repeating units contained in the above-described polymer compound being 100% by mol.

[3] A gate insulation film composed of a polymer compound containing at least one repeating unit selected from the group consisting of a repeating unit represented by the formula (2) and a repeating unit represented by the formula (3); a repeating unit represented by the formula (6) and a repeating unit represented by the following formula (1), or a hardened product of the polymer compound, or composed of a composition containing the polymer compound, or a hardened product of the composition, wherein the above-described polymer compound is a polymer compound in which the molar ratio of the repeating unit represented by the formula (6) to the sum of the repeating unit represented by the formula (2) and the repeating unit represented by the formula (3) is 50/100 to 200/100 with the total charging amount (molar quantity) of the repeating unit represented by the formula (2) and the repeating unit represented by the formula (3) being 100, and the content of the repeating unit represented by the following formula (1) is 75% by mol or more with the total content of all repeating units contained in the above-described polymer compound being 100% by mol, and in the above-described composition, the total mass of the above-described polymer compound is 80% by mass or more with respect to the whole composition and the total mass of compounds having two or more amino groups is 4.5% by mass or less with respect to the above-described polymer compound.

[Chemical Formula 5]

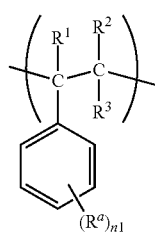

(1)

(in the formula (1),
$R^1$, $R^2$ and $R^3$ each independently represent a hydrogen atom or a methyl group.
$R^a$ represents a monovalent hydrocarbon group having a number of carbon atoms of 1 to 6, and a plurality of $R^a$ may be combined together to form a ring together with carbon atoms to which they are attached.
n1 represents an integer of 0 to 5.)

[Chemical Formula 6]

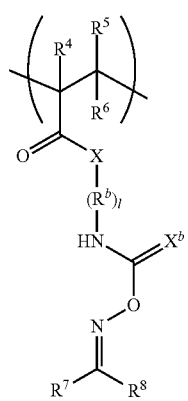

(2)

[Chemical Formula 7]

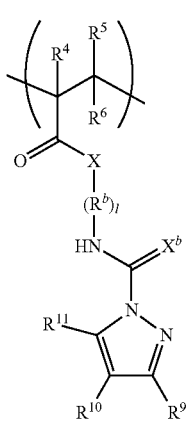

(3)

(in the formulae (2) and (3),
$R^4$, $R^5$ and $R^6$ each independently represent a hydrogen atom or a methyl group.
$X^b$ represents an oxygen atom or a sulfur atom.
$R^7$ to $R^{11}$ each independently represent a hydrogen atom or a monovalent organic group having a number of carbon atoms of 1 to 20.
$R^b$ represents a divalent organic group having a number of carbon atoms of 1 to 20.

X represents an oxygen atom or a group represented by —NR''—.
R'' represents a hydrogen atom or a monovalent organic group having a number of carbon atoms of 1 to 20.
l represents an integer of 1 to 6.
When a plurality of $R^b$ are present, they may be mutually different.)

[Chemical Formula 8]

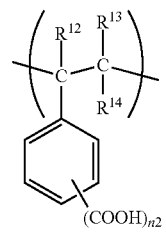

(6)

(in the formula (6),
$R^{12}$, $R^{13}$ and $R^{14}$ each independently represent a hydrogen atom or a methyl group.
n2 represents an integer of 1 to 5.).

[4] A thin-film transistor having a gate electrode, a source electrode, a drain electrode, a semiconductor layer and a gate insulation layer, wherein
the gate insulation layer is composed the gate insulation film according to any one of [1] to [3].

[5] The thin-film transistor according to [4], wherein the above-described semiconductor layer is an organic semiconductor layer.

[6] The thin-film transistor according to [5], wherein the above-described organic semiconductor layer contains a compound containing a structure represented by the following formula (5):

[Chemical Formula 9]

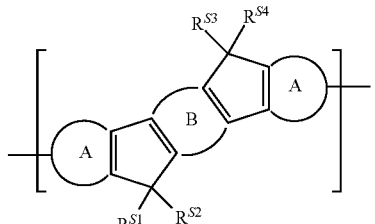

(5)

(in the formula (5),
$R^{S1}$, $R^{S2}$, $R^{S3}$ and $R^{S4}$ each independently represent an alkyl group having a number of carbon atoms of 1 to 20 optionally having a substituent, an alkoxy group having a number of carbon atoms of 1 to 20 optionally having a substituent, an alkylthio group having a number of carbon atoms of 1 to 20 optionally having a substituent, an alkylcarbonyl group having a number of carbon atoms of 2 to 20 optionally having a substituent, an alkoxycarbonyl group having a number of carbon atoms of 2 to 20 optionally having a substituent, a dialkylamino group having a number of carbon atoms of 2 to 20 optionally having a substituent, a monovalent aromatic hydrocarbon group having a number of carbon atoms of 6 to 20 having an alkyl group as a substituent, a monovalent aromatic hydrocarbon group having a number of carbon atoms of 6 to 20 having an alkoxy group as a substituent, a monovalent heterocyclic group having a number of carbon atoms of 2 to 20 having an alkyl group as a substituent, a monovalent heterocyclic group having a number of carbon atoms of 2 to 20 having an alkoxy group as a substituent, an alkynyl group having a number of carbon atoms of 2 to 22 or an alkenyl group having a number of carbon atoms of 2 to 22.

ring A represents a thiophene ring, a benzothiophene ring or a thienothiophene ring, and two rings A may be the same or different.

ring B represents an aromatic ring, an aromatic heterocyclic ring, or a condensed ring obtained by condensing 2 to 4 rings selected from the group consisting of aromatic rings and aromatic heterocyclic rings, and the foregoing rings optionally have a substituent.).

[7] The thin-film transistor according to any one of [4] to [6], having a top gate type structure.

[8] A polymer compound comprising a repeating unit represented by the formula (1), at least one repeating unit selected from the group consisting of a repeating unit represented by the formula (2) and a repeating unit represented by the formula (3), and a repeating unit represented by the formula (6), wherein the content of the repeating unit represented by the following formula (1) is 75% by mol or more with the total content of all repeating units contained in the above-described polymer compound being 100% by mol:

[Chemical Formula 10]

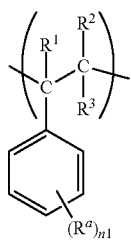

(1)

(in the formula (1), $R^1$, $R^2$ and $R^3$ each independently represent a hydrogen atom or a methyl group.

$R^a$ represents a monovalent hydrocarbon group having a number of carbon atoms of 1 to 6, and a plurality of $R^a$ may be combined together to form a ring together with carbon atoms to which they are attached.

n1 represents an integer of 0 to 5.)

[Chemical Formula 11]

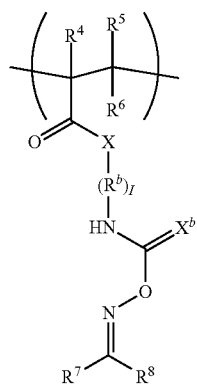

(2)

[Chemical Formula 12]

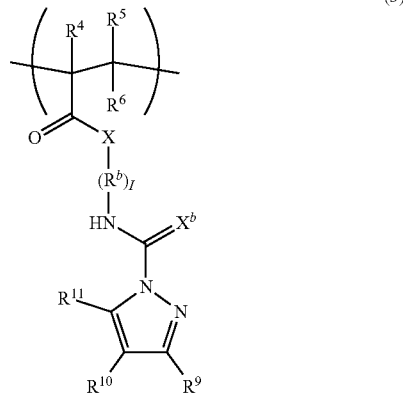

(3)

(in the formulae (2) and (3), $R^4$, $R^5$ and $R^6$ each independently represent a hydrogen atom or a methyl group.

$X^b$ represents an oxygen atom or a sulfur atom.

$R^7$ to $R^{11}$ each independently represent a hydrogen atom or a monovalent organic group having a number of carbon atoms of 1 to 20.

$R^b$ represents a divalent organic group having a number of carbon atoms of 1 to 20.

X represents an oxygen atom or a group represented by —$NR^n$—.

$R^n$ represents a hydrogen atom or a monovalent organic group having a number of carbon atoms of 1 to 20.

l represents an integer of 1 to 6.

When a plurality of $R^b$ are present, they may be mutually different.)

[Chemical Formula 13]

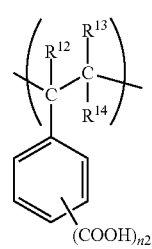

(6)

(in the formula (6), $R^{12}$, $R^{13}$ and $R^{14}$ each independently represent a hydrogen atom or a methyl group.

n2 represents an integer of 1 to 5.).

[9] An ink comprising the polymer compound according to [8] and an organic solvent.

Effect of the Invention

The present invention can provide a gate insulation film giving an organic thin-film transistor excellent in carrier mobility and having high solvent resistance, a polymer compound which is useful form the gate insulation film, and a composition comprising the polymer compound.

BRIEF EXPLANATION OF DRAWINGS

FIG. 1 is a schematic view schematically showing the structure of a bottom gate top contact type thin-film transistor.

FIG. 2 is a schematic view schematically showing the structure of a bottom gate bottom contact type thin-film transistor.

FIG. 3 is a schematic view schematically showing the structure of a top gate bottom contact type thin-film transistor.

FIG. 4 is a schematic view schematically showing the structure of a top gate top contact type thin-film transistor.

MODES FOR CARRYING OUT THE INVENTION

Next, embodiments of the present invention will be described further in detail. Each drawing referred to shows only schematically the shape, size and arrangement of components to the extent that the invention can be understood. The present invention is not limited to the following description, and each component can be appropriately changed without departing from the scope of the present invention. In the drawings used for the description, the same components are denoted by the same reference numerals, and overlapping descriptions are omitted in some cases. Further, the constitution according to the embodiment of the present invention is not necessarily manufactured or used in the arrangement shown in the drawings.

Explanation of Common Term

Terms commonly used in the present specification have the following meanings unless otherwise stated.

"Repeating unit" means a unit structure occurring twice or more in a polymer compound.

"Heterocyclic compound" means an organic compound having a cyclic structure in which elements constituting the ring include not only a carbon atom but also hetero atoms such as oxygen, sulfur, nitrogen, phosphorus, boron, arsenic and the like contained in the ring.

"Conjugate" means a state in which an unsaturated bond—a single bond—an unsaturated bond are chained in this order, two n bonds of n orbitals are adjacent, and respective n electrons are arranged in parallel, and n electrons are not localized on an unsaturated bond but n electrons are spread onto an adjacent single bond and n electrons are delocalized. The unsaturated bond means a double bond or a triple bond.

"Polymer compound" means a compound having a polystyrene-equivalent number-average molecular weight of 1,000 or more.

"Low molecular compound" means a compound having no molecular weight distribution and having a molecular weight of $1 \times 10^4$ or less.

"Amino group" means a group represented by $-NH_2$.

"Halogen atom" is a fluorine atom, a chlorine atom, a bromine atom or an iodine atom.

"Non-halogen polymer compound" means a polymer compound containing no halogen atom.

The monovalent organic group having a number of carbon atoms of 1 to 20 may be any of linear, branched and cyclic, and may be an aliphatic hydrocarbon group or an aromatic hydrocarbon group.

The monovalent organic group having a number of carbon atoms of 1 to 20 includes, for example, a monovalent linear aliphatic hydrocarbon group having a number of carbon atoms of 1 to 20, a monovalent branched aliphatic hydrocarbon group having a number of carbon atoms of 3 to 20, a monovalent alicyclic hydrocarbon group having a number of carbon atoms of 3 to 20, a monovalent aromatic hydrocarbon group having a number of carbon atoms of 6 to 20, an alkoxy group having a number of carbon atoms of 1 to 20, an aryloxy group having a number of carbon atoms of 6 to 20, an acyl group having a number of carbon atoms of 2 to 20, an alkoxycarbonyl group having a number of carbon atoms of 2 to 20 and an aryloxycarbonyl group having a number of carbon atoms of 7 to 20.

The number of carbon atoms does not include the number of carbon atoms of the substituent (The same shall apply hereinafter, in the present specification).

A hydrogen atom in these groups may be substituted with an alkyl group having a number of carbon atoms of 1 to 20, a cycloalkyl group having a number of carbon atoms of 3 to 20, an alkoxy group having a number of carbon atoms of 1 to 20, a cycloalkoxy group having a number of carbon atoms of 3 to 20, a monovalent aromatic hydrocarbon group having a number of carbon atoms of 6 to 20 or a halogen atom.

Specific examples of the monovalent organic group having a number of carbon atoms of 1 to 20 include, a methyl group, an ethyl group, a propyl group, a butyl group, a pentyl group, a hexyl group, an isopropyl group, an isobutyl group, a tert-butyl group, a cyclopropyl group, a cyclobutyl group, a cyclopentyl group, a cyclohexyl group, a cyclopentynyl group, a cyclohexynyl group, a trifluoromethyl group, a trifluoroethyl group, a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, a pentafluorophenyl group, a trifluoromethylphenyl group, a chlorophenyl group, a bromophenyl group, a methoxy group, an ethoxy group, a phenoxy group, an acetyl group, a benzoyl group, a methoxycarbonyl group, a phenoxycarbonyl group, a benzyl group and the like.

The monovalent organic group having a number of carbon atoms of 1 to 20 is preferably an alkyl group having a number of carbon atoms of 1 to 20 or a cycloalkyl group having a number of carbon atoms of 3 to 20.

The alkyl group having a number of carbon atoms of 1 to 20 may be any of linear and branched.

The alkyl group having a number of carbon atoms of 1 to 20 includes, for example, a methyl group, an ethyl group, a propyl group, an isopropyl group, a butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group.

The alkyl group having a number of carbon atoms of 1 to 20 may have a cycloalkyl group having a number of carbon atoms of 3 to 20, an alkoxy group having a number of carbon atoms of 1 to 20, a cycloalkoxy group having a number of carbon atoms of 3 to 20, a monovalent aromatic hydrocarbon group having a number of carbon atoms of 6 to 20 or a fluorine atom as a substituent.

The alkyl group having a number of carbon atoms of 1 to 20 having a substituent includes, for example, a trifluoromethyl group, a pentafluoroethyl group, a perfluorobutyl group, a perfluorohexyl group, a perfluorooctyl group, a benzyl group, a 2-phenylethyl group, a 3-phenylpropyl group, a 3-(4-methylphenyl)propyl group, a 3-(3,5-di-hexylphenyl)propyl group, a 6-ethyloxyhexyl group, a methoxymethyl group and an ethoxyethyl group.

The cycloalkyl group having a number of carbon atoms of 3 to 20 includes, for example, a cyclopentyl group and a cyclohexyl group.

The cycloalkyl group having a number of carbon atoms of 3 to 20 may have an alkyl group having a number of carbon atoms of 1 to 20, an alkoxy group having a number of carbon atoms of 1 to 20, a cycloalkoxy group having a number of carbon atoms of 3 to 20, a monovalent aromatic hydrocarbon group having a number of carbon atoms of 6 to 20 or a fluorine atom as a substituent.

The divalent organic group having a number of carbon atoms of 1 to 20 may be any of linear, branched and cyclic, and may be an aliphatic hydrocarbon group or an aromatic hydrocarbon group.

The divalent organic group having a number of carbon atoms of 1 to 20 includes, for example, a divalent linear aliphatic hydrocarbon group having a number of carbon atoms of 1 to 20, a divalent branched aliphatic hydrocarbon group having a number of carbon atoms of 3 to 20, a divalent alicyclic hydrocarbon group having a number of carbon atoms of 3 to 20 and a divalent aromatic hydrocarbon group having a number of carbon atoms of 6 to 20.

A hydrogen atom in these groups may be substituted with an alkyl group having a number of carbon atoms of 1 to 20, a cycloalkyl group having a number of carbon atoms of 3 to 20, an alkoxy group having a number of carbon atoms of 1 to 20, a cycloalkoxy group having a number of carbon atoms of 3 to 20, a monovalent aromatic hydrocarbon group having a number of carbon atoms of 6 to 20 or a halogen atom.

Of them, preferable as the divalent organic group having a number of carbon atoms of 1 to 20 are a divalent linear aliphatic hydrocarbon group having a number of carbon atoms of 1 to 6, a divalent branched aliphatic hydrocarbon group having a number of carbon atoms of 3 to 6, a divalent alicyclic hydrocarbon group having a number of carbon atoms of 3 to 6 and a divalent aromatic hydrocarbon group having a number of carbon atoms of 6 to 20.

A hydrogen atom in these groups may be substituted with an alkyl group having a number of carbon atoms of 1 to 20, a cycloalkyl group having a number of carbon atoms of 3 to 20, an alkoxy group having a number of carbon atoms of 1 to 20, a cycloalkoxy group having a number of carbon atoms of 3 to 20, a monovalent aromatic hydrocarbon group having a number of carbon atoms of 6 to 20 or a halogen atom.

Specific examples of the divalent aliphatic hydrocarbon group and the divalent alicyclic hydrocarbon group include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a n-hexylene group, a 1-methyl-n-pentylene group, a cyclohexylene group, a 1-methyl-cyclopentylene group, a 2-methyl-cyclopentylene group, a 3-methyl-cyclopentylene group and the like.

Specific examples of the divalent aromatic hydrocarbon group having a number of carbon atoms of 6 to 20 include a phenylene group, a naphthylene group, an anthrylene group, a dimethylphenylene group, a trimethylphenylene group, an ethylenephenylene group, a diethylenephenylene group, a triethylenephenylene group, a propylenephenylene group, a butylenephenylene group, a methylnaphthylene group, a dimethyl naphthylene group, a trimethylnaphthylene group, a vinylnaphthylene group, an ethenylnaphthylene group, a methylanthrylene group, an ethylanthrylene group and the like.

<Thin-Film Transistor>

The thin-film transistor of the present invention has a gate electrode, a source electrode, a drain electrode, a semiconductor layer and a gate insulation layer.

The thin-film transistor may be a thin-film transistor having a gate electrode, a source electrode, a drain electrode, an inorganic semiconductor layer and a gate insulation layer, or may be an organic thin-film transistor having a gate electrode, a source electrode, a drain electrode, an organic semiconductor layer and a gate insulation layer (In the present specification, described as thin-film transistor in some cases).

The embodiment of the present invention is preferably an organic thin-film transistor from the standpoint of easy manufacturing, good bendability, manufacturability by application, and the like.

<Gate Electrode, Source Electrode and Drain Electrode>

The material constituting a gate electrode, the material constituting a source electrode and the material constituting a drain electrode include chromium, gold, silver, aluminum and the like.

<Semiconductor Layer>

The material for forming a semiconductor layer provided in the thin-film transistor of the present invention is not particularly restricted, and various inorganic semiconductors and organic semiconductors used as a semiconductor layer in conventionally known transistors can be utilized.

<Inorganic Semiconductor Layer>

The inorganic semiconductor material used for the inorganic semiconductor layer includes, for example, oxide semiconductors such as InGaZnO, ITO, ZnO, NiO, $SnO_2$, $TiO_2$, $VO_2$, $In_2O_3$, $SrTiO_3$ and the like, and nitride semiconductors, Si and Ge, and the like.

<Organic Semiconductor Layer>

In the embodiment of the present invention, the organic semiconductor layer provided in the organic thin-film transistor is a layer containing an organic semiconductor compound, and the organic semiconductor compound is usually a solvent-soluble organic semiconductor compound.

The organic semiconductor compound includes low molecule semiconductor compounds and polymer semiconductor compounds.

The low molecule semiconductor compound condensed polycyclic aromatic compounds, metallophthalocyanines, tetrathiapentalene and derivatives thereof, naphthalenetetracarboxylic diimide, condensed ring tetracarboxylic diimide, graphene, fullerene, carbon nanotubes and dyes.

The condensed polycyclic aromatic compound includes, for example, acenes such as naphthacene, pentacene (2,3,6,7-dibenzoanthracene), hexacene, heptacene, dibenzopentacene, tetrabenzopentacene and the like, and anthradithiophene, pyrene, benzopyrene, dibenzopyrene, chrysene, perylene, coronene, terylene, ovalene, quoterylene, circumanthracene, polyanthracene and triphenylene.

Some carbon atoms in the above-described condensed polycyclic aromatic compound may be substituted with a nitrogen atom, a sulfur atom, an oxygen atom and the like. At least one hydrogen atom bonded a carbon atom in the above-described condensed polycyclic aromatic compound may be substituted with a functional group such as a carbonyl group and the like. The condensed polycyclic aromatic compound in which at least one hydrogen atom bonded to a carbon atom is substituted with another atom or a functional group includes dioxaanthanthrene type compounds, triphenodioxazine, triphenodithiazine, hexacene-6,15-quinone, quinacridone and the like. The dioxaanthanthrene type compound includes peri-xanthenoxanthene and derivatives thereof.

The metallophthalocyanine includes copper phthalocyanine.

The naphthalenetetracarboxylic diimide includes naphthalene-1,4,5,8-tetracarboxylic diimide, N,N'-bis(4-trifluoromethylbenzyl)naphthalene-1,4,5,8-tetracarboxylic diimide, N,N'-bis(1H,1H-perfluorooctylnaphthalene-1,4,5,8-tetracarboxylic diimide), N,N'-bis(1H,1H-perfluorobutyl)naphthalene-1,4,5,8-tetracarboxylic diimide, N,N'-dioctylnaphthalene-1,4,5,8-tetracarboxylic diimide derivatives, naphthalene-2,3,6,7-tetracarboxylic diimide and the like.

The condensed ring tetracarboxylic diimide includes anthracene-2,3,6,7-tetracarboxylic diimide and the like.

The fullerene includes fullerenes such as C60, C70, C76, C78, C84 and the like, and derivatives thereof.

The carbon nanotube includes SWNT (Single-wall nanotube) and the like.

The dye includes merocyanine dyes, hemicyanine dyes and derivatives thereof, and the like.

The polymer semiconductor compound includes, for example, polypyrrole and substituted products thereof, polydiketopyrrole and substituted products thereof, polythiophene and derivatives thereof, polyisothianaphthene, polythienylenevinylene, poly(p-phenylenevinylene), polyaniline and derivatives thereof, polyacetylene, polydiacetylene, polyazulene, polypyrene, polycarbazole, polyselenophene, polyfuran, poly(p-phenylene), polyindole, polypyridazine, polytellurophene, polynaphthalene, polyvinylcarbazole, polyphenylene sulfide, polyvinylene sulfide, polymers of condensed polycyclic aromatic compounds and the like.

The polythiophene derivative is not particularly restricted, and examples thereof include poly-3-hexylthiophene (P3HT) obtained by introducing a hexyl group in polythiophene, and polyethylenedioxythiophene, poly(3,4-ethylenedioxythiophene)/polystyrenesulfonic acid (PEDOT/PSS) and the like, and these may be oligomers (for example, oligothiophene).

The polymer of the condensed polycyclic aromatic compound is not particularly restricted, and examples thereof include a polymer compound having diketopyrrolopyrrole site, a polymer compound having an isoindigo site, a polymer compound having a naphthalenediimide site, a polymer compound having a benzothiadiazole site, a polymer compound having a transannular bithiophene site, a polymer compound having a structural unit represented by the formula (5), and the like.

It is more preferable that the organic semiconductor layer contains a compound having a structure represented by the formula (5), from the viewpoint of higher mobility.

[Chemical Formula 14]

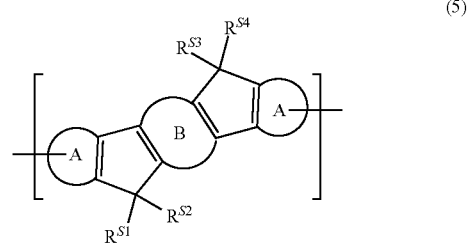

(5)

(in the formula (5), $R^{S1}$, $R^{S2}$, $R^{S3}$ and $R^{S4}$ each independently represent an alkyl group having a number of carbon atoms of 1 to 20 optionally having a substituent, an alkoxy group having a number of carbon atoms of 1 to 20 optionally having a substituent, an alkylthio group having a number of carbon atoms of 1 to 20 optionally having a substituent, an alkylcarbonyl group having a number of carbon atoms of 2 to 20 optionally having a substituent, an alkoxycarbonyl group having a number of carbon atoms of 2 to 20 optionally having a substituent, a dialkylamino group having a number of carbon atoms of 2 to 20 optionally having a substituent, a monovalent aromatic hydrocarbon group having a number of carbon atoms of 7 to 20 having an alkyl group as a substituent, a monovalent aromatic hydrocarbon group having a number of carbon atoms of 7 to 20 having an alkoxy group as a substituent, a monovalent heterocyclic group having a number of carbon atoms of 3 to 20 having an alkyl group as a substituent, a monovalent heterocyclic group having a number of carbon atoms of 3 to 20 having an alkoxy group as a substituent, an alkynyl group having a number of carbon atoms of 2 to 22 or an alkenyl group having a number of carbon atoms of 2 to 22.

The ring A represents a thiophene ring, a benzothiophene ring or a thienothiophene ring, and two rings A may be the same or different.

The ring B represents an aromatic ring, an aromatic heterocyclic ring, or a condensed ring obtained by condensing 2 to 4 rings selected from the group consisting of aromatic rings and aromatic heterocyclic rings, and the foregoing rings optionally have a substituent.)

(Alkyl Group Having a Number of Carbon Atoms of 1 to 20 Optionally Having a Substituent)

In the formula (5), the alkyl group having a number of carbon atoms of 1 to 20 optionally having a substituent represented by $R^{S1}$, $R^{S2}$, $R^{S3}$ and $R^{S4}$ includes a linear alkyl group, a branched alkyl group and a cycloalkyl group. The number of carbon atoms of the alkyl group is preferably 6 to 20, more preferably 10 to 20, from the standpoint of more excellent solvent-solubility of a polymer compound having a structural unit represented by the formula (5).

The linear alkyl group includes a methyl group, an ethyl group, a n-propyl group, a n-butyl group, a n-hexyl group, a n-octyl group, a n-dodecyl group, a n-pentadecyl group, a n-hexadecyl group, a n-heptadecyl group and the like. The branched alkyl group includes an isopropyl group, an isobutyl group, a sec-butyl group, a 2-ethylhexyl group, a 2-butyloctyl group, a 2-octyldodecyl and the like. The cycloalkyl group includes a cyclopentyl group, a cyclohexyl group and the like. The foregoing alkyl groups optionally have a substituent.

(Alkoxy Group Having a Number of Carbon Atoms of 1 to 20 Optionally Having a Substituent)

In the formula (5), the alkoxy group having a number of carbon atoms of 1 to 20 optionally having a substituent represented by $R^{S1}$, $R^{S2}$, $R^{S3}$ and $R^{S4}$ includes groups obtained by bonding an oxygen atom to the above-described alkyl group having a number of carbon atoms of 1 to 20 optionally having a substituent. The alkoxy group having a number of carbon atoms of 1 to 20 includes a linear alkoxy group, a branched alkoxy group and a cycloalkoxy group.

The linear alkoxy group includes a methoxy group, an ethoxy group, a n-propoxy group, a n-butyloxy group, a n-pentyloxy group, a n-hexyloxy group, a n-heptyloxy group, a n-octyloxy group, a n-dodecyloxy group, a n-hexadecyloxy group and the like. The branched alkoxy group includes an isopropoxy group, an isobutyloxy group, a sec-butyloxy group, a tert-butyloxy group, a 2-ethylhexyloxy group, a 2-butyloctyloxy group, a 2-hexyldecyloxy group, a 2-octyldodecyloxy group and the like. The cycloalkoxy group includes a cyclopentyloxy group, a cyclohexyloxy group and the like. The foregoing alkoxy groups optionally have a substituent.

(Alkylthio Group Having a Number of Carbon Atoms of 1 to 20 Optionally Having a Substituent)

In the formula (5), the alkylthio group having a number of carbon atoms of 1 to 20 optionally having a substituent represented by $R^{S1}$, $R^{S2}$, $R^{S3}$ and $R^{S4}$ includes groups obtained by bonding a sulfur atom to the above-described alkyl group having a number of carbon atoms of 1 to 20 optionally having a substituent. The alkylthio group having a number of carbon atoms of 1 to 20 includes a linear alkylthio group, a branched alkylthio group and a cycloalkylthio group.

The linear alkylthio group includes a methylthio group, an ethylthio group, a n-propylthio group, a n-butylthio group, a n-pentylthio group, a n-hexylthio group, a n-heptylthio group, a n-octylthio group, a n-dodecylthio group, a n-hexadecylthio group and the like. The branched alkylthio group includes an isopropylthio group, an isobutylthio group, a sec-butylthio group, a tert-butylthio group, a 2-ethylhexylthio group, a 2-butyloctylthio group, a 2-hexyldecylthio group, a 2-octyldodecylthio group and the like. The cycloalkylthio group includes a cyclopentylthio group, a cyclohexylthio group and the like. The foregoing alkylthio groups optionally have a substituent.

(Alkylcarbonyl Group Having a Number of Carbon Atoms of 2 to 20 Optionally Having a Substituent)

In the formula (5), the alkylcarbonyl group having a number of carbon atoms of 2 to 20 optionally having a substituent represented by $R^{S1}$, $R^{S2}$, $R^{S3}$ and $R^{S4}$ includes groups obtained by bonding a carbonyl group to the above-described alkyl group having a number of carbon atoms of 1 to 20 optionally having a substituent. The alkylcarbonyl group having a number of carbon atoms of 2 to 20 includes a linear acyl group, a branched acyl group and a cycloalkylcarbonyl group.

The linear acyl group includes an acetyl group, a n-propanoyl group, a n-butanoyl group, a n-pentanoyl group, a n-hexanoyl group, a n-heptanoyl group, a n-octanoyl group, a n-dodecanoyl group, a n-hexadecanoyl group and the like. The branched acyl group includes an isobutanoyl group, a sec-butanoyl group, a tert-butoxycarbonyl group, a 2-ethylhexanoyl group, a 2-butyloctanoyl group, a 2-hexyldecanoyl group, a 2-octyldodecanoyl group and the like. The cycloalkylcarbonyl group includes a cyclopentylcarbonyl group, a cyclohexylcarbonyl group and the like. The foregoing alkylcarbonyl groups optionally have a substituent.

(Alkoxycarbonyl Group Having a Number of Carbon Atoms of 2 to 20 Optionally Having a Substituent)

In the formula (5), the alkoxycarbonyl group having a number of carbon atoms of 2 to 20 optionally having a substituent represented by $R^{S1}$, $R^{S2}$, $R^{S3}$ and $R^{S4}$ includes groups obtained by bonding a carbonyl group to the above-described alkoxy group having a number of carbon atoms of 1 to 20 optionally having a substituent. The alkoxycarbonyl group having a number of carbon atoms of 2 to 20 includes a linear alkoxycarbonyl group, a branched alkoxycarbonyl group and a cycloalkoxycarbonyl group.

The linear alkoxycarbonyl group includes a methoxycarbonyl group, an ethoxycarbonyl group, a n-propylcarbonyl group, a n-butoxycarbonyl group, a n-pentyloxycarbonyl group, a n-hexyloxycarbonyl group, a n-heptyloxycarbonyl group, a n-octyloxycarbonyl group, a n-dodecyloxycarbonyl group, a n-hexadecyloxycarbonyl group and the like. The branched alkoxycarbonyl group includes an isopropoxycarbonyl group, an isobutyloxycarbonyl group, a sec-butyloxycarbonyl group, a tert-butyloxycarbonyl group, a 2-ethylhexyloxycarbonyl group, a 2-butyloctyloxycarbonyl group, a 2-hexyldecyloxycarbonyl group, a 2-octyldodecyloxycarbonyl group and the like. The cycloalkoxycarbonyl group includes a cyclopentyloxycarbonyl group, a cyclohexyloxycarbonyl group and the like. The foregoing alkoxycarbonyl groups optionally have a substituent.

(Dialkylamino Group Having a Number of Carbon Atoms of 2 to 20 Optionally Having a Substituent)

In the formula (5), the dialkylamino group having a number of carbon atoms of 2 to 20 optionally having a substituent represented by $R^{S1}$, $R^{S2}$, $R^{S3}$ and $R^{S4}$ includes groups obtained by bonding a nitrogen atom to the above-described two alkyl groups having a number of carbon atoms of 1 to 20 optionally having a substituent.

Specific examples of the dialkylamino group having a number of carbon atoms of 2 to 20 include dialkylamino groups substituted with a linear alkyl group such as a dimethylamino group, a diethylamino group, a dibutylamino group, a di-hexylamino group, a dioctylamino group, a didodecylamino group and the like, dialkylamino groups substituted with a branched alkyl group such as a bis(2-ethylhexyl)amino group, a bis(2-hexyldecyl)amino group and the like, and amino groups substituted with a cycloalkyl group such as a dicyclohexylamino group and the like. The foregoing dialkylamino groups optionally have a substituent.

(Monovalent Aromatic Hydrocarbon Group Having a Number of Carbon Atoms of 6 to 20 Having an Alkyl Group as a Substituent)

In the formula (5), the monovalent aromatic hydrocarbon group having a number of carbon atoms of 6 to 20 having an alkyl group as a substituent represented by $R^{S1}$, $R^{S2}$, $R^{S3}$ and $R^{S4}$ includes aromatic hydrocarbon groups having a linear alkyl group as a substituent, aromatic hydrocarbon groups having a branched alkyl group as a substituent, and aromatic hydrocarbon groups having a cycloalkyl group as a substituent. The number of carbon atoms of the alkyl group of the aromatic hydrocarbon group is 1 to 20. The alkyl group having a number of carbon atoms of 1 to 20 includes the above-described alkyl group having a number of carbon atoms of 1 to 20 optionally having a substituent.

The monovalent aromatic hydrocarbon group is an atomic group remaining after removing from an aromatic hydrocarbon one hydrogen atom bonding directly to a carbon atom constituting the aromatic ring. The aromatic hydrocarbon group includes a group having a benzene ring, a group having a condensed ring obtained by condensing two or more aromatic ring, and a group obtained by directly bonding two or more groups selected from an independent benzene ring and a condensed ring obtained by condensing two or more aromatic rings. It is preferable that the number of carbon atoms of the aromatic hydrocarbon group is 6 to 14.

Specific examples of the monovalent aromatic hydrocarbon group having a number of carbon atoms of 6 to 20 include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group and the like, and a phenyl group is preferable.

The total number of carbon atoms of the aromatic hydrocarbon group including the substituent is 7 to 40. The aromatic hydrocarbon group having a number of carbon atoms of 6 to 20 may be substituted with a plurality of alkyl groups having a number of carbon atoms of 1 to 20. The plurality of alkyl groups having a number of carbon atoms of 1 to 20 may be the same or different.

(Monovalent Aromatic Hydrocarbon Group Having a Number of Carbon Atoms of 6 to 20 Having an Alkoxy Group as a Substituent)

In the formula (5), the monovalent aromatic hydrocarbon group having a number of carbon atoms of 6 to 20 having an alkoxy group as a substituent represented by $R^{S1}$, $R^{S2}$, $R^{S3}$ and $R^{S4}$ includes aromatic hydrocarbon groups having a linear alkoxy group as a substituent, aromatic hydrocarbon groups having a branched alkoxy group as a substituent, and aromatic hydrocarbon groups having a cycloalkoxy group as a substituent. The number of carbon atoms of the alkyl group of the aromatic hydrocarbon group is 1 to 20. The alkoxy group having a number of carbon atoms of 1 to 20 includes the above-described alkoxy group having a number of carbon atoms of 1 to 20 optionally having a substituent.

The total number of carbon atoms of the monovalent aromatic hydrocarbon group having a number of carbon atoms of 6 to 20 having an alkoxy group as a substituent including the substituent is 7 to 40. The aromatic hydrocarbon group having a number of carbon atoms of 6 to 20 may be substituted with a plurality of alkoxy groups having a number of carbon atoms of 1 to 20. The plurality of alkoxy groups having a number of carbon atoms of 1 to 20 may be the same or different.

The description and examples for the monovalent aromatic hydrocarbon group are the same as described above.

(Monovalent Heterocyclic Group Having a Number of Carbon Atoms of 2 to 20 Having an Alkyl Group as a Substituent)

In the formula (5), the monovalent heterocyclic group having a number of carbon atoms of 2 to 20 having an alkyl group as a substituent represented by $R^{S1}$, $R^{S2}$, $R^{S3}$ and $R^{S4}$ includes heterocyclic groups having a linear alkyl group as a substituent, heterocyclic groups having a branched alkyl group as a substituent and heterocyclic groups having a cycloalkyl group as a substituent. The number of carbon atoms of the alkyl group of the monovalent heterocyclic group is 1 to 20. The alkyl group having a number of carbon atoms of 1 to 20 includes the above-described alkyl group having a number of carbon atoms of 1 to 20 optionally having a substituent.

The monovalent heterocyclic group is an atomic group remaining after removing from a heterocyclic compound one hydrogen atom bonding directly to a carbon atom constituting the heterocyclic ring. The monovalent heterocyclic group includes a group having a condensed ring obtained by condensing a heterocyclic ring and at least one ring selected from the group consisting of a heterocyclic ring and an aromatic ring, and a group obtained by directly bonding an independent heterocyclic ring and an aromatic ring, a heterocyclic ring, or a condensed ring obtained by condensing two or more selected from the group consisting of an aromatic ring and a heterocyclic ring. The number of carbon atoms of the monovalent heterocyclic group is preferably 3 to 14. The monovalent heterocyclic group is preferably a monovalent aromatic heterocyclic ring group.

The monovalent heterocyclic group having a number of carbon atoms of 2 to 20 includes a 2-furyl group, a 3-furyl group, a 2-thienyl group, a 3-thienyl group, a 2-pyrrolyl group, a 3-pyrrolyl group, a 2-oxazolyl group, a 2-thiazolyl group, a 2-imidazolyl group, a 2-pyridyl group, a 3-pyridyl group, a 4-pyridyl group, a 2-benzofuryl group, a 2-benzothienyl group, a 2-thienothienyl group and the like, and a 2-thienyl group is preferable.

The total number of carbon atoms of the monovalent heterocyclic group having a number of carbon atoms of 2 to 20 having an alkyl group as a substituent including the substituent is 3 to 40. The monovalent heterocyclic group having a number of carbon atoms of 2 to 20 may be substituted with a plurality of alkyl groups having a number of carbon atoms of 1 to 20. The plurality of alkyl groups having a number of carbon atoms of 1 to 20 may be the same or different.

(Monovalent Heterocyclic Group Having a Number of Carbon Atoms of 2 to 20 Having an Alkoxy Group as a Substituent)

In the formula (5), the monovalent heterocyclic group having a number of carbon atoms of 2 to 20 having an alkoxy group as a substituent $R^{S1}$, $R^{S2}$, $R^{S3}$ and $R^{S4}$ includes heterocyclic groups having a linear alkoxy group as a substituent, heterocyclic groups having a branched alkoxy group as a substituent and heterocyclic groups having a cycloalkoxy group as a substituent. The number of carbon atoms of the alkoxy group of the monovalent heterocyclic group is 1 to 20. The alkoxy group having a number of carbon atoms of 1 to 20 includes the above-described alkoxy group having a number of carbon atoms of 1 to 20 optionally having a substituent.

The description and examples of the monovalent heterocyclic group are the same as described above.

(Alkynyl Group Having a Number of Carbon Atoms of 2 to 22)

In the formula (5), the alkynyl group having a number of carbon atoms of 2 to 22 represented by $R^{S1}$, $R^{S2}$, $R^{S3}$ and $R^{S4}$ includes a linear alkynyl group, a branched alkynyl group and a cycloalkynyl group. The number of carbon atoms of the alkynyl group is preferably 6 to 20, more preferably 10 to 20, from the standpoint of more excellent solvent-solubility of a polymer compound having a structural unit represented by the formula (5).

Specific examples of the alkynyl group having a number of carbon atoms of 2 to 22 include a propynyl group, a n-butynyl group, a n-pentynyl group, a n-hexynyl group, a n-octynyl group, a n-dodecynyl group, a n-hexadecynyl group, a sec-butynyl group, an isobutynyl group, a cyclohexylethynyl group and the like.

(Alkenyl Group Having a Number of Carbon Atoms of 2 to 22)

In the formula (5), the alkenyl group having a number of carbon atoms of 2 to 22 represented by $R^{S1}$, $R^{S2}$, $R^{S3}$ and $R^{S4}$ includes a linear alkenyl group, a branched alkenyl group and a cycloalkenyl group. The number of carbon atoms of the alkenyl group is preferably 6 to 20, more preferably 10 to 20, from the standpoint of more excellent solvent-solubility of a polymer compound having a structural unit represented by the formula (5).

Specific examples of the alkenyl group having a number of carbon atoms of 2 to 22 include a propenyl group, a n-butenyl group, a n-pentenyl group, a n-hexenyl group, a n-octenyl group, a n-dodecenyl group, a n-hexadecenyl group, a sec-butenyl group, an isobutenyl group, a cyclohexenyl group and the like.

(Substituent)

The substituent which the alkyl group having a number of carbon atoms of 1 to 20, the alkoxy group having a number of carbon atoms of 1 to 20, the alkylthio group having a number of carbon atoms of 1 to 20, the alkylcarbonyl group having a number of carbon atoms of 2 to 20, the alkoxycarbonyl group having a number of carbon atoms of 2 to 20 and the dialkylamino group having a number of carbon atoms of 2 to 20 described above optionally have is a fluorine atom, an alkyl group having a number of carbon atoms of 1 to 20, an alkoxy group having a number of carbon atoms of 1 to 20, an alkylthio group having a number of carbon atoms of 1 to 20, a dialkylamino group having a number of carbon atoms of 2 to 20, a monovalent aromatic hydrocarbon group having a number of carbon atoms of 6 to 20, a monovalent heterocyclic group having a number of carbon atoms of 2 to 20, an alkenyl group having a number of carbon atoms of 2 to 22, an alkynyl group having a number of carbon atoms of 2 to 22 or a substituted silyl group having a number of carbon atoms of 3 to 20.

The alkyl group having a number of carbon atoms of 1 to 20, an alkoxy group having a number of carbon atoms of 1 to 20, the alkylthio group having a number of carbon atoms of 1 to 20 and the dialkylamino group having a number of carbon atoms of 2 to 20 are the same as the alkyl group having a number of carbon atoms of 1 to 20 optionally having a substituent, the alkoxy group having a number of carbon atoms of 1 to 20 optionally having a substituent, the alkylthio group having a number of carbon atoms of 1 to 20 optionally having a substituent and the dialkylamino group having a number of carbon atoms of 2 to 20 optionally having a substituent described previously, respectively, except that no substituent is carried.

The monovalent aromatic hydrocarbon group having a number of carbon atoms of 6 to 20, the monovalent heterocyclic group having a number of carbon atoms of 2 to 20, the alkenyl group having a number of carbon atoms of 2 to 22 and the alkynyl group having a number of carbon atoms of 2 to 22 are as described previously.

The substituted silyl group having a number of carbon atoms of 3 to 20 includes silyl groups having at least one group selected from the group consisting of an alkyl group having a number of carbon atoms of 1 to 20 and a monovalent aromatic hydrocarbon group having a number of carbon atoms of 6 to 20.

Specific examples of the substituted silyl group include a trimethylsilyl group, a triethylsilyl group, a triisopropylsilyl group, a tert-butyldimethylsilyl group, a dimethylphenylsilyl group, a diphenylmethylsilyl group and the like.

The alkyl group having a number of carbon atoms of 1 to 20 is the same as the alkyl group optionally having a substituent described previously, except that no substituent is carried, and the monovalent aromatic hydrocarbon group having a number of carbon atoms of 6 to 20 is as described previously.

In the formula (5), $R^{S1}$, $R^{S2}$, $R^{S3}$ and $R^{S4}$ are each preferably an alkyl group having a number of carbon atoms of 6 to 20, more preferably a linear alkyl group having a number of carbon atoms of 6 to 20, from the standpoint of expression of higher carrier mobility.

In the formula (5), ring B may be an aromatic ring or may be an aromatic heterocyclic ring, and may also be a condensed ring obtained by condensing 2 to 4 rings selected from the group consisting of an aromatic ring and an aromatic heterocyclic ring.

In the formula (5), the aromatic ring represented by ring B includes a benzene ring.

The condensed ring obtained by condensing 2 to 4 rings selected from the group consisting of an aromatic ring and an aromatic heterocyclic ring includes a naphthalene ring, an anthracene ring, a naphthacene ring, a thienothiophene ring, a benzothiophene ring, a benzodithiophene ring, a naphthodithiophene ring and a benzothienobenzothiophene ring.

The foregoing rings optionally have a substituent.

The substituent which the foregoing rings optionally have includes a fluorine atom, an alkyl group having a number of carbon atoms of 1 to 20, an alkoxy group having a number of carbon atoms of 1 to 20, an alkylthio group having a number of carbon atoms of 1 to 20, a dialkylamino group having a number of carbon atoms of 2 to 20, a monovalent aromatic hydrocarbon group having a number of carbon atoms of 6 to 20, a monovalent heterocyclic group having a number of carbon atoms of 2 to 20, an alkenyl group having a number of carbon atoms of 2 to 22, and an alkynyl group having a number of carbon atoms of 2 to 22.

The alkyl group having a number of carbon atoms of 1 to 20, the alkoxy group having a number of carbon atoms of 1 to 20, the alkylthio group having a number of carbon atoms of 1 to 20 and the dialkylamino group having a number of carbon atoms of 2 to 20 are the same as the alkyl group having a number of carbon atoms of 1 to 20 optionally having a substituent, the alkoxy group having a number of carbon atoms of 1 to 20 optionally having a substituent, the alkylthio group having a number of carbon atoms of 1 to 20 optionally having a substituent and the dialkylamino group having a number of carbon atoms of 2 to 20 optionally having a substituent described previously, respectively, as the group represented by $R^{S1}$, $R^{S2}$, $R^{S3}$ and $R^{S4}$, except that no substituent is carried.

The monovalent aromatic hydrocarbon group having a number of carbon atoms of 6 to 20, the monovalent heterocyclic group having a number of carbon atoms of 2 to 20, the alkenyl group having a number of carbon atoms of 2 to 22 and the alkynyl group having a number of carbon atoms of 2 to 22 are as described above.

The organic semiconductor layer preferably contains a polymer semiconductor compound from the standpoint of uniform properties of the resulting organic thin-film transistor, and more preferably contains a polymer semiconductor compound having a structure represented by the formula (5) from the viewpoint of higher mobility.

The structures represented by the formula (5) may be contained only singly or in combination of two or more in the compound. The polymer semiconductor compound having a structure represented by the formula (5) is further preferably a conjugated polymer semiconductor compound.

Specific examples of the compound having a structure represented by the formula (5) are exemplified below.

[Chemical Formula 15]
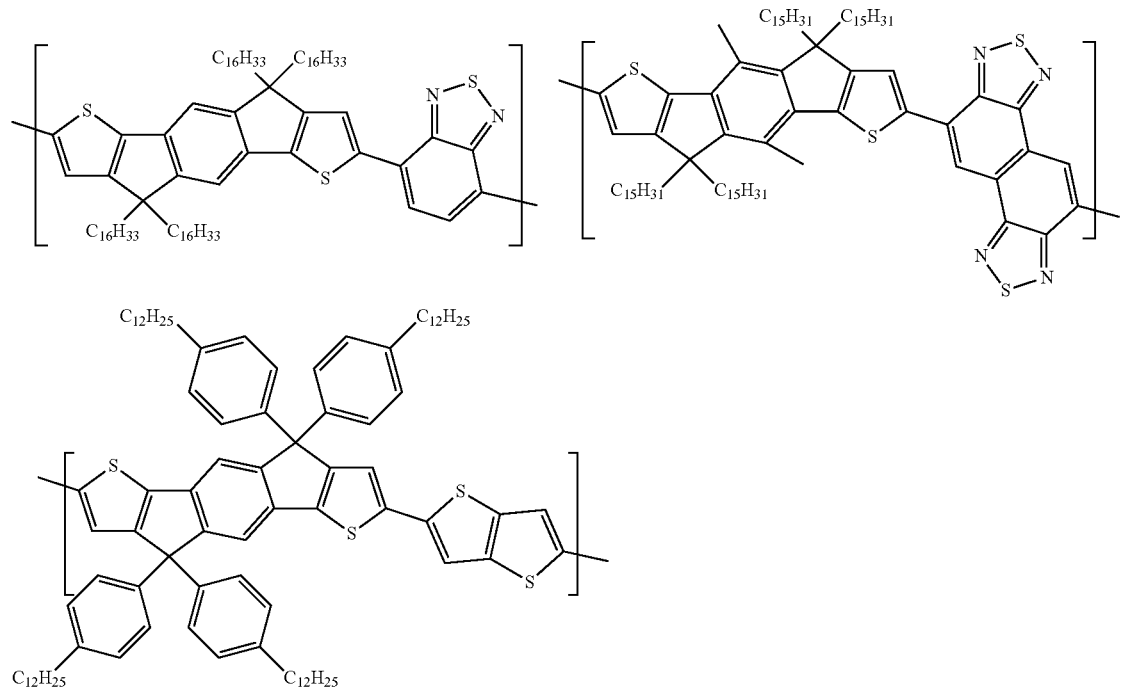
[Chemical Formula 16]
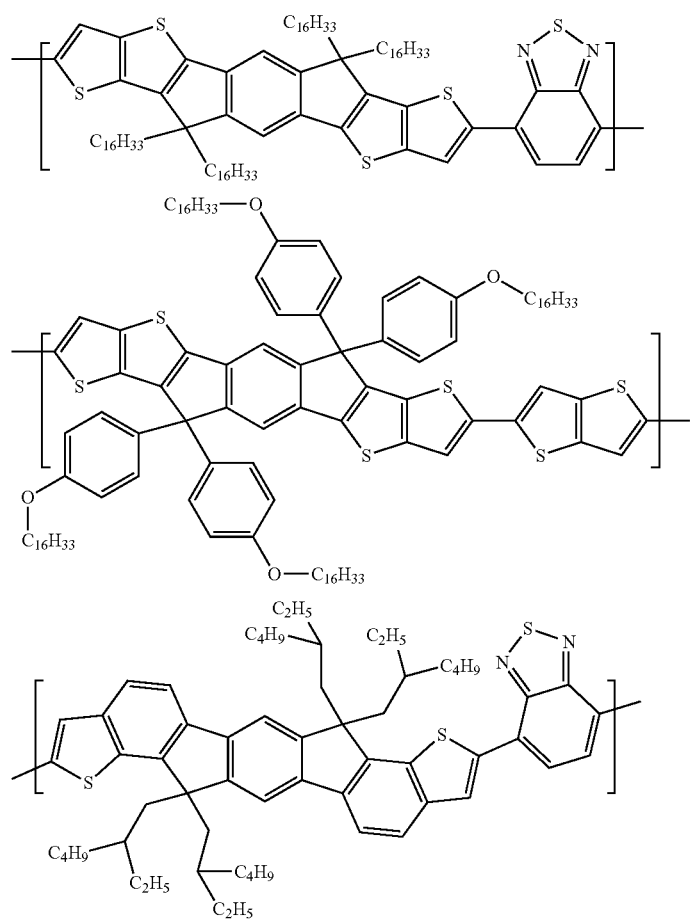

[Chemical Formula 17]
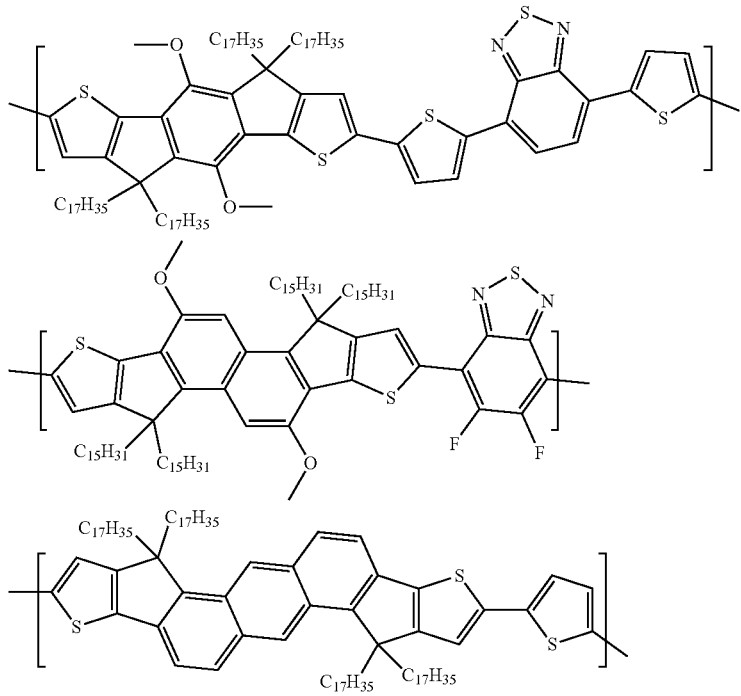
[Chemical Formula 18]
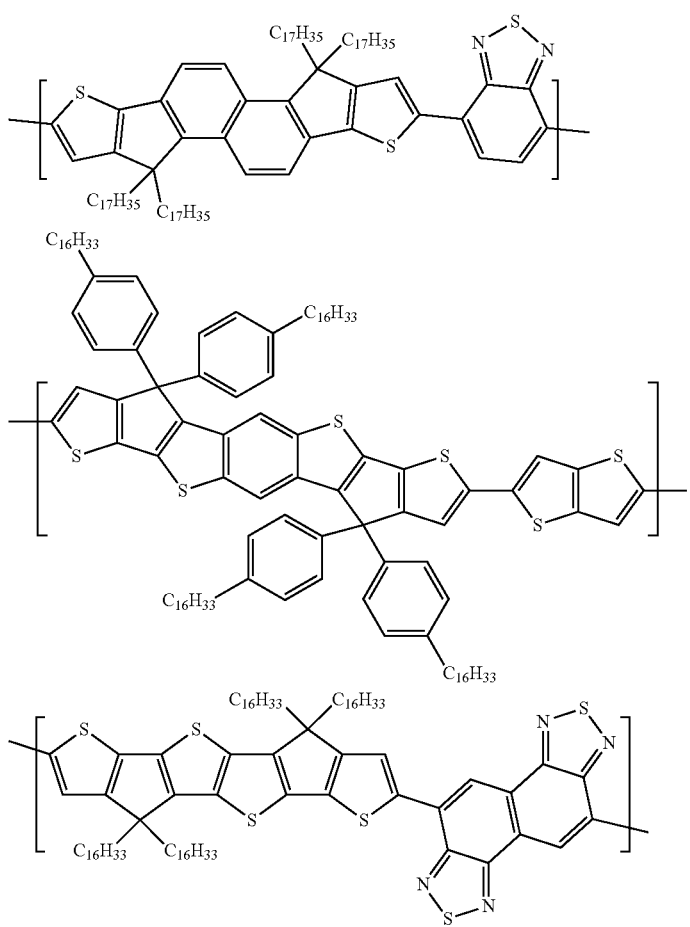

[Chemical Formula 19]

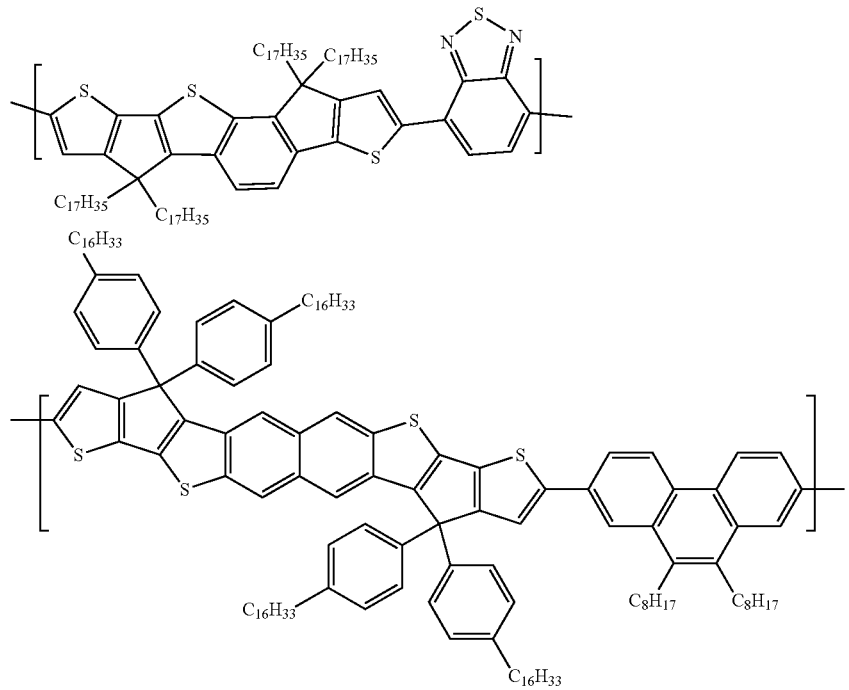

[Chemical Formula 20]

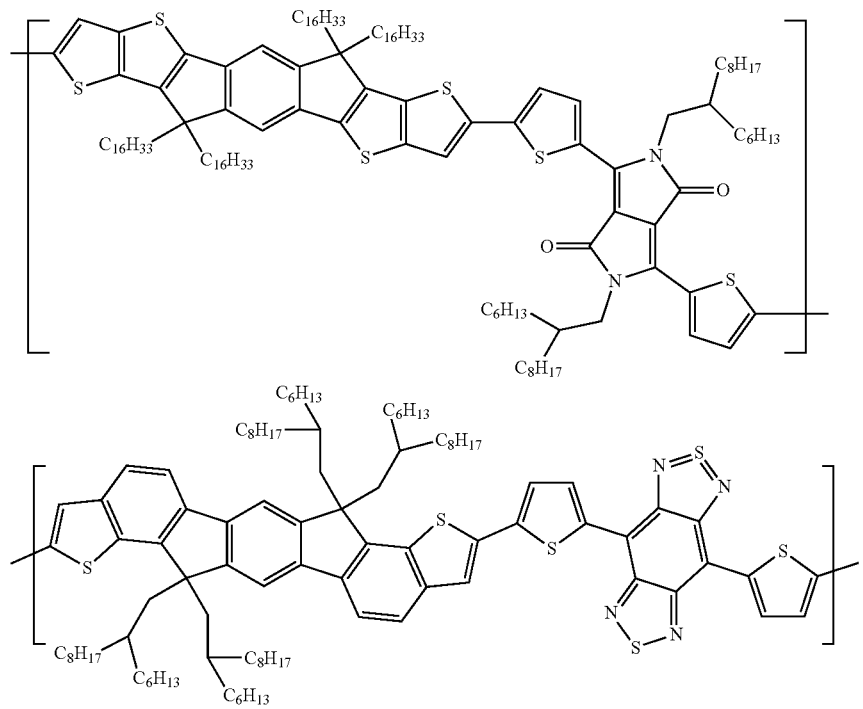

The polymer semiconductor compound contained in the organic semiconductor layer can be produced, for example, by methods described in WO2015/025981 and WO2010/020329.

<Gate Insulation Layer>

The gate insulation layer in the organic thin-film transistor of the present invention is a layer composed of a polymer compound or a hardened product of the polymer compound, or composed a composition containing the polymer compound or a hardened product of the composition, wherein the above-described polymer compound is a polymer compound which contains a repeating unit having a cross-linkable group and a repeating unit represented by the following formula (1) and in which the content of the repeating unit represented by the following formula (1) is 71% by mol or more with the total content of all repeating units contained in the above-described polymer compound being 100% by mol (In the present specification, described as polymer compound A in some cases), and in the above-described composition, the total mass of the above-described polymer compound is 80% by mass or more with respect to the whole composition and the total mass of compounds having two or more amino groups is 4.5% by mass or less with respect to the above-described polymer compound.

[Chemical Formula 21]

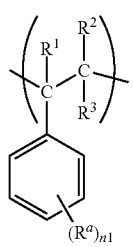

(1)

(in the formula (1), $R^1$, $R^2$ and $R^3$ each independently represent a hydrogen atom or a methyl group.

$R^a$ represents a monovalent hydrocarbon group having a number of carbon atoms of 1 to 6, and a plurality of $R^a$ may be combined together to form a ring together with carbon atoms to which they are attached.

n1 represents an integer of 0 to 5.)

The content of the polymer compound A contained in the composition is preferably 80% by mass or more, more preferably 90% by mass or more, further preferably 95% by mass or more, particularly preferably 98% by mass or more with respect to the whole composition.

The composition may contain other components other than the polymer compound A containing a repeating unit having a crosslinkable group and a repeating unit represented by the formula (1).

The other components include, for example, compounds having two or more amino groups, compounds having two or more hydroxy groups, organic solvents, and polymer compounds other than the above-described polymer compound.

The total mass of compounds having two or more amino groups contained in the composition is preferably 2.0% by mass or less, more preferably 1.0% by mass or less, further preferably 0.5% by mass or less with respect to the polymer compound A.

The low molecule compound containing two or more amino groups includes o-phenylenediamine, m-phenylenediamine, p-phenylenediamine, ethylenediamine, diethylenetriamine, triethylenetetramine, p-xylenediamine and the like.

The composition may contain a compound containing two or more hydroxy groups.

The total mass of compounds having two or more hydroxyl groups contained in the composition is preferably 4.5% by mass or less, more preferably 2.0% by mass or less, further preferably 1.0% by mass or less, particularly preferably 0.5% by mass or less.

The low molecule compound having two or more hydroxyl groups includes catechol, resorcinol, hydroquinone, ethylene glycol, diethylene glycol, 1,4-benzenedimethanol, α,α-dihydroxy-1,4-diisopropylbenzene and the like.

The composition may contain an organic solvent. The organic solvent includes organic solvents used in the production method of a gate insulation layer described later.

The composition may contain additives and the like which are usually used in cross-linking a polymer compound.
(Polymer Compound A)

The polymer compound (polymer compound A) containing a repeating unit having a crosslinkable group and a repeating unit represented by the formula (1) in which the content of the repeating unit represented by the formula (1) is 71% by mol or more with the total content of all repeating units contained in the polymer compound being 100% by mol will be described.

The two or more polymer compounds A may be contained in the composition.

The polymer compound A may contain other repeating units other than the repeating unit having a crosslinkable group and the repeating unit represented by the formula (1).

The polymer compound A is preferably a non-halogen polymer compound.

It is preferable that the polymer compound A is soluble in a non-halogen solvent.

The polymer compound hardens by forming a cross-linking bond, and the polymer compound A is preferably a polymer compound which hardens at 250° C. or less, more preferably a polymer compound which hardens at 200° C. or less, further preferably a polymer compound which hardens at 1800° C. or less.

The weight-average molecular weight of the above-described polymer compound is preferably 3,000 to 1,000,000, more preferably 5,000 to 500,000, further preferably 9,000 to 300,000.
[Repeating Unit Represented by the Formula (1)]

In the above-described formula (1), $R^1$, $R^2$ and $R^3$ preferably each independently represent a hydrogen atom.

In the above-described formula (1), n1 is preferably 0 or 1, more preferably 0.

The monovalent hydrocarbon group having a number of carbon atoms of 1 to 6 represented by $R^a$ may be any of linear, branched and cyclic, and may be an aliphatic hydrocarbon group or an aromatic hydrocarbon group.

$R^a$ is preferably a monovalent aliphatic hydrocarbon group having a number of carbon atoms of 1 to 4, more preferably a linear or branched alkyl group having a number of carbon atoms of 1 to 4.

The hydrocarbon group having a number of carbon atoms of 1 to 6 represented by $R^a$ includes a methyl group, an ethyl group, a propyl group, an isopropyl group, a butyl group, a t-butyl group, a pentyl group, an isoamyl group, a 2-ethylbutyl group, a hexyl group, a phenyl group and the like.

The content of the above-described repeating unit represented by the formula (1) in the polymer compound A is preferably 71% by mol or more and 99% by mol or less, more preferably 75% by mol or more and 98% by mol or less, further preferably 80% by mol or more and 95% by mol or less, particularly preferably 85% by mol or more and 95% by mol or less with the total content of all repeating units contained in the polymer compound A being 100% by mol, from the standpoint of improvability of mobility of the organic thin-film transistor.

The content of the above-described repeating unit contained in the polymer compound A is determined from the use amount of raw material monomers corresponding to each repeating unit used in producing the polymer compound A.

[Repeating Unit Having a Crosslinkable Group]

The repeating unit having a crosslinkable group includes repeating units having at least one group selected from the group consisting of a hydroxy group, a carboxy group, an amino group, an isocyanato group, an isothiocyanato group, a blocked isocyanato group, a blocked isothiocyanato group, a vinyl group, an allyl group, a mercapto group, an epoxy group, an oxetanyl group, an alkoxysilyl group, an oxazoline group, an acryl group, a methacryl group and a carboxylic anhydride.

Of them, repeating units having at least one group selected from the group consisting of a hydroxy group, a carboxy group, an isocyanato group, a blocked isocyanato group, a blocked isothiocyanato group, an alkoxysilyl group, an acryl group, a methacryl group and an epoxy group are preferable, and repeating units having at least one group selected from the group consisting of a hydroxy group, a carboxy group, a blocked isocyanato group and a blocked isothiocyanato group are more preferable, from the standpoint of formation of a thermally cured film at low temperature in a short period of time.

The content of the repeating unit having a crosslinkable group in the polymer compound A is preferably 0.1% by mol or more and 29% by mol or less, more preferably 1% by mol or more and 20% by mol or less, further preferably 1% by mol or more and 15% by mol or less with the total content of all repeating units contained in the polymer compound A being 100% by mol, from the standpoint of enhancing the carrier mobility of the organic thin-film transistor.

The content of the above-described repeating unit contained in the polymer compound A is determined from the use amount of raw material monomers corresponding to each repeating unit used in producing the polymer compound A.

The repeating unit having a blocked isocyanato group and the repeating unit having a blocked isothiocyanato group include repeating units represented by the formula (2) or the formula (3).

The repeating unit having a hydroxy group and the repeating unit having a carboxy group include repeating units represented by the formula (4).

The polymer compound preferably contains at least one repeating unit selected from the group consisting of a repeating unit represented by the formula (2) and a repeating unit represented by the formula (3) and at least one repeating unit selected from the group consisting of repeating units represented by the formula (4), as the repeating unit having a crosslinkable group.

[Chemical Formula 22]

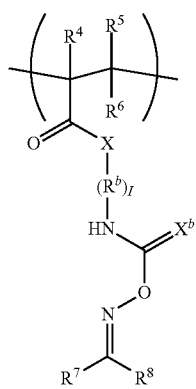

(2)

[Chemical Formula 23]

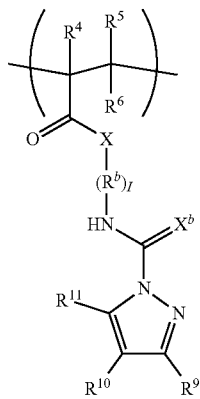

(3)

(in the formulae (2) and (3), $R^4$, $R^5$ and $R^6$ each independently represent a hydrogen atom or a methyl group.

$X^b$ represents an oxygen atom or a sulfur atom.

$R^7$ to $R^{11}$ each independently represent a hydrogen atom or a monovalent organic group having a number of carbon atoms of 1 to 20.

$R^b$ represents a divalent organic group having a number of carbon atoms of 1 to 20.

X represents an oxygen atom or a group represented by —$NR^n$—.

$R^n$ represents a hydrogen atom or a monovalent organic group having a number of carbon atoms of 1 to 20.

l represents an integer of 1 to 6.

When a plurality of $R^b$ are present, they may be mutually different.)

$R^5$ and $R^6$ are each independently preferably a hydrogen atom.

X is preferably an oxygen atom or a group represented by —NH—.

$X^b$ is preferably an oxygen atom.

$R^b$ is preferably a methylene group, an ethylene group, a n-propylene group or a n-butylene group.

In one embodiment of the present invention, $R^7$ and $R^8$ in the above-described formula (2) each independently represent preferably a group selected from the group consisting of a methyl group and an ethyl group. In other embodiments, it is preferable that in the above-described formula (3), $R^9$ and $R^{11}$ are each a methyl group and $R^{10}$ is a hydrogen atom.

The content of the repeating unit represented by the formula (2) or (3) in the polymer compound is preferably 0.1% by mol or more and 29% by mol or less, more preferably 1% by mol or more and 20% by mol or less, further preferably 1% by mol or more and 15% by mol or less, particularly preferably 1% by mol or more and 8% by mol or less with the total content of all repeating units contained in the polymer compound A being 100% by mol, from the standpoint of enhancing the carrier mobility of the organic thin-film transistor.

The content of the above-described repeating unit contained in the polymer compound A is determined from the use amount of raw material monomers corresponding to each repeating unit used in producing the polymer compound A.

[Chemical Formula 24]

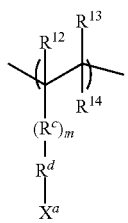

(4)

(in the formula (4), $R^{12}$, $R^{13}$ and $R^{14}$ each independently represent a hydrogen atom or a methyl group.

$R^C$ represents a divalent organic group having a number of carbon atoms of 1 to 20, a group represented by —O—, a group represented by —CO—, a group represented by —COO—, a group represented by —NHCO— or a group represented by —NHCOO—. Any of respective two connecting bonds of these groups may be situated at the side of a carbon atom to which $R^{12}$ is bonded.

$R^d$ represents a single bond or a divalent organic group having a number of carbon atoms of 1 to 20.

m represents an integer of 0 to 6.

$X^a$ represents a hydroxy group or a carboxy group.

When a plurality of $R^C$ are present, they may be mutually different.)

In the above-described formula (4), $R^{13}$, $R^{14}$ each independently represent preferably a hydrogen atom.

In the above-described formula (4), $R^d$ is preferably a single bond, a methylene group, an ethylene group, a n-propylene group, an isopropylene group, a n-butylene group or a phenylene group.

In the above-described formula (4), m is preferably an integer of 0 to 2.

In the above-described formula (4), $X^a$ is preferably a carboxy group.

In the above-described formula (4), $R^C$ is preferably a methylene group, an ethylene group, a n-propylene group, an isopropylene group, a n-butylene group or a phenylene group, a group represented by —COO—, a group represented by —NHCO— or a group represented by —NHCOO—.

The preferable embodiment of the above-described formula (4) includes an embodiment in which $R^{13}$ and $R^{14}$ are each a hydrogen atom, m is 1, $R^c$ is a group represented by —COO— and $R^d$ is a divalent aliphatic hydrocarbon group having a number of carbon atoms of 1 to 10, and an embodiment in which $R^{13}$ and $R^{14}$ are each a hydrogen atom, m is 0 and $R^d$ is a divalent aromatic hydrocarbon group having a number of carbon atoms of 6 to 20. It is further preferable that the divalent aromatic hydrocarbon group is a phenylene group.

The content of the repeating unit represented by the formula (4) in the polymer compound A is preferably 0.1% by mol or more and 29% by mol or less, more preferably 1% by mol or more and 20% by mol or less, further preferably 1% by mol or more and 15% by mol or less, particularly preferably 1% by mol or more and 8% by mol or less with the total content of all repeating units contained in the polymer compound A being 100% by mol, from the standpoint of enhancing the carrier mobility of the organic thin-film transistor.

The content of the above-described repeating unit contained in the polymer compound A is determined from the use amount of raw material monomers corresponding to each repeating unit used in producing the polymer compound.

In the embodiment of the present invention, the molar ratio of the repeating unit represented by the formula (4) to the sum of the repeating units represented by the formulae (2) and (3) is preferably 1/100 to 1000/100, more preferably 10/100 to 1000/100, further preferably 50/100 to 200/100 with the total charging amount (molar quantity) of the repeating units represented by the formulae (2) and (3) being 100.

By adjusting the molar ratio of the repeating unit represented by the formula (4) to the sum of the repeating units represented by the formulae (2) and (3) within this range, a cross-linked structure is sufficiently formed in the hardened product obtained by hardening a composition containing the polymer compound A obtained according to the embodiment of the present invention, to improve solvent resistance.

In the above-described polymer compound A, the total content of a repeating unit represented by the formula (1), a repeating unit represented by the formula (2) or (3) and a repeating unit represented by the formula (4) is preferably 90% by mol or more with the total content of all repeating units contained in the polymer compound A being 100% by mol.

The above-described polymer compound A is preferably a polymer compound composed only of a repeating unit represented by the formula (1), a repeating unit represented by the formula (2) or (3) and a repeating unit represented by the formula (4).

The repeating unit represented by the formula (4) is preferably a repeating unit represented by the formula (6).

[Chemical Formula 25]

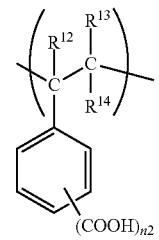

(6)

(in the formula (6), $R^{12}$, $R^{13}$ and $R^{14}$ each independently represent a hydrogen atom or a methyl group.

n2 represents an integer of 1 to 5.)

In the above-described formula (6), $R^{13}$ and $R^{14}$ each independently represent preferably a hydrogen atom. n2 is preferably 1.

The polymer compound A is preferably a polymer compound having a repeating unit represented by the formula (1), at least one repeating unit selected from the group consisting of a repeating unit represented by the formula (2) and a repeating unit represented by the formula (3); and a repeating unit represented by the formula (6).

The polymer compound A having a repeating unit represented by the formula (1), at least one repeating unit selected from the group consisting of a repeating unit represented by the formula (2) and a repeating unit represented by the formula (3); and a repeating unit represented by the formula (6), or a composition containing the polymer compound A can be hardened at low temperature, hence, layers composed of hardened products thereof can be used not only for organic thin-film transistors but also for various electronic devices such as sensors and the like. The layer composed of the hardened product is preferably used for an organic thin-film transistor, more preferably used as a gate insulation layer. The layer composed of the hardened product is preferable not only as a gate insulation layer of an organic thin-film transistor but also as a protective layer such as an over coat layer, an under coat layer and the like, since it is excellent in insulation, sealing, adhesion and solvent resistance.

[Repeating Unit Having a Crosslinkable Group and Repeating Unit Represented by the Formula (1)]

The polymer compound A having a repeating unit having a hydroxy group and a repeating unit represented by the formula (1) includes, for example, the following compounds.

[Chemical Formula 26]

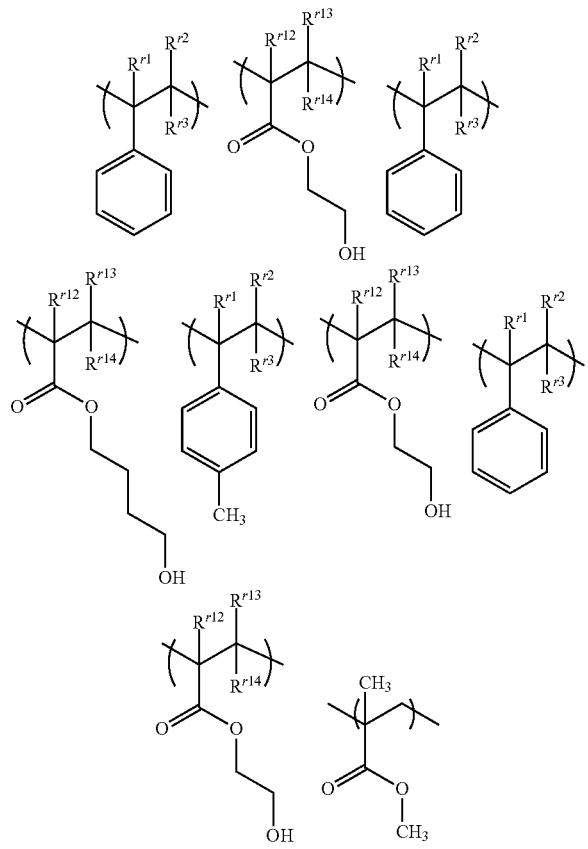

[Chemical Formula 27]

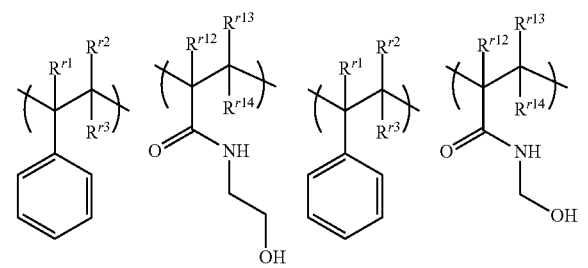

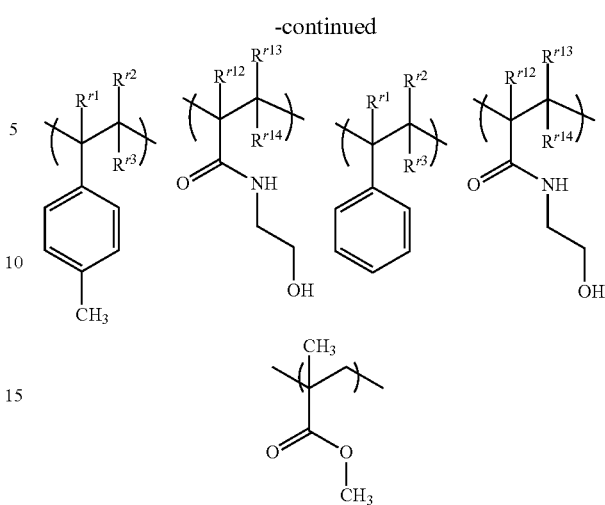

$R^{r1}$ to $R^{r3}$ and $R^{r12}$ to $R^{r14}$ each independently represent a hydrogen atom or a methyl group.

The polymer compound A having a repeating unit having a carboxy group and a repeating unit represented by the formula (1) includes, for example, the following compounds.

[Chemical Formula 28]

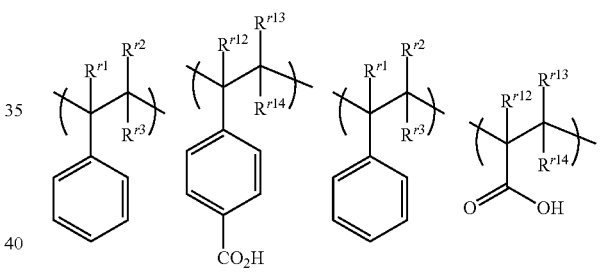

[Chemical Formula 29]

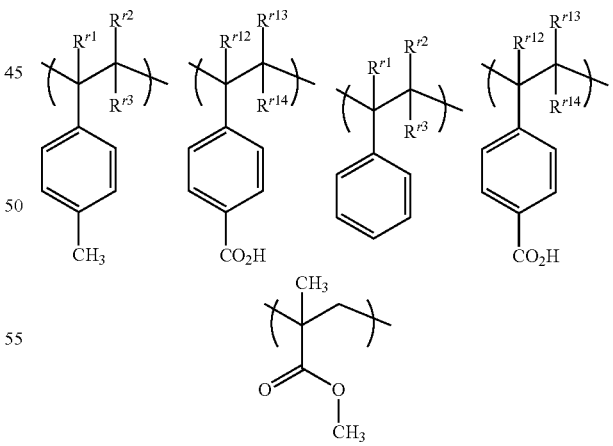

$R^{r1}$ to $R^{r3}$ and $R^{r12}$ to $R^{r14}$ each independently represent a hydrogen atom or a methyl group.

The polymer compound A having a repeating unit having an amino group and a repeating unit represented by the formula (1) includes, for example, the following compounds.

[Chemical Formula 30]

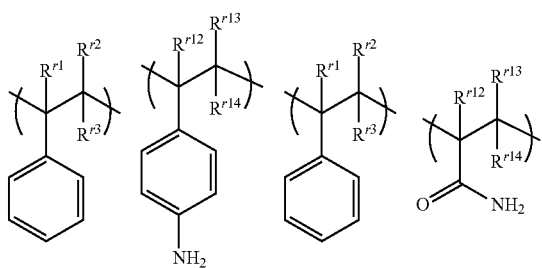

[Chemical Formula 31]

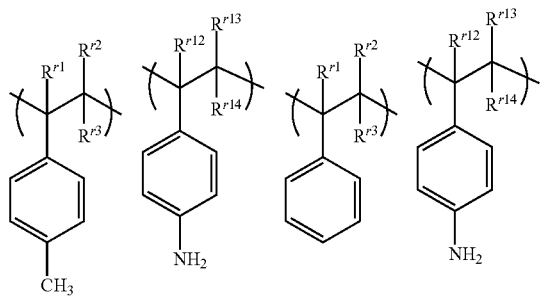

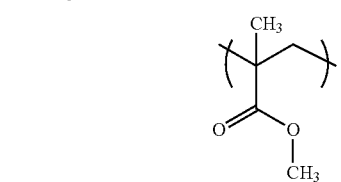

$R^{r1}$ to $R^{r3}$ and $R^{r12}$ to $R^{r14}$ each independently represent a hydrogen atom or a methyl group.

The polymer compound A having a repeating unit having an isocyanato group or an isothiocyanato group and a repeating unit represented by the formula (1) includes, for example, the following compounds.

[Chemical Formula 32]

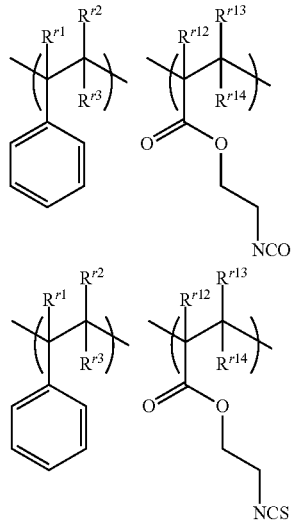

[Chemical Formula 33]

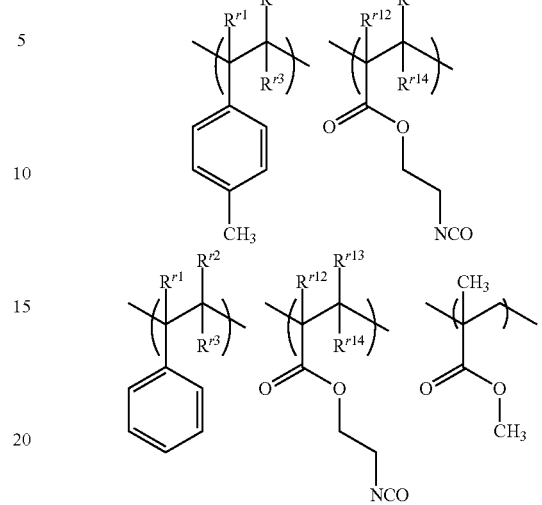

$R^{r1}$ to $R^{r3}$ and $R^{r12}$ to $R^{r14}$ each independently represent a hydrogen atom or a methyl group.

The polymer compound A having a repeating unit having a blocked isocyanato group or a blocked isothiocyanato group and a repeating unit represented by the formula (1) includes, for example, the following compounds.

[Chemical Formula 34]

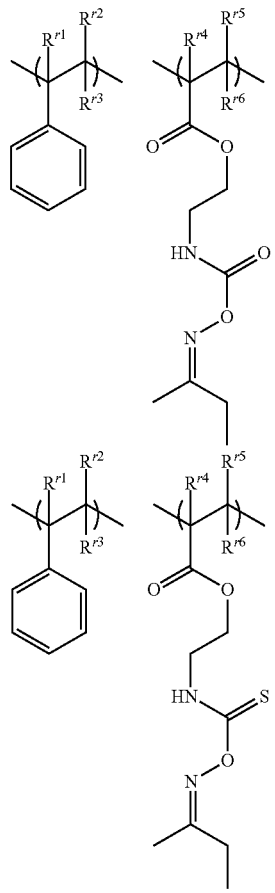

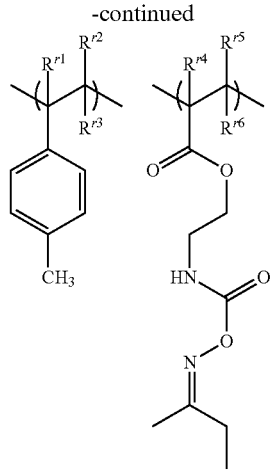
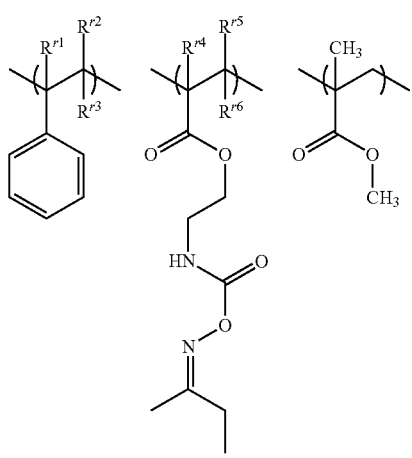
[Chemical Formula 35]
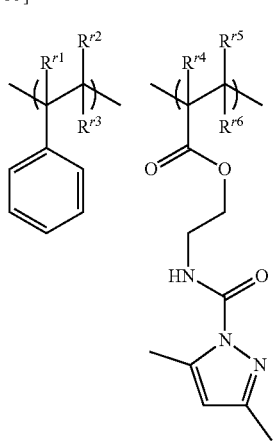
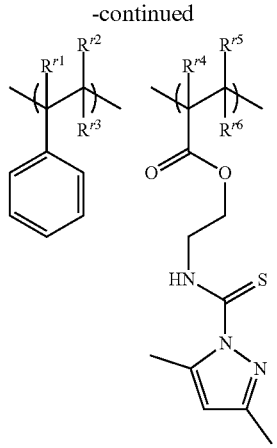
$R^{r1}$ to $R^{r3}$ and $R^{r4}$ to $R^{r6}$ each independently represent a hydrogen atom or a methyl group.
The polymer compound A having a repeating unit having a vinyl group or an allyl group and a repeating unit represented by the formula (1) includes, for example, the following compounds.

[Chemical Formula 36]

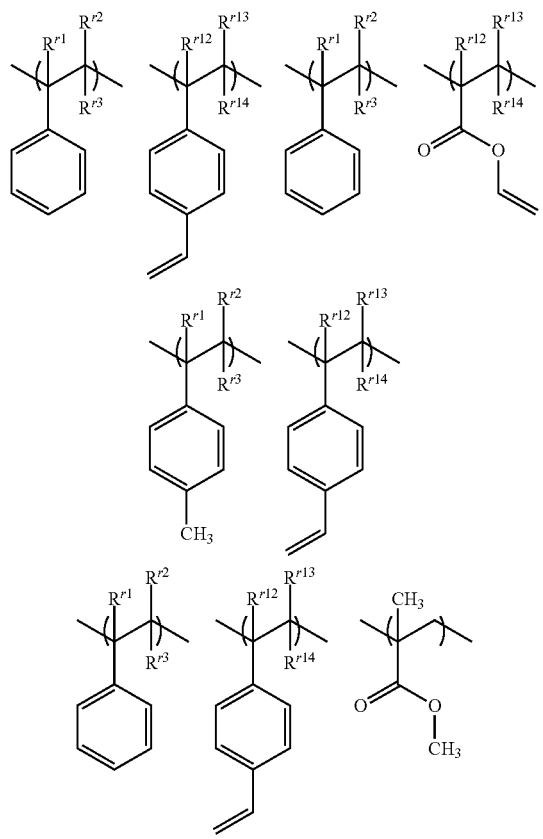

[Chemical Formula 37]

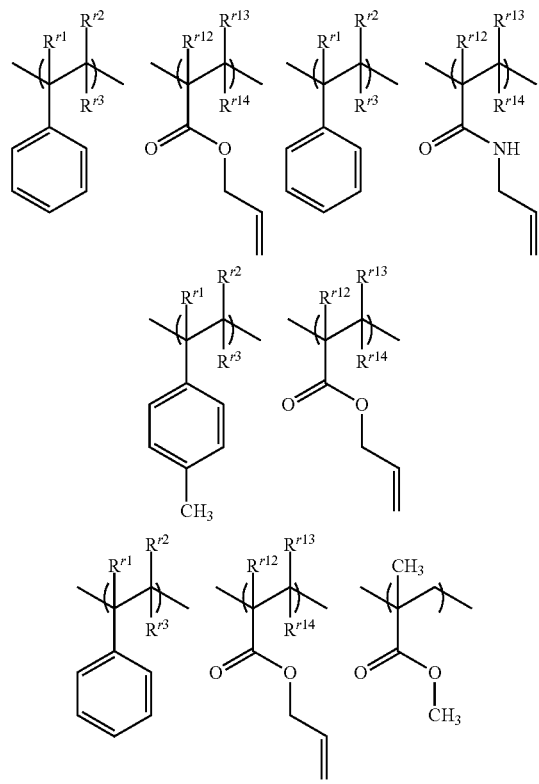

$R^{r1}$ to $R^{r3}$ and $R^{r12}$ to $R^{r14}$ each independently represent a hydrogen atom or a methyl group.

The polymer compound A having a repeating unit having a mercapto group and a repeating unit represented by the formula (1) includes, for example, the following compounds.

[Chemical Formula 38]

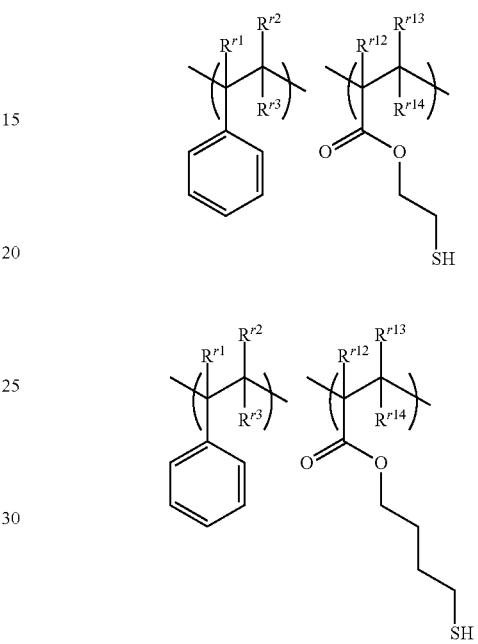

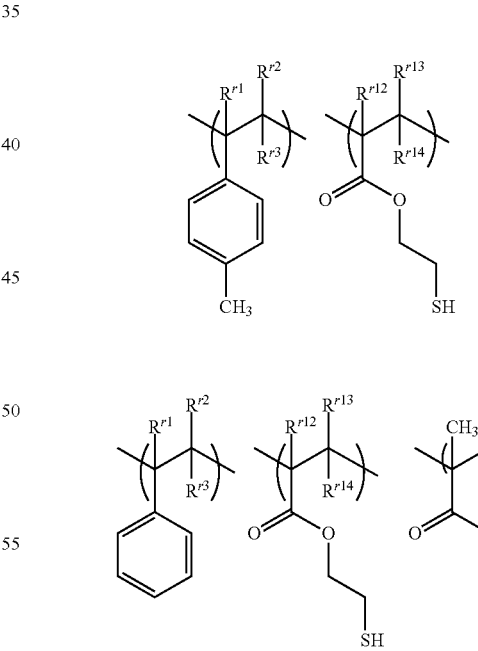

$R^{r1}$ to $R^{r3}$ and $R^{r12}$ to $R^{r14}$ each independently represent a hydrogen atom or a methyl group.

The polymer compound A having a repeating unit having an acryl group or a methacryl group and a repeating unit represented by the formula (1) includes, for example, the following compounds.

[Chemical Formula 39]
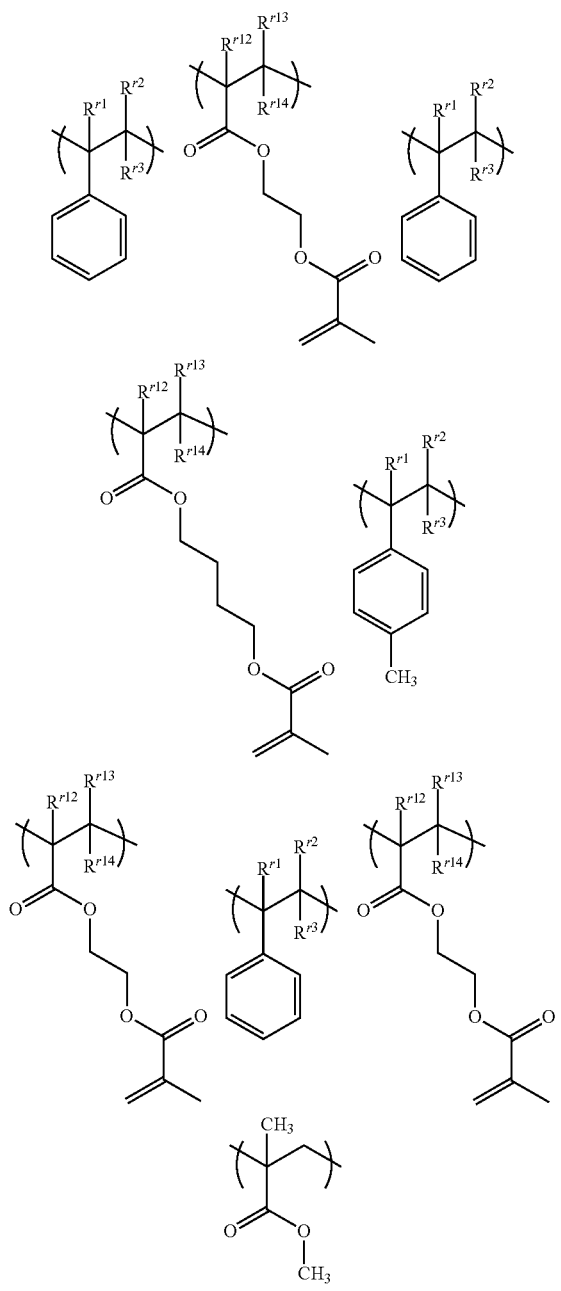
[Chemical Formula 40]
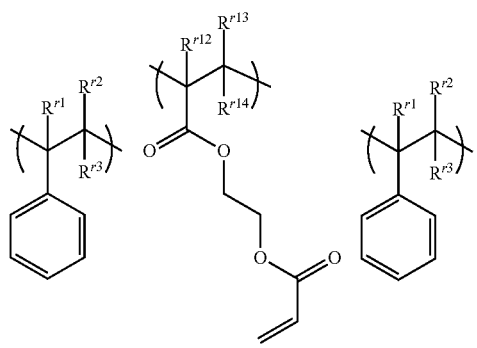
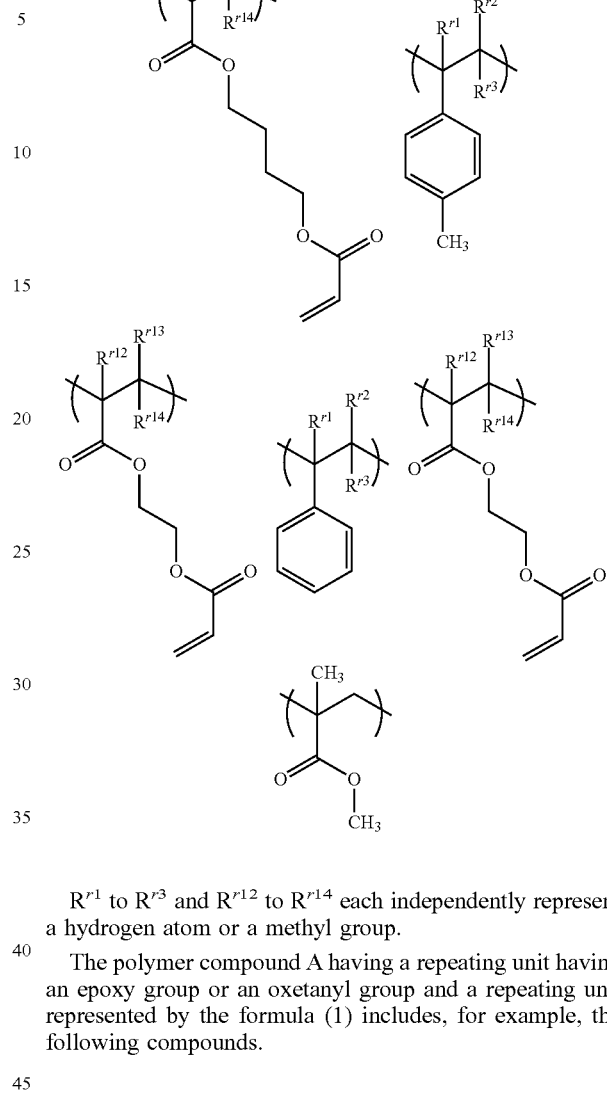
$R^{r1}$ to $R^{r3}$ and $R^{r12}$ to $R^{r14}$ each independently represent a hydrogen atom or a methyl group.
The polymer compound A having a repeating unit having an epoxy group or an oxetanyl group and a repeating unit represented by the formula (1) includes, for example, the following compounds.
[Chemical Formula 41]
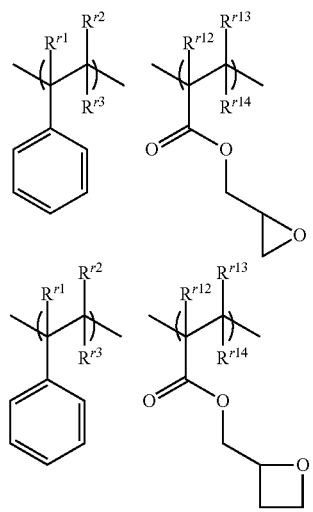

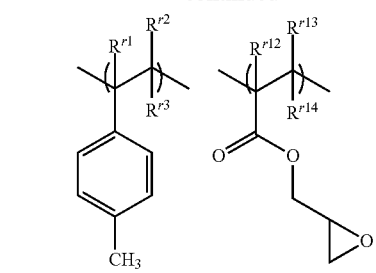
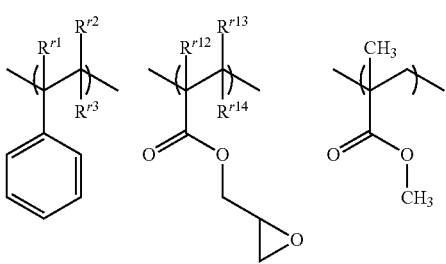
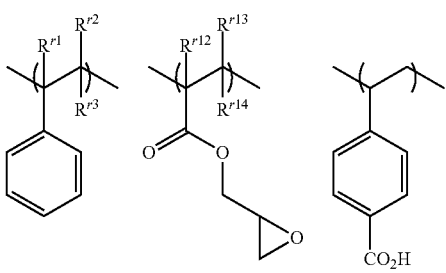
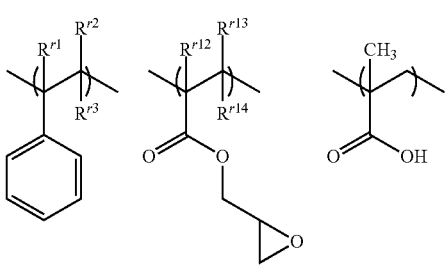
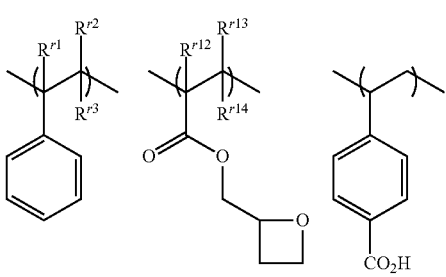

$R^{r1}$ to $R^{r3}$ and $R^{r12}$ to $R^{r14}$ each independently represent a hydrogen atom or a methyl group.

The polymer compound A having a repeating unit having an alkoxysilyl group and a repeating unit represented by the formula (1) includes, for example, the following compounds.

[Chemical Formula 43]

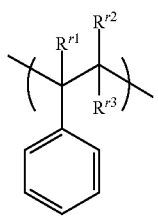
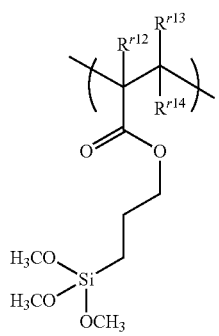

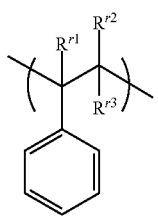
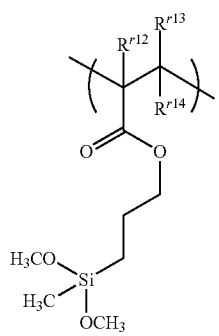

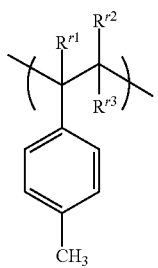
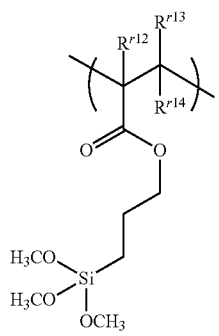

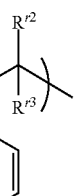
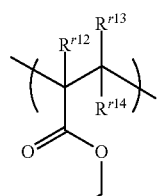
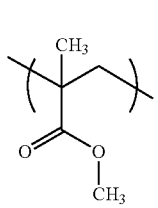

$R^{r1}$ to $R^{r3}$ and $R^{r12}$ to $R^{14}$ each independently represent a hydrogen atom or a methyl group.

The polymer compound A having a repeating unit having an oxazoline group and a repeating unit represented by the formula (1) includes, for example, the following compounds.

[Chemical Formula 44]

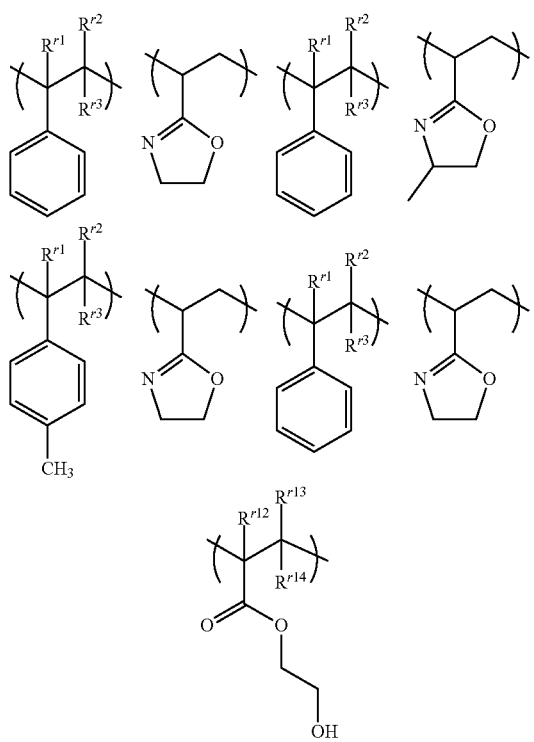

$R^{r1}$ to $R^{r3}$ each independently represent a hydrogen atom or a methyl group.

The polymer compound A having a repeating unit having a carboxylic anhydride and a repeating unit represented by the formula (1) includes, for example, the following compounds.

[Chemical Formula 45]

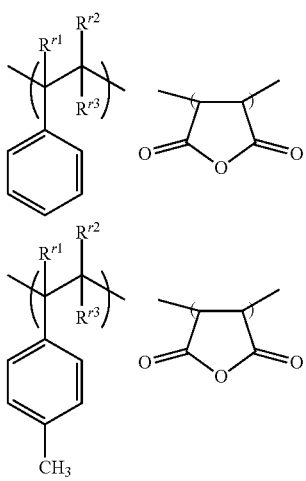

$R^{r1}$ to $R^{r3}$ each independently represent a hydrogen atom or a methyl group.

The polymer compound A having a repeating unit having at least one group selected from the group consisting of a blocked isocyanato group or a blocked isothiocyanato group; a repeating unit having at least one group selected from the group consisting of a hydroxy group and a carboxy group, and a repeating unit represented by the formula (1) includes, for example, the following compounds.

[Chemical Formula 46]

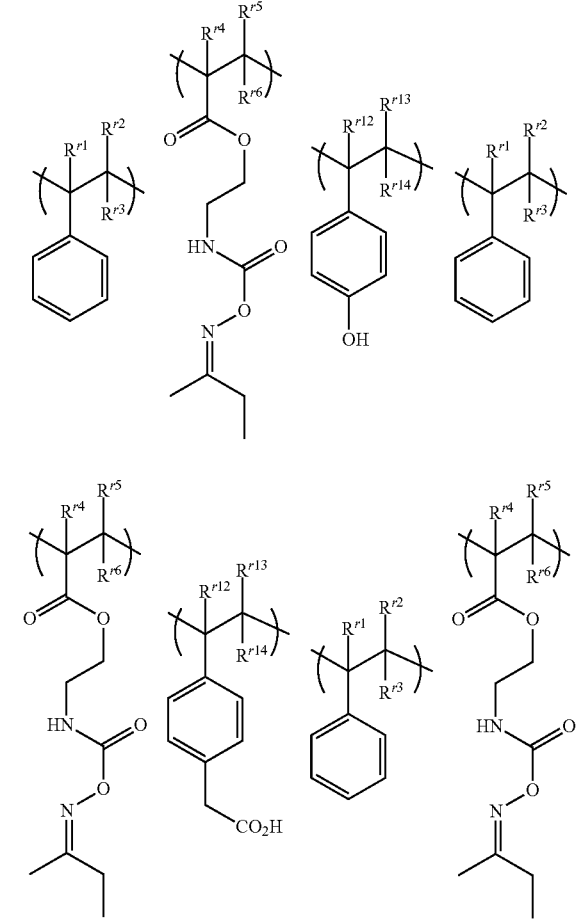

[Chemical Formula 47]

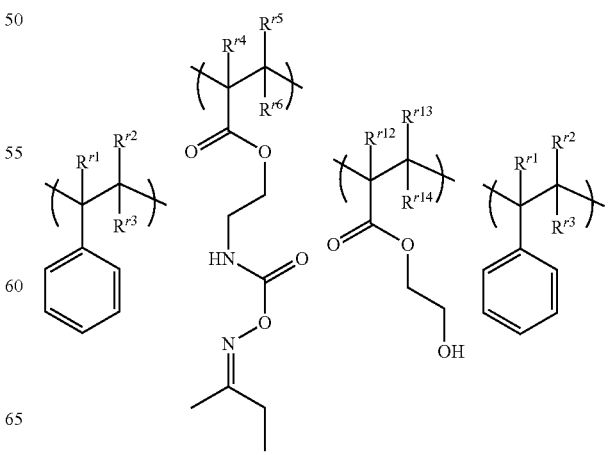

47

-continued

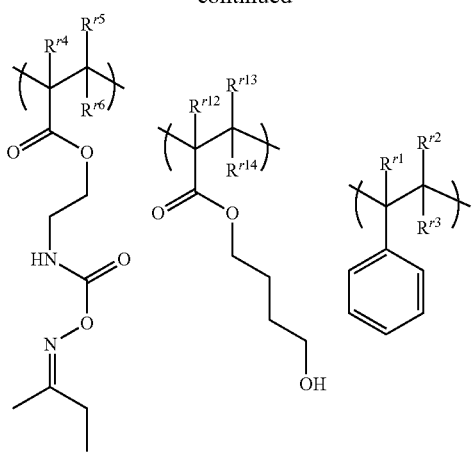

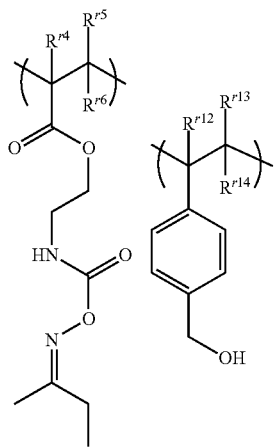

[Chemical Formula 48]

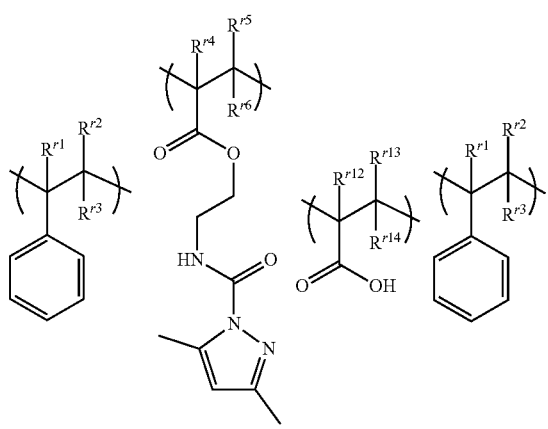

48

-continued

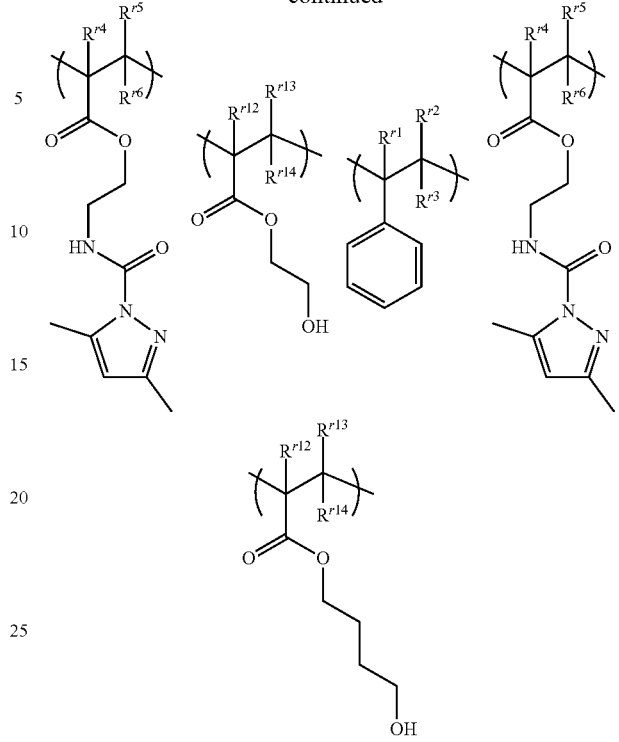

$R^{r1}$ to $R^{r14}$ each independently represent a hydrogen atom or a methyl group.

The polymer compound A is preferably a polymer compound having at least one repeating unit selected from the group consisting of a repeating unit represented by the above-described formula (2) and a repeating unit represented by the above-described formula (3); a repeating unit represented by the above-described formula (6) and a repeating unit represented by the above-described formula (1).

The polymer compound A having at least one repeating unit selected from the group consisting of a repeating unit represented by the formula (2) and a repeating unit represented by the formula (3); a repeating unit represented by the formula (6) and a repeating unit represented by the formula (1) includes, for example, the following compounds.

[Chemical Formula 49]

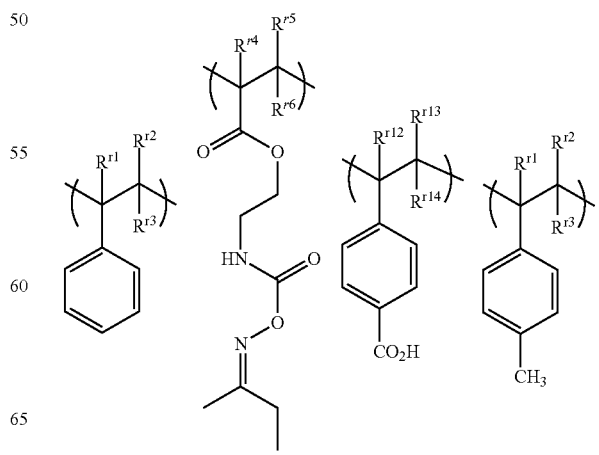

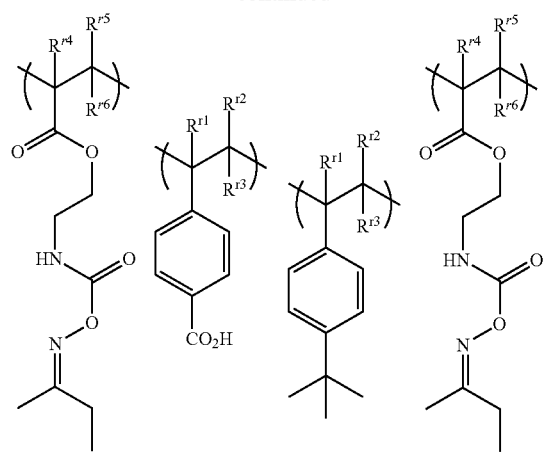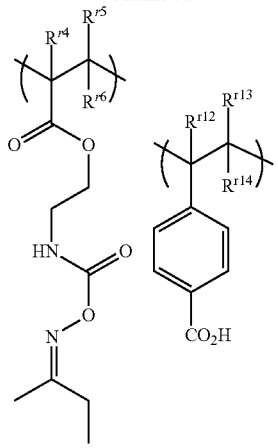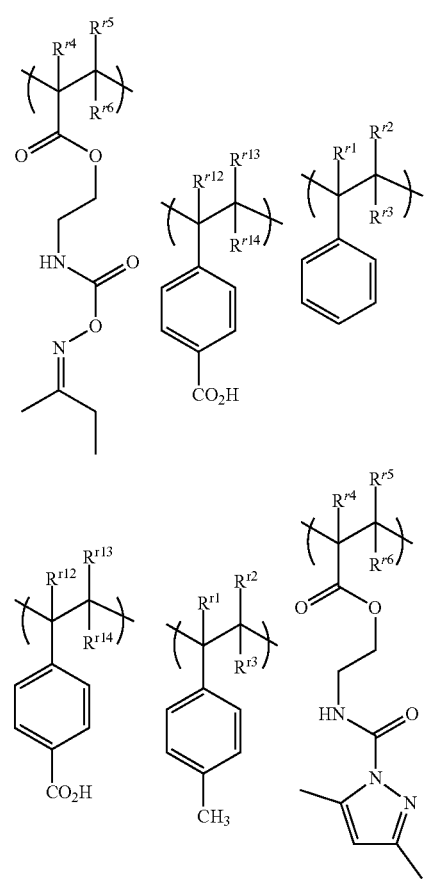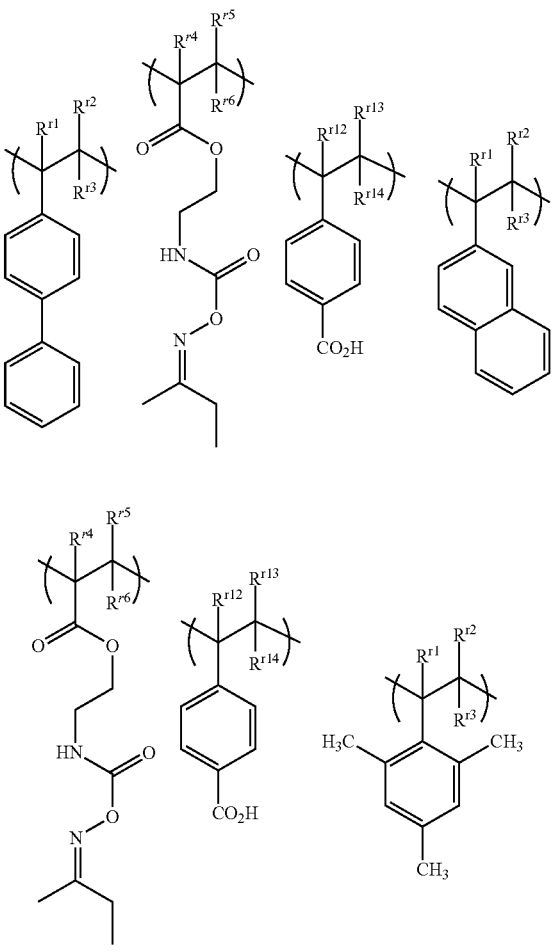
[Chemical Formula 50]
[Chemical Formula 51]

-continued

[Chemical Formula 52]

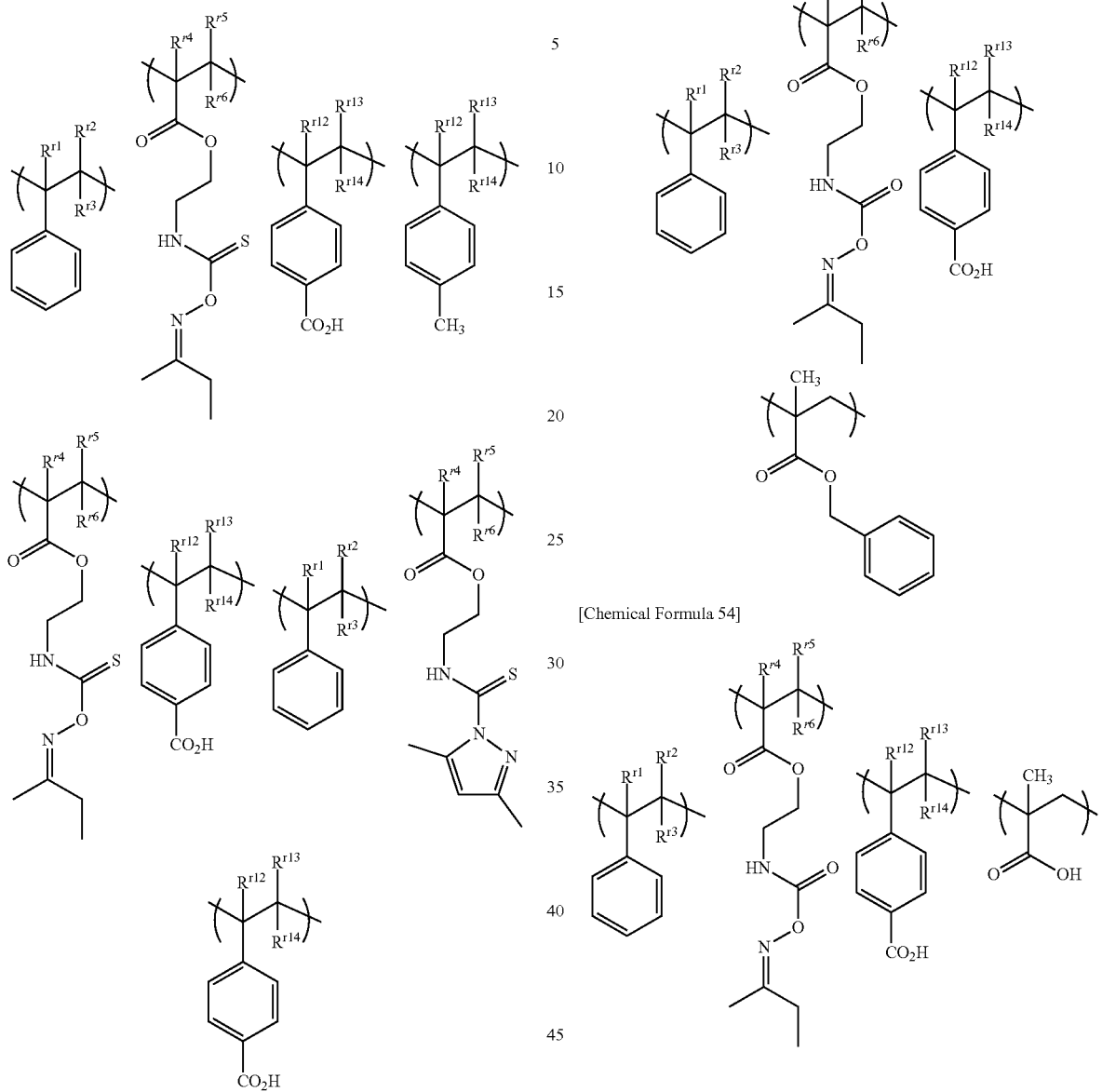

[Chemical Formula 53]

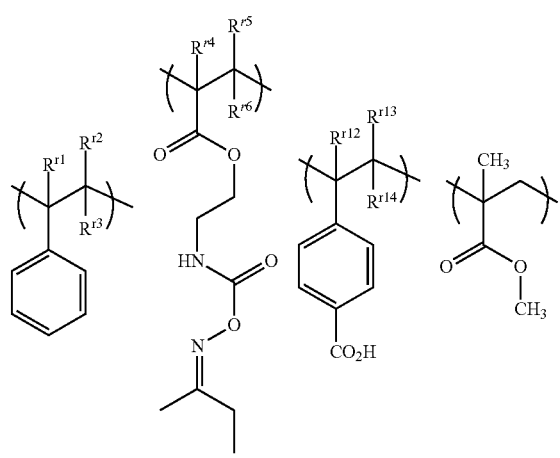

[Chemical Formula 54]

$R^{r1}$ to $R^{r14}$ each independently represent a hydrogen atom or a methyl group.

The polymer compound A can be produced, for example, by a method of copolymerizing a monomer (polymerizable monomer) as a raw material of a repeating unit represented by the formula (1), and a monomer (polymerizable monomer) as a raw material of a repeating unit having a crosslinkable group.

When the polymer compound A further has at least one selected from the group consisting of other repeating units, the polymer compound A can be produced by a method of copolymerizing a monomer as a raw material of a repeating unit represented by the formula (1), a monomer as a raw material of a repeating unit having a crosslinkable group, and at least one monomer selected from the group consisting of monomers as raw materials of the other repeating units.

The method of the polymerization reaction is not particularly restricted, and known polymerization methods such as bulk polymerization, solution polymerization, suspension polymerization, emulsion polymerization and the like can be adopted, and particularly, a solution polymerization method is preferable. For the polymerization, photopolymerization initiators or thermal polymerization initiators are usually used, and a photo-radical-polymerization initiator or a thermal radical polymerization initiator is suitably used. The polymerization initiators may be used singly or in combination of two or more, and a chain transfer agent may also be used together. The amount of the polymerization initiator may be appropriately determined depending on the kinds of the monomers, the proportion thereof, and the like. Typically, the amount is about 0.01 to 10% by mol with respect to 100% by mol of the polymerizable monomers.

The polymerization temperature is not particularly restricted as long as it is a temperature at which the polymerization progresses, and it is preferably 40 to 150° C., more preferably 50 to 130° C., further preferably 60 to 100° C., particularly preferably 60 to 90° C. The polymerization concentration (polymerization concentration is taken as [(total mass of all monomers)/(total mass of all monomers+mass of solvent)]×100) varies depending on the kinds of monomer components to be used and the proportion thereof, and the molecular weight of the intended polymer compound, and it is preferably 5 to 80% by mass, more preferably 10 to 60% by mass.

When a solvent is used in the above-described monomer polymerization, solvents used in usual polymerization reactions may be used as the solvent.

Specific examples thereof include ether solvents such as tetrahydrofuran, dioxane, ethylene glycol dimethyl ether, diethylene glycol dimethyl ether and the like; ketone solvents such as acetone, methyl ethyl ketone, methyl isobutyl ketone, cyclohexanone and the like; ester solvents such as ethyl acetate, butyl acetate, propylene glycol monomethyl ether acetate, 3-methoxybutyl acetate and the like; alcohol solvents such as methanol, ethanol, isopropanol, n-butanol, ethylene glycol monomethyl ether, propylene glycol monomethyl ether, 2-ethoxyethanol and the like; aromatic hydrocarbon solvents such as toluene, xylene, ethylbenzene and the like; chloroform; dimethyl sulfoxide; and the like. These solvents may be used only singly or in combination of two or more.

[Polymerization Initiator]

The photopolymerization initiator includes, for example, carbonyl compounds such as acetophenone, 2,2-dimethoxy-2-phenylacetophenone, 2,2-diethoxyacetophenone, 4-isopropyl2-hydroxy-2-methylpropiophenone, 2-hydroxy-2-methylpropiophenone, 4,4'-bis(diethylamino)benzophenone, benzophenone, methyl(o-benzoyl) benzoate, 1-phenyl1,2-propanedione-2-(o-ethoxycarbonyl)oxime, 1-phenyl-1,2-propanedione-2-(o-benzoyl)oxime, benzoin, benzoin methyl ether, benzoin ethyl ether, benzoin isopropyl ether, benzoin isobutyl ether, benzoin octyl ether, benzyl, benzyl dimethyl ketal, benzyl diethyl ketal, diacetyl and the like; anthraquinone derivatives and thioxanthone derivatives such as methylanthraquinone, chloroanthraquinone, chlorothioxanthone, 2-methylthioxanthone, 2-isopropylthioxanthone and the like; and sulfur compounds such as diphenyl disulfide, dithiocarbamate and the like.

When optical energy is used as the energy for initiating copolymerization, the wavelength of light to be irradiated on the polymerizable monomer is usually 360 nm or more, preferably 360 nm or more and 450 nm or less.

As the thermal polymerization initiator, an initiator for radical polymerization is preferable, and examples thereof include azo compounds such as 2,2'-azobis(2-methylpropionitrile), 2,2'-azobisisobutyronitrile, 2,2'-azobisisovaleronitrile, 2,2'-azobis(2,4-dimethylvaleronitrile), 4,4'-azobis(4-cyanovaleric acid), 1,1'-azobis(cyclohexanecarbonitrile), 2,2'-azobis(2-methylpropane), 2,2'-azobis(2-methylpropionamidine) dihydrochloride and the like; ketone peroxide compounds such as methyl ethyl ketone peroxide, methyl isobutyl ketone peroxide, cyclohexanone peroxide, acetylacetone peroxide and the like; diacyl peroxide compounds such as isobutyl peroxide, benzoyl peroxide, 2,4-dichlorobenzoyl peroxide, o-methylbenzoyl peroxide, lauroyl peroxide, p-chlorobenzoyl peroxide and the like; hydroperoxide compounds such as 2,4,4-trimethylpentyl-2-hydroperoxide, diisopropylbenzene hydroperoxide, cumene hydroperoxide, tert-butyl hydroperoxide and the like; dialkyl peroxide compounds such as dicumyl peroxide, tert-butylcumyl peroxide, di-tert-butyl peroxide, tris(tert-butylperoxy)triazine and the like; peroxy ketal compounds such as 1,1-di-tert-butylperoxycyclohexane, 2,2-di(tert-butylperoxy)butane and the like; alkyl perester compounds such as tert-butyl peroxypivalate, tert-butyl peroxy-2-ethylhexanoate, tert-butyl peroxyisobutyrate, di-tert-butyl peroxyhexahydroterephthalate, di-tert-butyl peroxyazelate, tert-butyl peroxy-3,5,5-trimethylhexanoate, tert-butyl peroxyacetate, tert-butyl peroxy benzoate, di-tert-butyl peroxytrimethyladipate and the like; and peroxycarbonate compounds such as diisopropyl peroxydicarbonate, di-sec-butyl peroxydicarbonate, tert-butyl peroxyisopropylcarbonate and the like.

[Monomer as Raw Material of Repeating Unit Represented by the Formula (1)]

Examples of the monomer as a raw material of a repeating unit represented by the formula (1) include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethylstyrene, o-ethylstyrene, m-ethylstyrene, p-ethylstyrene, 2-vinylbiphenyl, 3-vinylbiphenyl, 4-vinylbiphenyl, α-methylstyrene, 2,4-dimethyl-α-methylstyrene, 2,3-dimethyl-α-methylstyrene, 3,5-dimethyl-α-methylstyrene, p-isopropyl-α-methylstyrene, 1-vinylnaphthalene, 2-vinylnaphthalene and the like.

[Monomer as Raw Material of Repeating Unit Having Crosslinkable Group]

In the present specification, the crosslinkable group means a group capable forming a cross-linked structure by the action of radical, acid, heat, water, oxygen and the like. For example, a cross-linked structure is formed by a mutual cross-linking reaction of crosslinkable groups of the polymer compound A, or by a cross-linking reaction between a cross-linkable group of the polymer compound A and a functional group a compound other than the polymer compound A, capable of reacting with the cross-linkable group (also called reactive group).

The crosslinkable group performing a cross-linking reaction includes a hydroxy group, a carboxy group, an amino group, an isocyanato group, an isothiocyanato group, a blocked isocyanato group, a blocked isothiocyanato group, a vinyl group, an ethynyl group, a propargyl group, an azide group, an allyl group, a mercapto group, an epoxy group, an oxetanyl group, an alkoxysilyl group, an oxazoline group, an acryl group, a methacryl group and a carboxylic anhydride. Of them, a hydroxy group, a carboxy group, an isocyanato group, a blocked isocyanato group, a blocked isothiocyanato group, an alkoxysilyl group, an acryl group, a methacryl group and an epoxy group are preferable, and a hydroxy group, a carboxy group, a blocked isocyanato group and a blocked isothiocyanato group are more preferable, from the standpoint of formation of a thermally cured film at low temperature in a short period of time.

These crosslinkable groups can be introduced into a polymer by using monomers having an unsaturated double bond such as methacryl type monomers, acryl type monomers, vinyl type monomers, styrene type monomers, maleimide type monomers and the like having a crosslinkable group. It is preferable that the crosslinkable groups are introduced into a polymer by using a thermally crosslinkable group-containing alkyl ester of methacrylic acid, a thermally crosslinkable group-containing alkyl ester of acrylic acid, or a styrene derivative.

The monomer having a hydroxy group includes 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate, 2,3-dihydroxypropyl acrylate, 2,3-dihydroxypropyl methacrylate, diethylene glycol monoacrylate, diethylene glycol monomethacrylate, caprolactone 2-(acryloyloxy) ethyl ester, caprolactone 2-(methacryloyloxy)ethyl ester, poly(ethylene glycol)ethyl ether acrylate, poly(ethylene glycol)ethyl ether methacrylate, 5-acryloyloxy-6-hydroxynorbornene-2-carboxylic-6-lactone, 5-methacryloyloxy-6-hydroxynorbornene-2-carboxylic-6-lactone, hydroxystyrene, N-(hydroxyphenyl)acrylamide, N-(hydroxyphenyl)methacrylamide, N-(hydroxyphenyl)maleimide, N-methylolacrylamide, N-methylolmethacrylamide and the like.

The monomer having a carboxy group includes acrylic acid, methacrylic acid, crotonic acid, mono-(2-(acryloyloxy) ethyl) phthalate, mono-(2-(methacryloyloxy)ethyl) phthalate, N-(carboxyphenyl)maleimide, N-(carboxyphenyl)acrylamide, N-(carboxyphenyl)methacrylamide, 4-vinylbenzoic acid, 3-vinylbenzoic acid, 2-vinylbenzoic acid and the following compounds and the like.

[Chemical Formula 55]

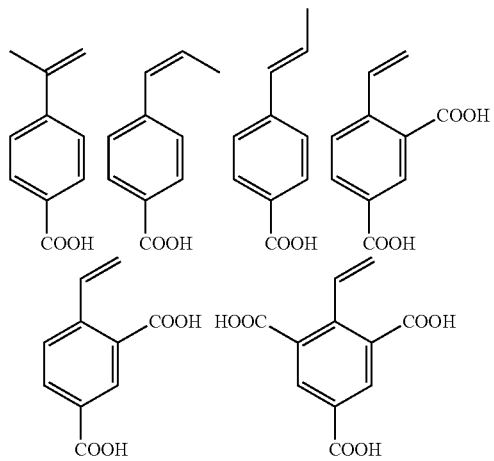

The monomer having an amino group includes aminoethyl acrylate, aminoethyl methacrylate, aminopropyl acrylate, aminopropyl methacrylate and the like.

The monomer having a vinyl group or an allyl group includes allyl (meth)acrylate, dipropylene glycol diallyl ether, poly glycol diallyl ether, triethylene glycol divinyl ether, hydroquinone diallyl ether, tetraallyloxyethane, trimethylolpropane diallyl ether, triallylamine, methylenebisacrylamide, divinylbenzene and the like.

The monomer having an epoxy group includes vinyl glycidyl ether, allyl glycidyl ether, butenyl glycidyl ether, o-allylphenyl glycidyl ether, butadiene monoepoxide, chloroprene monoepoxide, 4,5-epoxy-2-pentene, 3,4-epoxy-1-vinylcyclohexene, 1,2-epoxy-5,9-cyclododecadiene, 3,4-epoxy-1-butene, 1,2-epoxy-5-hexene, 1,2-epoxy-9-decene, glycidyl acrylate, glycidyl methacrylate, glycidyl crotonate, glycidyl-4-heptenoate, glycidyl sorbate, glycidyl linoleate, glycidyl-4-methyl-3-pentenoate, glycidyl ester of 3-cyclohexenecarboxylic acid, glycidyl ester of 4-methyl-3-cyclohexenecarboxylic acid, and the like.

The monomer having an oxetanyl group includes 3-((meth)acryloyloxymethyl)oxetane, 3-((meth)acryloyloxymethyl)-2-trifluoromethyloxetane, 3-((meth)acryloyloxymethyl)-2-phenyloxetane, 2-((meth)acryloyloxymethyl) oxetane, 2-((meth)acryloyloxymethyl)-4-trifluoromethyloxetane and the like.

The monomer having an alkoxysilyl group includes 3-(trimethoxysilyl)propyl acrylate, 3-(trimethoxysilyl)propyl methacrylate, 3-[diethoxy(methyl)silyl]propyl acrylate, 3-[diethoxy(methyl)silyl]propyl methacrylate, acryloyloxypropyltriethoxysilane, methacryloyloxypropyltriethoxysilane and the like.

The monomer having an oxazoline group includes 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-methyl-2-oxazoline, 2-isopropenyl-5-ethyl-2-oxazoline and the like.

The monomer having an acryl group or a methacryl group includes ethylene di(meth)acrylate, diethylene glycol di(meth)acrylate, triethylene glycol di(meth)acrylate, tetraethylene glycol di(meth)acrylate, trimethylolpropane tri(meth) acrylate and the like.

The monomer having an isocyanato group includes, for example, 2-isocyanate ethyl methacrylate, 2-isocyanate ethyl acrylate, 4-isocyanate butyl methacrylate, 4-isocyanate butyl acrylate and the like.

The blocked isocyanato group and the blocked isothiocyanato group can be generated, for example, by reacting a blocking agent having only one active hydrogen capable of reacting with an isocyanato group or an isothiocyanato group in one molecule of the blocking agent with a compound having an isocyanato group or an isothiocyanato group.

The blocking agent is preferably a compound that, even after reacting with at least one group selected from the group consisting of an isocyanato group and an isothiocyanato group, can release a protective group from at least one group selected from the group consisting of a blocked isocyanato group and a blocked isothiocyanato group by heating at temperatures of 170° C. or less or by electromagnetic irradiation.

The blocking agent includes, for example, alcohol compounds, phenol compounds, active methylene compounds, mercaptan compounds, acid amide compounds, acid imide compounds, imidazole compounds, urea compounds, oxime compounds, amine compounds, imine compounds, bisulfites, pyridine compounds and pyrazole compounds. These blocking agents may be used singly or in admixture of two or more. The preferable blocking agent includes oxime compounds and pyrazole compounds.

Specific examples of the applicable blocking agent are shown below.

Examples of the alcohol compound include methanol, ethanol, propanol, butanol, 2-ethylhexanol, methyl cellosolve, butyl cellosolve, methyl carbitol, benzylalcohol, cyclohexanol and the like.

Examples of the phenol compound include phenol, cresol, ethylphenol, butylphenol, nonylphenol, dinonylphenol, styrenated phenol, hydroxybenzoic acid ester and the like.

Examples of the active methylene compound include dimethyl malonate, diethyl malonate, methyl acetoacetate, ethyl acetoacetate, acetylacetone and the like.

Examples of the mercaptan compound include butylmercaptan, dodecylmercaptan and the like.

Examples of the acid amide compound include acetoanilide, acetic amide, ε-caprolactam, δ-valerolactam, γ-butyrolactam and the like.

Examples of the acid imide compound include succinimide, maleic imide and the like.

Examples of the imidazole compound include imidazole, 2-methylimidazole and the like.

Examples of the urea compound include urea, thiourea, ethylene urea and the like.

Examples of the oxime compound include formamide oxime, acetaldoxime, acetoxime, methyl ethyl ketoxime, cyclohexanone oxime and the like.

Examples of the amine compound include diphenylamine, aniline, carbazole and the like.

Examples of the imine compound include ethyleneimine, polyethyleneimine and the like.

Examples of the bisulfite include sodium bisulfite and the like.

Examples of the pyridine compound include 2-hydroxypyridine, 2-hydroxyquinoline and the like.

Examples of the pyrazole compound include 3,5-dimethylpyrazole, 3,5-diethylpyrazole and the like.

The blocked isocyanato group includes, for example, 1-(methylideneamino)carboxyamino group, O-(1-ethylideneamino)carboxyamino group, O-(1-methylethylideneamino)carboxyamino group, O-[1-methylpropylideneamino]carboxyamino group, (N-3,5-dimethylpyrazolylcarbonyl)amino group, (N-3-ethyl-5-methylpyrazolylcarbonyl)amino group, (N-3,5-diethylpyrazolylcarbonyl)amino group, (N-3-propyl-5-methylpyrazolylcarbonyl)amino group, (N-3-ethyl-5-propylpyrazolylcarbonyl)amino group and the like.

The blocked isothiocyanato group includes, for example, O-(methylideneamino)thiocarboxyamino group, O-(1-ethylideneamino)thiocarboxyamino group, O-(1-methylethylideneamino)thiocarboxyamino group, O-[1-methylpropylideneamino]thiocarboxyamino group, (N-3,5-dimethylpyrazolylthiocarbonyl)amino group, (N-3-ethyl-5-methylpyrazolylthiocarbonyl)amino group, (N-3,5-diethylpyrazolylthiocarbonyl)amino group, (N-3-propyl-5-methylpyrazolylthiocarbonyl)amino group, (N-3-ethyl-5-propylpyrazolylthiocarbonyl)amino group and the like.

The monomer having a blocked isocyanato group includes 2-[(3,5-dimethylpyrazolyl)carboxyamino]ethyl methacrylate (Karenz MOI-BP, manufactured by Showa Denko K.K.); 2-(O-[1'-methylpropylideneamino]carboxyamino)ethyl methacrylate (Karenz MOI-BM, manufactured by Showa Denko K.K.), 2-[bis(ethoxycarbonyl)methyl]carbonylamino]-ethyl methacrylate, 2-[O-[1'-methylpropylideneamino]carboxyamino]ethyl acrylate, 2-[N-[1',3'-dimethylpyrazolyl]carboxyamino]ethyl acrylate and the like.

The monomer having a blocked isothiocyanato group includes 2-acryloyloxyethyl isothiocyanate, 2-methacryloyloxyethyl isothiocyanate, 2-(2'-methacryloyloxyethyl)oxyethyl isothiocyanate and the like.

[Monomer as Raw Material of Other Repeating Unit]

The polymer compound A may contain "other repeating units" other than the repeating unit having a crosslinkable group and the repeating unit represented by the above-described formula (1).

The monomer as a raw material of "other repeating unit" includes, for example, acrylic acid ester and derivatives thereof, methacrylic acid ester and derivatives thereof, acrylamide and derivatives thereof, methacrylamide and derivatives thereof, vinyl acetate and derivatives thereof, methacrylonitrile and derivatives thereof, acrylonitrile and derivatives thereof, vinyl ester of organic carboxylic acid and derivatives thereof, allyl ester of organic carboxylic acid and derivatives thereof, dialkyl ester of fumaric acid and derivatives thereof, dialkyl ester of maleic acid and derivatives thereof, dialkyl ester of itaconic acid and derivatives thereof, N-vinylamide derivatives of organic carboxylic acid, maleimide and derivatives thereof, end unsaturated hydrocarbon and derivatives thereof, organic germanium derivatives and the like. The derivatives described as the monomer as a raw material of "other repeating unit" do not contain a hydroxy group and a carboxy group.

As the acrylic acid esters and derivatives thereof as the monomer as a raw material of "other repeating unit", monofunctional acrylates and polyfunctional acrylates can be used. The acrylic acid esters and derivatives thereof include, for example, methyl acrylate, ethyl acrylate, n-propyl acrylate, isopropyl acrylate, n-butyl acrylate, isobutyl acrylate, sec-butyl acrylate, hexyl acrylate, octyl acrylate, 2-ethylhexyl acrylate, decyl acrylate, isobornyl acrylate, cyclohexyl acrylate, phenyl acrylate, benzyl acrylate, 2-cyanoethyl acrylate, ethylene glycol diacrylate, propylene glycol diacrylate, 1,4-butanediol diacrylate, diethylene glycol diacrylate, triethylene glycol diacrylate, trimethylolpropane diacrylate, trimethylolpropane triacrylate, pentaerythritol pentaacrylate and the like.

As the methacrylic acid esters and derivatives thereof as the monomer as a raw material of "other repeating unit", monofunctional methacrylates and polyfunctional methacrylates can be used. The methacrylic acid esters and derivatives thereof include, for example, methyl methacrylate, ethyl methacrylate, n-propyl methacrylate, isopropyl methacrylate, n-butyl methacrylate, isobutyl methacrylate, sec-butyl methacrylate, hexyl methacrylate, octyl methacrylate, 2-ethylhexyl methacrylate, decyl methacrylate, isobornyl methacrylate, cyclohexyl methacrylate, phenyl methacrylate, benzyl methacrylate, ethylene glycol dimethacrylate, propylene glycol dimethacrylate, 1,4-butanediol dimethacrylate, diethylene glycol dimethacrylate, triethylene glycol dimethacrylate, trimethylolpropane dimethacrylate, trimethylolpropane trimethacrylate, pentaerythritol pentamethacrylate and the like.

Examples of the acrylamide and derivatives thereof as the monomer as a raw material of "other repeating unit" include acrylamide, N-methylacrylamide, N-ethylacrylamide, N-tert-butylacrylamide, N,N-dimethylacrylamide, N,N-diethylacrylamide, N-(butoxymethyl)acrylamide, N-[3-(dimethylamino)propyl]acrylamide, N-phenylacrylamide and N-acryloylmorpholine.

Examples of the methacrylamide and derivatives thereof as the monomer as a raw material of "other repeating unit" include methacrylamide, N-methylmethacrylamide, N-ethylmethacrylamide, N-tert-butylmethacrylamide, N,N-dimethylmethacrylamide, N,N-diethylmethaacrylamide, N-(butoxymethyl)methacrylamide, N-[3-(dimethylamino)propyl]methacrylamide, N-phenylmethacrylamide and N-acryloylmorpholine.

Examples of the acrylonitrile and derivatives thereof as the monomer as a raw material of "other repeating unit" include acrylonitrile and the like. Examples of the methacrylonitrile and derivatives thereof include methacrylonitrile and the like.

Examples of the vinyl ester of organic carboxylic acid and derivatives thereof as the monomer as a raw material of "other repeating unit" include vinyl acetate, vinyl propionate, vinyl butyrate, vinyl benzoate, divinyl adipate and the like.

Examples of the allyl ester of organic carboxylic acid and derivatives thereof as the monomer as a raw material of "other repeating unit" include allyl acetate, allyl benzoate, diallyl adipate, diallyl terephthalate, diallyl isophthalate, diallyl phthalate and the like.

Examples of the dialkyl ester of fumaric acid and derivatives thereof as the monomer as a raw material of "other repeating unit" include dimethyl fumarate, diethyl fumarate, diisopropyl fumarate, di-sec-butyl fumarate, diisobutyl fumarate, di-n-butyl fumarate, di-2-ethylhexyl fumarate, dibenzyl fumarate and the like.

Examples of the dialkyl ester of maleic acid and derivatives thereof as the monomer as a raw material of "other repeating unit" include dimethyl maleate, diethyl maleate, diisopropyl maleate, di-sec-butyl maleate, diisobutyl maleate, di-n-butyl maleate, di-2-ethylhexyl maleate, dibenzyl maleate and the like.

Examples of the dialkyl ester of itaconic acid and derivatives thereof as the monomer as a raw material of "other repeating unit" include dimethyl itaconate, diethyl itaconate, diisopropyl itaconate, di-sec-butyl itaconate, diisobutyl itaconate, di-n-butyl itaconate, di-2-ethylhexyl itaconate, dibenzyl itaconate and the like.

Examples of the N-vinylamide derivative of organic carboxylic acid as the monomer as a raw material of "other repeating unit" include N-methyl-N-vinylacetamide and the like.

Examples of the maleimide and derivatives thereof as the monomer as a raw material of "other repeating unit" include N-phenylmaleimide, N-cyclohexylmaleimide and the like.

Examples of the end unsaturated hydrocarbon and derivatives thereof as the monomer as a raw material of "other repeating unit" include 1-butene, 1-pentene, 1-hexene, 1-octene, vinylcyclohexane, vinyl chloride and the like.

Examples of the organic germanium derivatives as the monomer as a raw material of "other repeating unit" include allyltrimethylgermanium, allyltriethylgermanium, allyltributylgermanium, trimethylvinylgermanium, triethylvinylgermanium and the like.

These monomers as a raw material of "other repeating unit" are selected appropriately depending on the property required for the insulation layer. As the monomer as a raw material of "other repeating unit" methacrylic acid ester and derivatives thereof, acrylic acid ester and derivatives thereof, acrylonitrile and derivatives thereof, methacrylonitrile and derivatives thereof, and organic germanium derivatives are preferable, and acrylic acid alkyl ester, methacrylic acid alkyl ester, acrylonitrile, methacrylonitrile, and allyltrimethylgermanium are more preferable.

<Other Layers>

The organic thin-film transistor may have a protective layer, a substrate and the like, in addition to a gate electrode, a gate insulation layer, a semiconductor layer, a source electrode and a drain electrode.

It is preferable to form a protective layer on an organic thin-film transistor for protecting the organic thin-film transistor. By this, the organic thin-film transistor is blocked from atmospheric air, and lowering of the property of the organic thin-film transistor can be suppressed. When a driving display device is formed on an organic thin-film transistor, also an influence on the organic thin-film transistor in the formation step can be reduced by the protective layer.

The compound constituting the protective layer may be an organic compound or an inorganic compound.

The compound constituting the protective layer include UV curable resins, thermosetting resins, $SiON_x$ (x>0) and the like. In the organic thin-film transistor according to the present invention, a polymer compound or a hardened product of the polymer compound forming a gate insulation layer, or a composition containing the polymer compound or a hardened product of the composition can also be used as the protective layer.

The organic thin-film transistor usually has a substrate at the lowest layer. The substrate includes a plastic film, a glass plate, a silicon plate and the like.

In the organic thin-film transistor of the present invention, a layer containing at least one selected from the group consisting of low molecule compounds having electron transportability, low molecule compounds having hole transportability, alkali metals, alkaline earth metals, rare earth metals, complexes of these metals with organic compounds, halogens such as iodine, bromine, chlorine, iodine chloride and the like, oxidized sulfur compounds such as sulfuric acid, sulfuric anhydride, sulfur dioxide, sulfate salts and the like, oxidized nitrogen compounds such as nitric acid, nitrogen dioxide, nitrate salts and the like, halogenated compounds such as perchloric acid, hypochlorous acid and the like, aromatic thiol compounds such as alkylthiol compound, aromatic thiols and fluorinated alkyl aromatic thiols and the like may be provided between source and drain electrodes, and a semiconductor layer.

<Structure of Organic Thin-Film Transistor>

The organic thin-film transistor of the present invention may be a bottom gate type structure or a top gate type structure.

The organic thin-film transistor preferably has a top gate type structure in which a substrate, an organic semiconductor layer and a gate insulation layer are disposed in this order.

The organic thin-film transistor having a bottom gate type structure includes a bottom gate bottom contact type organic thin-film transistor and a bottom gate top contact type organic thin-film transistor.

The organic thin-film transistor having a top gate type structure includes a top gate bottom contact type organic thin-film transistor and a top gate top contact type organic thin-film transistor.

(Bottom Gate Bottom Contact Type Organic Thin-Film Transistor)

FIG. 1 is a schematic cross-sectional view showing the structure of a bottom gate bottom contact type organic thin-film transistor as one embodiment of the present invention. This organic thin-film transistor 10 has substrate 1, a gate electrode 2 provided to be bonded to the main surface of the substrate 1, a gate insulation layer 3 provided on the substrate 1 so as to cover the gate insulation layer 2, a source electrode 5 and a drain electrode 6 that are bonded to the gate insulation layer 3 and separated from each other so that the channel region overlaps with the gate electrode 2 when viewed in the thickness direction of the substrate 1 (in plan view), an organic semiconductor layer 4 bonded to the source electrode 5 and the drain electrode 6 and adjacent to the gate insulation layer 3 and provided so as to cover directly above the gate electrode 2, and a protective layer 7 provided so as to cover the organic semiconductor layer 4.

In the bottom gate bottom contact type organic thin-film transistor, a gate insulation layer different from the gate insulation layer 3 may be further disposed between the gate insulation layer 3 and the gate electrode.
(Bottom Gate Top Contact Type Organic Thin-Film Transistor)

FIG. 2 is a schematic cross-sectional view showing the structure of a bottom gate top contact type organic thin-film transistor as one embodiment of the present invention. This organic thin-film transistor 10 has a substrate 1, a gate electrode 2 provided so as to be bonded to the main surface of the substrate 1, a gate insulation layer 3 provided on the substrate 1 so as to cover the gate electrode 2, an organic semiconductor layer 4 adjacent to the gate insulation layer 3 and provided so as to cover directly above the gate electrode 2, a source electrode 5 and a drain electrode 6 that are bonded to the organic semiconductor layer 4 and separated from each other so that the channel region overlaps with the gate electrode 2 when viewed in the thickness direction of the substrate 1 (in plan view), and a protective layer 7 provided so as to cover the organic semiconductor layer 4.

In the bottom gate top contact type organic thin-film transistor, a gate insulation layer different from the gate insulation layer 3 may be further disposed between the gate insulation layer 3 and the gate electrode 2.
(Top Gate Bottom Contact Type Organic Thin-Film Transistor)

FIG. 3 is a schematic cross-sectional view showing the structure of a top gate bottom contact type organic thin-film transistor as one embodiment of the present invention. This organic thin-film transistor 10 has a substrate 1, a source electrode 5 and a drain electrode 6 that are bonded to the substrate 1 and separated from each other so that the channel region overlaps with the gate electrode 2 when viewed in the thickness direction of the substrate 1 (in plan view), an organic semiconductor layer 4 bonded to the source electrode 5, the drain electrode 6 and the substrate and provided so as to cover directly below the gate electrode 2, a gate insulation layer 3 adjacent to the organic semiconductor layer 4, a gate electrode 2 provided to be bonded to the gate insulation layer 3, and a protective layer 7 provided so as to cover the gate electrode 2.

In the top gate bottom contact type organic thin-film transistor, a gate insulation layer different from the gate insulation layer 3 may be further disposed between the gate insulation layer 3 and the gate electrode.
(Top Gate Top Contact Type Organic Thin-Film Transistor)

FIG. 4 is a schematic cross-sectional view showing the structure of a top gate top contact type organic thin-film transistor as one embodiment of the present invention. This organic thin-film transistor 10 has a substrate 1, an organic semiconductor layer 4 provided so as to be bonded to the main surface of the substrate 1, a source electrode 5 and a drain electrode 6 that are bonded to the organic semiconductor layer 4 and separated from each other so that the channel region overlaps with the gate electrode 2 when viewed in the thickness direction of the substrate (in plan view), a gate insulation layer 3 bonded to the source electrode 5, the drain electrode 6 and the organic semiconductor layer 4 and provided so as to cover directly below the gate electrode 2, a gate electrode 2 provided so as to be bonded to the gate insulation layer 3, and a protective layer 7 so as to cover the gate electrode 2.

In the top gate top contact type organic thin-film transistor, a gate insulation layer different from the gate insulation layer 3 may be further disposed between the gate insulation layer 3 and the gate electrode.

<Production Method of Organic Thin-Film Transistor>

The organic thin-film transistor can be produced by know methods, for example, a method described in Japanese Unexamined Patent Application Publication (JP-A) No. hei-5-110069.
(Production Method of Gate Electrode, Source Electrode and Drain Electrode)

The gate electrode, the source electrode and the drain electrode can be formed by methods such as a vapor-deposition method, a sputtering method, a printing method, an inkjet method and the like.
(Production Method of Organic Semiconductor Layer)

The organic semiconductor layer can be formed by coating an ink containing an organic semiconductor compound and an organic solvent by a spin coat method, a die coater method, a screen printing method, an inkjet method and the like and drying the coated layer.

The organic solvent is not particularly restricted as long as it dissolves an organic semiconductor compound, and those having a boiling point of 50° C. to 200° C. at normal pressure are preferable. The organic solvent includes chloroform, toluene, anisole, xylene, mesitylene, tetralin, cyclohexylbenzene and the like.
(Production Method of Gate Insulation Layer)

The gate insulation layer can be produced by using an ink containing the above-described polymer compound A and an organic solvent.

The production method of the gate insulation layer may be a production method including a step of mixing the above-described polymer compound A and an organic solvent to obtain an ink, a step of coating the ink, to form a coated layer, and a step of drying the coated layer, may be a production method including a step of mixing the above-described polymer compound A and an organic solvent to obtain an ink, a step of coating the ink, to form a coated layer, and a step of hardening the coated layer, and may also be a production method including a step of mixing the above-described polymer compound A and an organic solvent to obtain an ink, a step of coating the ink, to form a coated layer, a step of drying the coated layer, and a step of hardening the dried coated layer.

The subject material on which an ink containing the polymer compound A and an organic solvent is coated can be selected appropriately depending on the structure of the target organic thin-film transistor.

In the case of an organic thin-film transistor having a bottom gate type structure, an ink can be coated on a substrate, and in the case of an organic thin-film transistor having a top gate type structure, an ink can be coated on an organic semiconductor layer.

The ink may contain additives and the like usually used in cross-linking the polymer compound A.

The ink may contain two or more kinds of the above-described polymer compound A. The ink may contain a polymer compound different from the above-described polymer compound A.

The organic solvent is not particularly restricted as long as it dissolves the material constituting the gate insulation layer, and includes ether solvents such as tetrahydrofuran, diethyl ether and the like, aliphatic hydrocarbon solvents such as hexane and the like, alicyclic hydrocarbon solvents such as cyclohexane and the like, unsaturated hydrocarbon solvents such as pentene and the like, aromatic hydrocarbon solvents such as xylene and the like, ketone solvents such as cyclopentanone, 2-heptanone, acetone and the like, acetate solvents such as propylene glycol monomethyl ether acetate, butyl acetate and the like, alcohol solvents such as 2-ethoxyethanol and the like, halide solvents such as chloroform and the like, and mixed solvents thereof. Organic solvents having a boiling point of 100° C. to 200° C. at normal pressure are preferable from the standpoint of easy formation of a uniform coated film, and specific examples thereof include 2-heptanone, propylene glycol monomethyl ether acetate, cyclopentanone, 2-ethoxyethanol and the like. Ketone solvents such as cyclopentanone, 2-heptanone, acetone and the like, acetate solvents such as propylene glycol monomethyl ether acetate, butyl acetate and the like, and alcohol solvents such as 2-ethoxyethanol and the like are preferable, from the standpoint of scarce dissolution of other layers in lamination.

The additives include a catalyst for promoting the cross-linking reaction, a levelling agent, a viscosity modifier, a surfactant and the like.

The content of the polymer compound A is preferably 1% by mass or more and 90% by mass or less, more preferably 5% by mass or more and 70% by mass or less, further preferably 5% by mass or more and 60% by mass or less, with respect to the whole ink. It is particularly preferable that the content is 10% by mass or more and 40% by mass or less.

When an ink is used for fabrication of a hardened film described later, the content of an organic solvent contained in the ink is preferably 30% by mass to 95% by mass with the total mass of the ink being 100% by mass.

The total mass of compounds containing two or more amino groups contained in the ink can be the same as the mass ratio of compounds containing two or more amino groups to the polymer compound A described in the explanation of the composition described above.

The coating method includes a spin coat method, a die coater method, a screen printing method, an inkjet method and the like. The ink may contain a levelling agent, a surfactant, a hardening catalyst and the like, if necessary.

The drying method includes methods of heating with a hot plate, an oven, an infrared heater and the like. The heating conditions may be appropriately selected depending on the kind of the solvent, the content thereof and the like, and heating at 50° C. to 220° C. for 1 minute to 180 minutes is preferable.

The hardening method includes methods of heating with a hot plate, an oven, an infrared heater and the like. The heating conditions may be appropriately selected depending on the kind of the resin component in the resin composition, the content thereof and the like, and heating at 100° C. to 220° C. for 20 minutes to 180 minutes is preferable, and heating at 160° C. to 200° C. for 30 minutes to 120 minutes is more preferable.

(Production Method of Protective Layer)

The production method of the protective layer may be a production method including a step of mixing a compound which can constitute the protective layer with an organic solvent to obtain an ink, a step of coating the ink, to form a coated layer, and a step of drying the coated layer, or may be a production method including a step of mixing a compound which can constitute the protective layer with an organic solvent to obtain a coating solution, a step of coating the ink, to form a coated layer, and a step of hardening the coated layer, and may also be a production method including a step of mixing a compound which can constitute the protective layer with an organic solvent to obtain a coating solution, a step of coating the ink, to form a coated layer, a step of drying the coater layer, and a step of hardening the dried coated layer.

The coating method, the drying method and the hardening method as the same as those explained in the production method of the gate insulation layer.

The organic solvent is the same as the organic solvent explained in the production method of the gate insulation layer.

(Production Method of Bottom Gate Bottom Contact Type Thin-Film Transistor)

The bottom gate bottom contact type organic thin-film transistor as one embodiment of the present invention can be produced, for example, by methods including the following steps (I) to (V).

(I) a step of forming a gate electrode on the main surface of a substrate, (II) a step of forming a gate insulation layer on the surface of the substrate on which the gate electrode has been provided, so as to cover the gate electrode, (III) a step of forming a source electrode and a drain electrode on the gate insulation layer, (IV) a step of forming an organic semiconductor layer so as to straggle the source electrode and the drain electrode and to cover the gate insulation layer containing the drain electrode and the channel region, and (V) a step of forming a protective layer so as to cover the organic semiconductor layer.

(Production Method of Bottom Gate Top Contact Type Organic Thin-Film Transistor)

The bottom gate top contact type organic thin-film transistor as one embodiment of the present invention can be produced, for example, by methods including the following steps (I) to (V).

(I) a step of forming a gate electrode on the main surface of a substrate, (II) a step of forming a gate insulation layer on the surface of the substrate on which the gate electrode has been provided, so as to cover the gate electrode, (III) a step of forming an organic semiconductor layer on the gate insulation layer, (IV) a step of forming a source electrode and a drain electrode on the organic semiconductor layer, and (V) a step of forming a protective layer so as to cover the organic semiconductor layer.

(Production Method of Top Gate Bottom Contact Type Organic Thin-Film Transistor)

The top gate bottom contact type organic thin-film transistor as one embodiment of the present invention can be produced, for example, by methods including the following steps (I) to (V).

(I) a step of forming a source electrode and a drain electrode on a substrate, (II) a step of forming an organic semiconductor layer on the substrate so as to straddle the source electrode and the drain electrode, (III) a step of forming a gate insulation layer on the organic semiconductor layer, (IV) a step of forming a gate electrode on the gate insulation layer, and (V) a step of forming a protective layer so as to cover the gate electrode and the organic semiconductor layer.

(Production Method of Top Gate Top Contact Type Organic Thin-Film Transistor)

The top gate top contact type organic thin-film transistor as one embodiment of the present invention can be produced, for example, by methods including the following steps (I) to (V).

(I) a step of forming an organic semiconductor layer on a substrate, (II) a step of forming a source electrode and a drain electrode so as to straddle the organic semiconductor layer, (III) a step of forming a gate insulation layer on the organic semiconductor layer, (IV) a step of forming a gate electrode on the gate insulation layer, and (V) a step of forming a protective layer so as to cover the gate electrode and the gate insulation layer.

<Application of Organic Thin-Film Transistor>

A display member containing an organic thin-film transistor can be produced using the organic thin-film transistor of the embodiment of the present invention. Further, a display equipped with a display member can be produced using the display member containing the organic thin-film transistor.

The organic thin-film transistor of the embodiment of the present invention can be used for an OFET sensor.

The OFET sensor is a sensor using an organic thin-film transistor as a signal conversion device that converts an input signal to an electrical signal and outputs it (organic field-effect transistor: OFET) in which a sensitive function or a selective function is imparted into the structure of any of an electrode, an insulation layer and an organic semiconductor. The OFET sensor includes, for example, a bio sensor, a gas sensor, an ion sensor and a humidity sensor.

For example, a bio sensor has an organic thin-film transistor having the constitution as described above.

The organic thin-film transistor has a probe (sensitive region) that interacts specifically with the subject substance in a channel region and/or a gate insulation layer. When the concentration of the subject substance changes, the electric property of the probe changes, thus, it can function as a bio sensor.

As the method for detecting the subject substance in a test sample, there are, for example, methods in which biomolecules such as nucleic acids, proteins and the like, or artificially synthesized functional groups are fixed on the surface of a solid phase carrier, and these are used as a probe.

In this method, the subject substance is captured with a probe of a solid phase carrier by utilizing specific affinity between substances or functional groups such as an interaction of nucleic acid chains having complementary sequences, an antigen-antibody reaction, an enzyme-substrate reaction, a receptor-ligand interaction and the like. Accordingly, a substance of a functional group having specific affinity to the subject substance is selected as the probe.

A probe is fixed to the surface of a solid phase carrier by a method corresponding to the kind of the selected probe and the kind of the solid phase carrier. Further, it is also possible to synthesize a probe on the surface of the solid phase carrier (for example, a probe is synthesized by a nucleic acid elongation reaction). In any case, a probe-subject substance complex is formed by contacting the probe fixed to the surface of the solid phase carrier with a test sample and treating them under suitable conditions. A channel region and/or a gate insulation layer itself of the organic thin-film transistor may function as a probe.

The gas sensor has an organic thin-film transistor having the constitution as described above. In the organic thin-film transistor of this case, a channel region and/or a gate insulation layer functions as a gas sensitive part. When a gas to be detected contacts a gas sensitive part, electric characteristics (electric conductivity, dielectric constant and the like) of the gas sensitive part vary, thus, it can function as a gas sensor.

The gas to be detected includes, for example, an electron-accepting gas and an electron-donating gas. The electron-accepting gas includes, for example, halogen gases such as $F_2$, $Cl_2$ and the like, nitrogen oxide gases, sulfur oxide gases and gases of organic acids such as acetic acid and the like. The electron-donating gas includes, for example, an ammonia gas, gases of amines such as aniline and the like, a carbon monoxide gas and a hydrogen gas.

The organic thin-film transistor of the embodiment of the present invention can also be used for production of a pressure sensor. The pressure sensor has an organic thin-film transistor having the constitution as described above. In this case, a channel region and/or a gate insulation layer functions as a pressure sensitive part in the organic thin-film transistor. When pressure is applied to the pressure sensitive part, electric characteristics of the pressure sensitive part vary, thus, it can function as a pressure sensitive sensor.

When a channel region functions as a pressure sensitive part, an organic thin-film transistor may further have an orientation layer for further enhancing the crystallinity of an organic semiconductor contained in the channel region. The orientation layer includes, for example, a monomolecular layer which is provided so as to be bonded to a gate insulation layer using a silane coupling agent such as hexamethyldisilazane and the like.

Further, the organic thin-film transistor of the embodiment of the present invention can also be used for production of a conductivity modulation type sensor. The conductivity modulation type sensor uses a conductivity measuring device as a signal conversion device for converting an input signal into an electric signal and outputting the electric signal, in which a sensitive function of a selective function for the input of detection target is impacted to a film containing the composition containing the polymer compound A or to the above-described film. The conductivity modulation type sensor detects the input of the detection target as a change in conductivity of the composition containing the polymer compound A. The conductivity modulation type sensor includes, for example, a bio sensor, a gas sensor, an ion sensor and a humidity sensor.

Further, the organic thin-film transistor of the embodiment of the present invention can also be used for production of an amplifying circuit containing an organic thin-film transistor for amplifying the output signals from various sensors such as a bio sensor, a gas sensor, an ion sensor, a humidity sensor, a pressure sensor and the like.

Further, the organic thin-film transistor of the embodiment of the present invention can also be used for production of a sensor array having a plurality of integrated sensors such as a bio sensor, a gas sensor, an ion sensor, a humidity sensor, a pressure sensor and the like.

Further, the organic thin-film transistor of the embodiment of the present invention can also be used for production of a sensor array having a plurality of integrated sensors such as a bio sensor, a gas sensor, an ion sensor, a humidity sensor, a pressure sensor and the like and equipped with an amplifier circuit containing an organic thin-film transistor for individually amplifying the output signal from each of the sensors.

(Polymer Compound A')

The embodiment of the present invention can also be a polymer compound containing a repeating unit represented by the formula (1), at least one repeating unit selected from the group consisting of a repeating unit represented by the formula (2) and a repeating unit represented by the formula (3); and a repeating unit represented by the formula (6), all of which are repeating units that can be contained in the above-described polymer compound A, in which the content of the repeating unit represented by the formula (1) is 60% by mol or more with the total content of all repeating units contained in the above-described polymer compound being 100% by mol (In the present specification, described as polymer compound A' in some cases).

The polymer compound having a repeating unit represented by the formula (1), at least one repeating unit selected from the group consisting of a repeating unit represented by the formula (2) and a repeating unit represented by the formula (3); and a repeating unit represented by the formula (6) in which the content of the repeating unit represented by the formula (1) is 60% by mol or more with the total content of all repeating units contained in the above-described polymer compound being 100% by mol (polymer compound A') will be described below.

The descript of the polymer compound A' is the same as the description regarding the above-described polymer compound A, except that at least one repeating unit selected from the group consisting of a repeating unit represented by the formula (2) and a repeating unit represented by the formula (3); and a repeating unit represented by the formula (6) are essential components, and the content of the repeating unit represented by the formula (1) is 60% by mol or more with the total content of all repeating units contained in the polymer compound being 100% by mol.

The preferable embodiments of the repeating unit represented by the formula (2), the repeating unit represented by the formula (3) and the repeating unit represented by the formula (6) are also the same as described above.

The production method of the polymer compound A' can be carried out by the same manner as the production method of the polymer compound A, except that monomers as raw materials of at least one repeating unit selected from the group consisting of a repeating unit represented by the formula (2) and a repeating unit represented by the formula (3); and a repeating unit represented by the formula (6) are selected from the monomers as raw materials of the above-described repeating unit having a crosslinkable group, and the use amounts of raw material monomers are controlled so that the content of the repeating unit represented by the formula (1) is 60% by mol or more in the resulting polymer compound A'.

For example, it can be produced by a method of polymerizing a monomer (polymerizable monomer) as a raw material of a repeating unit represented by the formula (1) with monomers (polymerizable monomers) as raw materials of the repeating units having a crosslinkable group (at least one repeating unit selected from the group consisting of a repeating unit represented by the formula (2) and a repeating unit represented by the formula (3); and a repeating unit represented by the formula (6)).

[Monomer as Raw Material of Repeating Unit Represented by the Formula (1)]

The monomers as raw materials of a repeating unit represented by the formula (1) contained in the polymer compound A' are as described above.

The content of a repeating unit represented by the above-described (1) in the polymer compound A' is preferably 60% by mol or more and 99% by mol or less, more preferably 71% by mol or more and 99% by mol or less, further preferably 75% by mol or more and 98% by mol or less, particularly preferably 80% by mol or more and 95% by mol or less, most preferably 85% by mol or more and 95% by mol or less, from the standpoint of improvability of mobility of the organic thin-film transistor, with the total content of all repeating units contained in the polymer compound A' being 100% by mol.

The content of the above-described repeating unit contained in the polymer compound A' is determined from the use amount of a raw material monomer corresponding to each repeating unit used in producing the polymer compound A'.

[Monomer as Raw Material of Repeating Unit Having Crosslinkable Group]

The monomers as raw materials of the repeating units having a crosslinkable group (at least one repeating unit selected from the group consisting of a repeating unit represented by the formula (2) and a repeating unit represented by the formula (3); and a repeating unit represented by the formula (6)) contained in the polymer compound A' can be, for example, monomers having, as a crosslinkable group, the structure of the side chain of a repeating unit represented by the formula (2), a repeating unit represented by the formula (3) or a repeating unit represented by the formula (6).

The monomer as a raw material of a repeating unit represented by the formula (2) or a repeating unit represented by the formula (3) includes for example, those obtained by blocking 2-isocyanate ethyl methacrylate, 2-isocyanate ethyl acrylate, 4-isocyanate butyl methacrylate, 4-isocyanate butyl acrylate and the like with an oxime compound or a pyrazole compound.

Examples of the oxime compound include formaldoxime, acetaldoxime, acetoxime, methylethylketoxime, cyclohexanoneoxime and the like.

Examples of the pyrazole compound include 3,5-dimethylpyrazole, 3,5-diethylpyrazole and the like.

Specifically, 2-[(3,5-dimethylpyrazolyl)carboxyamino] ethyl methacrylate (Karenz MOI-BP, manufactured by Showa Denko K.K.); 2-(0-[1'-methylpropylideneamino]carboxyamino)ethyl methacrylate (Karenz MOI-BM, manufactured by Showa Denko K.K.), 2-acryloyloxyethyl isothiocyanate, 2-methacryloyloxyethyl isothiocyanate, 2-(2'-methacryloyloxyethyl)oxyethyl isothiocyanate and the like.

The monomer as a raw material of a repeating unit represented by the formula (6) includes 4-vinylbenzoic acid, 3-vinylbenzoic acid, 2-vinylbenzoic acid and the following compounds and the like.

[Chemical Formula 56]

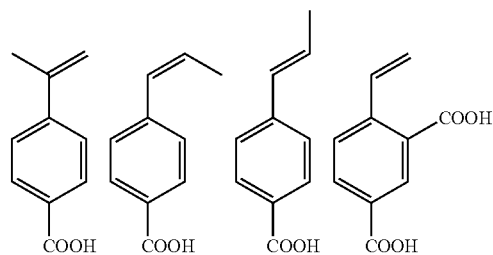

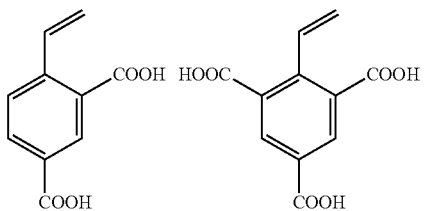

The content of at least one repeating unit selected from the group consisting of a repeating unit represented by the formula (2) and a repeating unit represented by the formula (3) contained in the polymer compound A' is preferably 0.1% by mol or more and 29% by mol or less, more preferably 1% by mol or more and 20% by mol or less, further preferably 1% by mol or more and 15% by mol or less, further preferably 1% by mol or more and 8% by mol or less, with the total content of all repeating units contained in the polymer compound A' being 100% by mol, from the standpoint of enhancing the carrier mobility of the organic thin-film transistor.

The content of a repeating unit represented by the formula (6) contained in the polymer compound A' is preferably 0.1% by mol or more and 29% by mol or less, more preferably 1% by mol or more and 20% by mol or less, further preferably 1% by mol or more and 15% by mol or less, particularly preferably 1% by mol or more and 8% by mol or less, with the total content of all repeating units contained in the polymer compound A' being 100% by mol, from the standpoint of enhancing the carrier mobility of the organic thin-film transistor.

The content of the above-described repeating unit contained in the polymer compound A' is determined from the use amount of a raw material monomer corresponding to each repeating unit used in producing the polymer compound A'.

The polymer compound A' includes, for example, the following compounds.

[Chemical Formula 57]

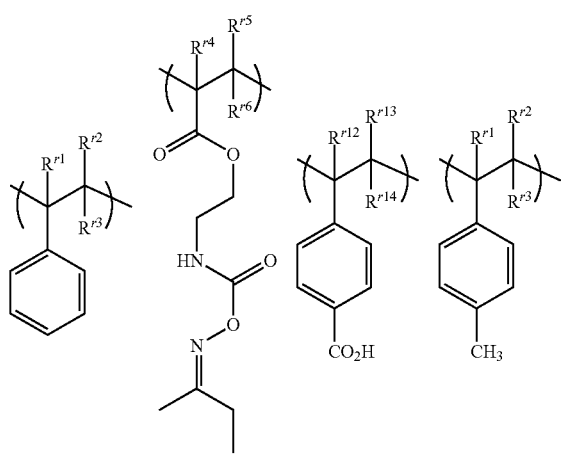

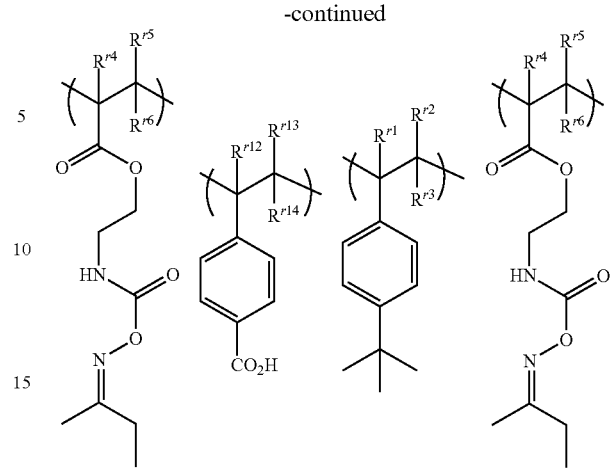

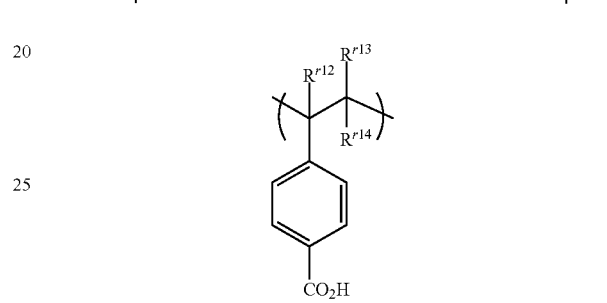

[Chemical Formula 58]

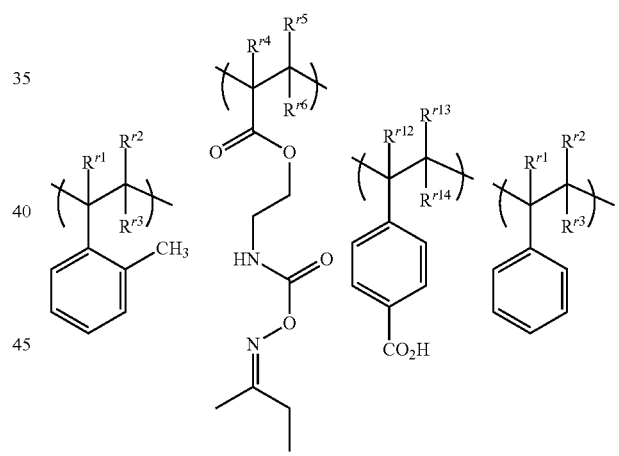

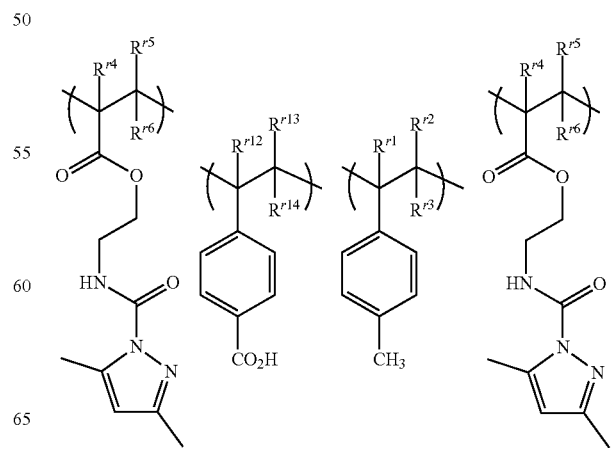

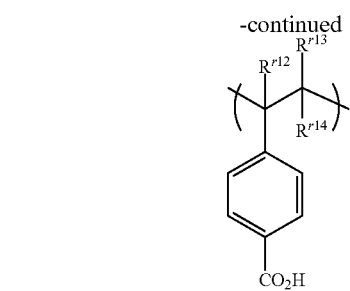
[Chemical Formula 59]
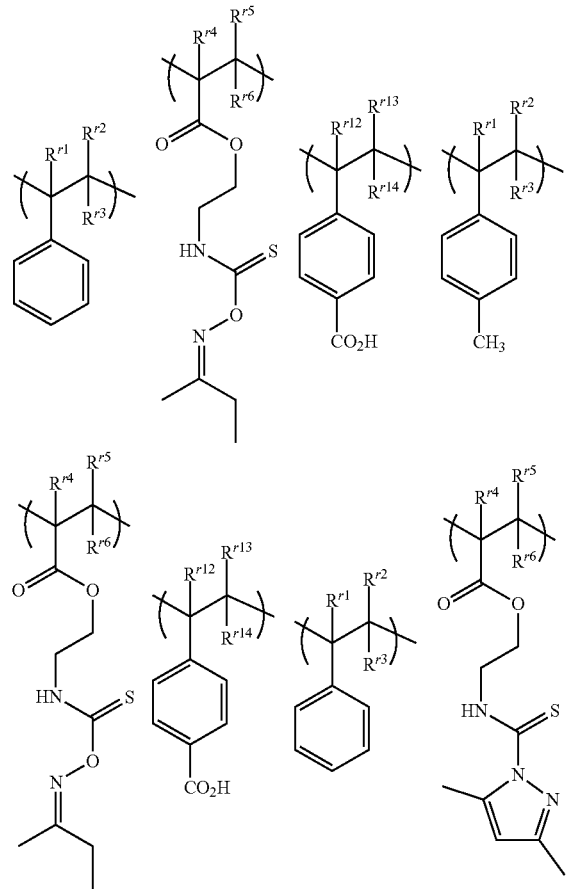
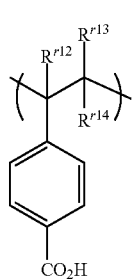
[Chemical Formula 60]
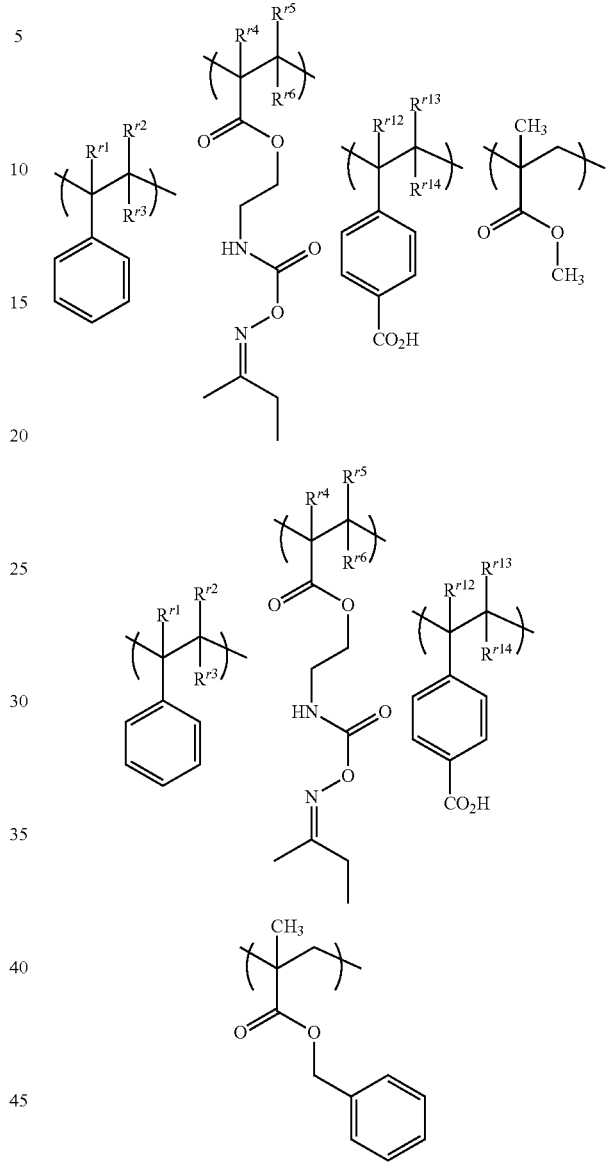
[Chemical Formula 61]
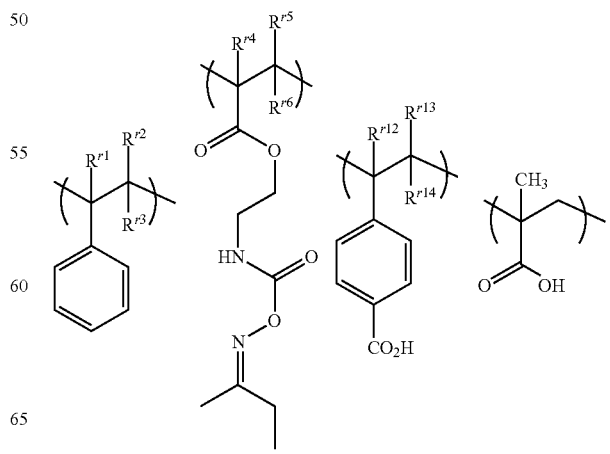

[Chemical Formula 62]
-continued

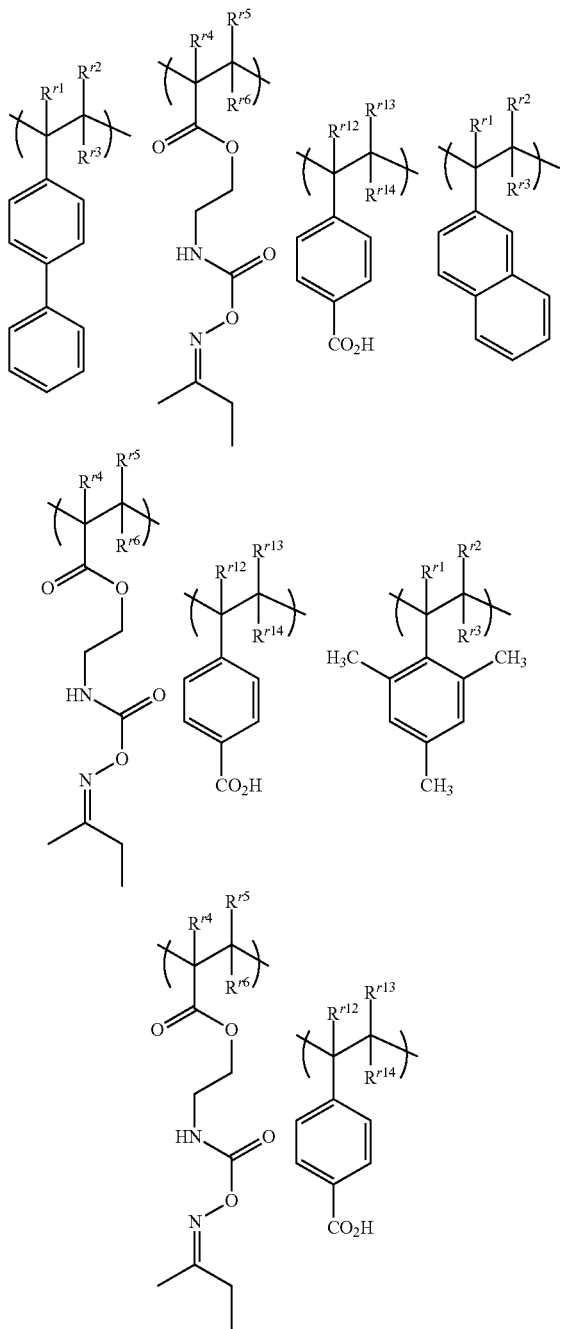

$R^{r1}$ to $R^{r14}$ each independently represent a hydrogen atom or a methyl group.

The embodiment of the present invention may be a composition containing the polymer compound A'.

The composition containing the polymer compound A' may contain, as other components, polymer compounds other than the compounds having two or more amino groups, the compounds having two or more hydroxy groups and the above-described polymer compound A'.

The composition containing the polymer compound A' is preferably a composition in which the total mass of the polymer compound A' is 80% by mass or more with respect to the whole composition and the total mass of compounds having two or more amino groups is 4.5% by mass or less with respect to the above-described polymer compound A'.

The preferable embodiment of the composition in which the total mass of the polymer compound A' is 80% by mass or more with respect to the whole composition and the total mass of compounds containing two or more amino groups is 4.5% by mass or less with respect to the above-described polymer compound A' is the same as the preferable embodiment of the composition in which the total mass of the polymer compound A is 80% by mass or more with respect to the whole composition and the total mass of compounds containing two or more amino groups is 4.5% by mass or less with respect to the above-described polymer compound A previously described, except that the polymer compound A is substituted with the polymer compound A'.

The embodiment of the present invention may be the polymer compound A' or the hardened product thereof, or a composition containing the polymer compound A' or the hardened product thereof, and may be a layer composed of the hardened product thereof.

The polymer compound A' or the hardened product thereof, or a composition containing the polymer compound A' or the hardened product thereof, and the layer composed the hardened product thereof are preferably the same as the polymer compound A or the hardened product thereof, or a composition containing the polymer compound A or the hardened product thereof, and the layer composed the hardened product thereof previously described, except that the polymer compound A is substituted with the polymer compound A'.

The embodiment of the present invention may be an ink containing the polymer compound A' and an organic solvent.

The ink containing the polymer compound A' and an organic solvent is preferably the same as the ink containing the polymer compound A and an organic solvent, except that the polymer compound A is substituted with the polymer compound A'.

The layer composed of the polymer compound A' or the hardened product thereof, or a composition containing the polymer compound A' or the hardened product thereof can be produced by the same method as the production method of a gate insulation layer, except that an ink containing the polymer compound A' and an organic solvent is used instead of an ink containing the polymer compound A and an organic solvent.

The layer composed of the polymer compound A' or the hardened product thereof, or a composition containing the polymer compound A' or the hardened product thereof can be a gate insulation layer of an organic thin-film transistor, like the polymer compound A or the hardened product thereof, or a composition containing the polymer compound A or the hardened product thereof previously described, except that the polymer compound A is substituted with the polymer compound A'.

An organic thin-film transistor equipped with the above-described gate insulation layer has high carrier mobility.

The layer composed of the polymer compound A' or the hardened product thereof, or a composition containing the polymer compound A' or the hardened product thereof can be used not only for an organic thin-film transistor but also for various electronic devices such as organic LED, sensors and the like, since the polymer compound A' can be hardened at low temperatures. The layer composed of the above-described hardened product is preferably used for organic thin-film transistors, and more preferably used as a gate insulation layer. Since the layer composed of the above-described hardened product is excellent in insulation, sealing, adhesion and solvent resistance, it is preferable not only as a gate insulation layer of an organic thin-film transistor but also as a protective layer for an over coat layer, an under coat layer and the like.

EXAMPLES

The present invention will be illustrated further in detail by examples below. The present invention is not limited to examples described below.

(Analysis of Molecular Weight)

The number-average molecular weight and the weight-average molecular weight of polymer compound C described later were determined by using gel permeation chromatography (GPC, manufactured by Waters, trade name: Alliance GPC 2000). The polymer compound C to be measured was dissolved in orthodichlorobenzene, and the solution was injected into GPC. As a mobile phase of GPC, orthodichlorobenzene was used. As a column, "TSKgel GMHHR-H(S)HT (two columns connected, manufactured by Tosoh Corp.)" was used. As a detector, an UV detector was used.

The number-average molecular weight and the weight-average molecular weight of polymer compounds 1 to 23 were determined by using gel permeation chromatography (GPC, manufactured by Tosoh Corp.). As a mobile phase of GPC, THF was used. As a column, "PLgel 10 μm MIXED-B (one column, manufactured by Agilent Technologies)" was used. As a detector, an UV detector was used.

Synthesis Example 1 (Synthesis of Polymer Compound C)

Polymer compound C was synthesized according to the following scheme.

A gas in a reaction vessel was purged with a nitrogen gas, then, a compound B-1 represented by the following formula B-1 (286.8 mg, 0.200 mmol), a compound B-2 represented by the following formula B-2 (77.6 mg, 0.200 mmol), 19 mL of tetrahydrofuran, 7.3 mg of tris(dibenzylideneacetone)dipalladium and 9.3 mg of tri-tert-butylphosphonium tetrafluoroborate were added, and stirred. Into the resultant reaction solution, 1.0 mL of a 3 mol/L potassium phosphate aqueous solution was dropped, and refluxed for 3 hours. To the resultant reaction solution, 24.4 mg of phenylboronic acid was added, and refluxed for 1 hour. To the resultant reaction solution, 0.1 g of sodium N,N-diethyldithiocarbamate tri-hydrate was added, and refluxed for 3 hours. The resultant reaction solution was poured into water, toluene was added, and the toluene layer was extracted. The resultant toluene solution was washed with an acetic acid aqueous solution and water, then, purified by using a silica gel column. The resultant toluene solution was dropped into acetone, to generate a precipitate. The resultant precipitate was washed with a Soxhlet extractor using acetone as a solvent, to obtain polymer compound C containing a repeating unit represented by the following formula. The amount of the polymer compound C obtained was 244 mg, and the polystyrene-equivalent number-average molecular weight was $3.1 \times 10^4$ and the polystyrene-equivalent weight-average molecular weight was $6.5 \times 10^4$.

[Chemical Formula 63]

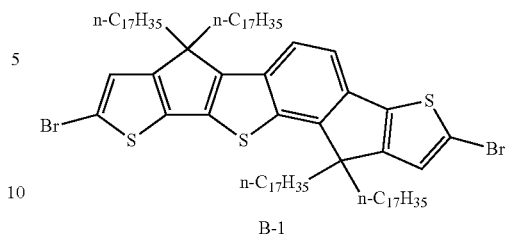

B-1

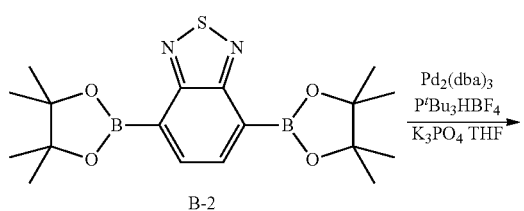

B-2

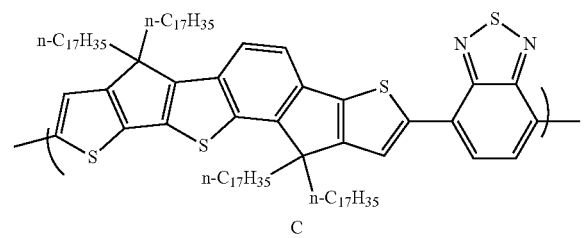

C

Synthesis Example 2-1

Four point one five grams (4.15 g, 43.35 mmol) of styrene (manufactured by Junsei Chemical Co., Ltd.), 0.63 g (3.83 mmol) of 2-[O-[1'-methylpropylideneamino]carboxyamino]ethyl methacrylate (manufactured by Showa Denko K.K., trade name "Karenz MOI-BM"), 0.77 g (3.83 mmol) of 4-vinylbenzoic acid (manufactured by Tosoh Corp.), 0.068 g of 2,2'-azobis(2-methylpropionitrile) and 9.11 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 19 hours in a 70° C. oil bath, to obtain a viscous PGMEA solution containing a dissolved polymer compound (2-1) having repeating units and the composition represented by the following formula. The resultant polymer compound (2-1) had a polystyrene-equivalent number-average molecular weight of $2.2 \times 10^4$ and a polystyrene-equivalent weight-average molecular weight of $4.7 \times 10^4$.

The charging ratio of styrene unit:2-[O-[1'-methylpropylideneamino]carboxyamino]ethyl methacrylate unit:4-vinylbenzoic acid unit in the polymer was 85% by mol:7.5% by mol:7.5% by mol.

polymer compound (2-1)

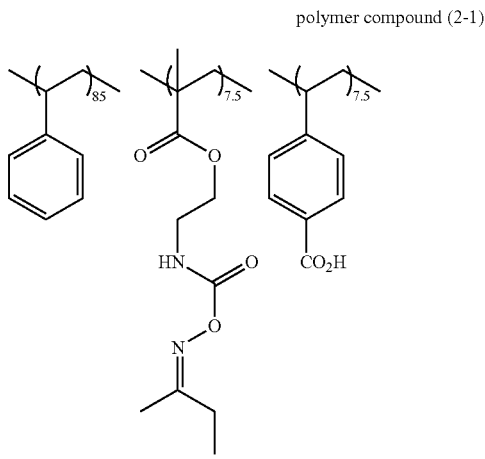

Synthesis Example 2-2

One hundred forty nine point eight grams (149.8 g, 1438 mmol) of styrene (manufactured by Junsei Chemical Co., Ltd.), 43.6 g (179.8 mmol) of 2-[0-[1'-methylpropylideneamino]carboxyamino]ethyl methacrylate (manufactured by Showa Denko K.K., trade name "Karenz MOI-BM"), 26.6 g (179.8 mmol) of 4-vinylbenzoic acid (manufactured by Tosoh Corp.), 1.48 g of 2,2'-azobis(2-methylpropionitrile) and 218.5 g of propylene glycol monomethyl ether acetate (PGMEA) (manufactured by Tokyo Chemical Industry Co., Ltd.) were charged in a 500 mL separable flask, purged with a nitrogen gas, then, polymerized for 22 hours in a 70° C. oil bath, to obtain a viscous PGMEA solution containing a dissolved polymer compound (2-2) having repeating units and the composition represented by the following formula. The resultant polymer compound (2-2) had a polystyrene-equivalent number-average molecular weight of $4.2 \times 10^4$ and a polystyrene-equivalent weight-average molecular weight of $9.9 \times 10^4$.

The charging ratio of styrene unit:2-[O-[1'-methylpropylideneamino]carboxyamino]ethyl methacrylate unit:4-vinylbenzoic acid unit in the polymer was 80% by mol:10% by mol:10% by mol.

polymer compound (2-2)

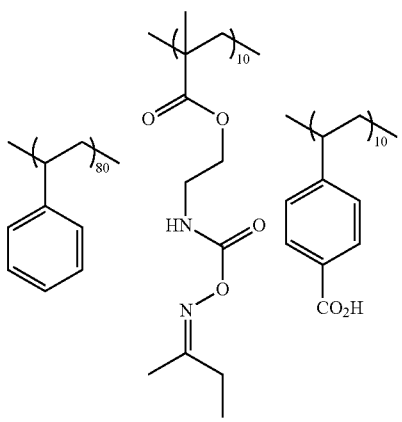

Synthesis Example 2-3

Four point six two one grams (4.621 g, 39.1 mmol) of 4-methylstyrene (manufactured by Tokyo Chemical Industry Co., Ltd.), 0.836 g (3.45 mmol) of 2-[0-[1'-methylpropylideneamino]carboxyamino]ethyl methacrylate (manufactured by Showa Denko K.K., trade name "Karenz MOI-BM"), 0.511 g (3.45 mmol) of 4-vinylbenzoic acid (manufactured by Tosoh Corp.), 0.060 g of 2,2'-azobis(2-methylpropionitrile) and 9.04 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-3) having repeating units and the composition represented by the following formula. The resultant polymer compound (2-3) had a polystyrene-equivalent number-average molecular weight of $2.6 \times 10^4$ and a polystyrene-equivalent weight-average molecular weight of $5.3 \times 10^4$.

The charging ratio of 4-methylstyrene unit:2-[O-[1'-methylpropylideneamino]carboxyamino]ethyl methacrylate unit: 4-vinylbenzoic acid unit in the polymer was 85% by mol: 7.5% by mol:7.5% by mol.

polymer compound (2-3)

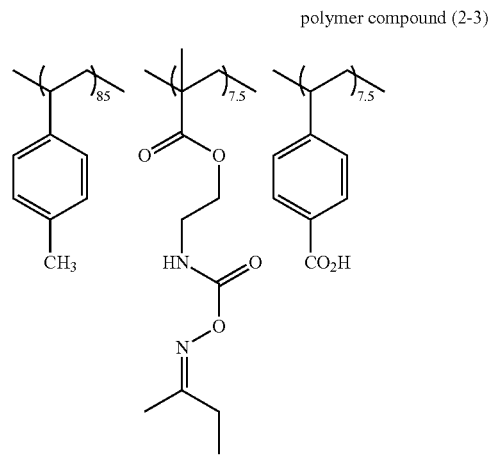

Synthesis Example 2-4

Four point nine zero four grams (4.904 g, 30.6 mmol) of 4-tert-butylstyrene (manufactured by Tokyo Chemical Industry Co., Ltd.), 0.654 g (2.70 mmol) of 2-[O-[1'-methylpropylideneamino]carboxyamino]ethyl methacrylate (manufactured by Showa Denko K.K., trade name "Karenz MOI-BM"), 0.400 g (2.70 mmol) of 4-vinylbenzoic acid (manufactured by Tosoh Corp.), 0.047 g of 2,2'-azobis(2-methylpropionitrile) and 9.01 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-4) having repeating units and the composition represented by the following formula. The resultant polymer compound (2-4) had a polystyrene-equivalent number-average molecular weight of $4.0 \times 10^4$ and a polystyrene-equivalent weight-average molecular weight of $1.5 \times 10^5$.

The charging ratio of 4-tert-butylstyrene unit:2-[O-[1'-methylpropylideneamino]carboxyamino]ethyl methacrylate unit:4-vinylbenzoic acid unit in the polymer was 85% by mol:7.5% by mol:7.5% by mol.

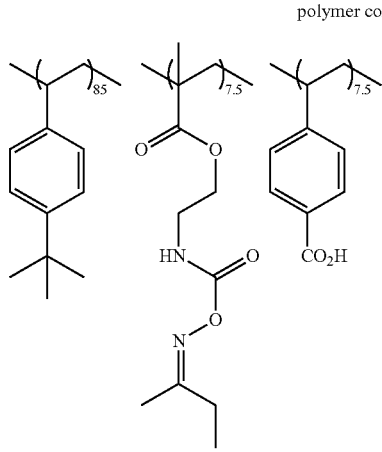

polymer compound (2-4)

Synthesis Example 2-5

Three point eight three grams (3.83 g, 21.25 mmol) of p-vinylbiphenyl (manufactured by Sigma Aldrich), 0.454 g (1.875 mmol) of 2-[O-[1'-methylpropylideneamino]carboxyamino]ethyl methacrylate (manufactured by Showa Denko K.K., trade name "Karenz MOI-BM"), 0.278 g (1.875 mmol) of 4-vinylbenzoic acid (manufactured by Tosoh Corp.), 0.033 g of 2,2'-azobis(2-methylpropionitrile) and 10.72 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-5) having repeating units and the composition represented by the following formula.

The resultant polymer compound (2-5) had a polystyrene-equivalent number-average molecular weight of $3.8 \times 10^4$ and a polystyrene-equivalent weight-average molecular weight of $8.9 \times 10^4$.

The charging ratio of p-vinylbiphenyl unit:2-[O-[1'-methylpropylideneamino]carboxyamino]ethyl methacrylate unit:4-vinylbenzoic acid unit in the polymer was 85% by mol:7.5% by mol:7.5% by mol.

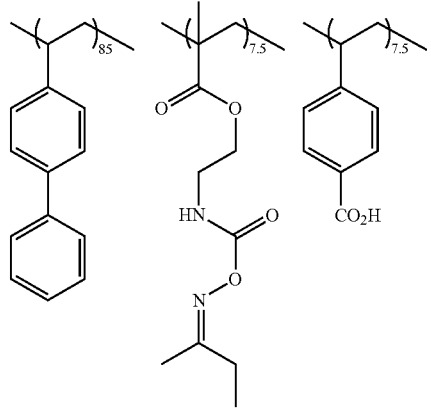

polymer compound (2-5)

Synthesis Example 2-6

Five point zero four six grams (5.046 g, 48.45 mmol) of styrene (manufactured by Junsei Chemical Co., Ltd.), 1.036 g (4.275 mmol) of 2-[O-[1'-methylpropylideneamino]carboxyamino]ethyl methacrylate (manufactured by Showa Denko K.K., trade name "Karenz MOI-BM"), 0.368 g (4.275 mmol) of methacrylic acid (manufactured by Wako Pure Chemical Industries, Ltd.), 0.075 g of 2,2'-azobis(2-methylpropionitrile) and 9.79 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 19 hours in a 70° C. oil bath, to obtain a viscous PGMEA solution containing a dissolved polymer compound (2-6) having repeating units and the composition represented by the following formula. The resultant polymer compound (2-6) had a polystyrene-equivalent number-average molecular weight of $2.1 \times 10^4$ and a polystyrene-equivalent weight-average molecular weight of $6.7 \times 10^4$.

The charging ratio of styrene unit:2-[O-[1'-methylpropylideneamino]carboxyamino]ethyl methacrylate unit:methacrylic acid unit in the polymer was 85% by mol:7.5% by mol:7.5% by mol.

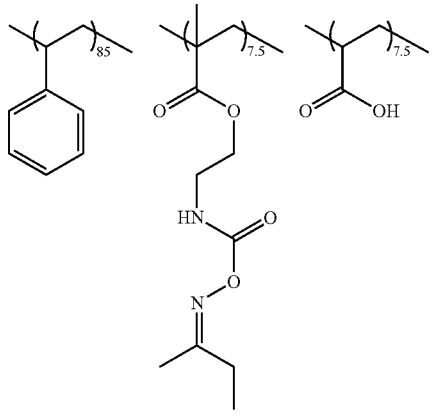

polymer compound (2-6)

Synthesis Example 2-7

Four point five one five grams (4.515 g, 43.35 mmol) of styrene (manufactured by Junsei Chemical Co., Ltd.), 0.927 g (3.825 mmol) of 2-[O-[1'-methylpropylideneamino]carboxyamino]ethyl methacrylate (manufactured by Showa Denko K.K., trade name "Karenz MOI-BM"), 0.498 g (3.825 mmol) of 2-hydroxyethyl methacrylate (manufactured by Tokyo Chemical Industry Co., Ltd.), 0.067 g of 2,2'-azobis(2-methylpropionitrile) and 9.01 g propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 19 hours in a 70° C. oil bath, to obtain a viscous PGMEA solution containing a dissolved polymer compound (2-7) having repeating units and the composition represented by the following formula. The resultant polymer compound (2-7) had a polystyrene-equivalent number-average molecular weight of $1.9 \times 10^4$ and a polystyrene-equivalent weight-average molecular weight of $4.2 \times 10^4$.

The charging ratio of styrene unit:2-[O-[1'-methylpropylideneamino]carboxyamino]ethyl methacrylate unit:2-hydroxyethyl methacrylate unit in the polymer was 85% by mol:7.5% by mol:7.5% by mol.

polymer compound (2-7)

Synthesis Example 2-8

Four point one six six grams (4.166 g, 40.0 mmol) of styrene (manufactured by Junsei Chemical Co., Ltd.), 1.211 g (5.00 mmol) of 2-[O-[1'-methylpropylideneamino]carboxyamino]ethyl methacrylate (manufactured by Showa Denko K.K., trade name "Karenz MOI-BM"), 0.651 g (5.00 mmol) of 2-hydroxyethyl methacrylate (manufactured by Tokyo Chemical Industry Co., Ltd.), 0.066 g of 2,2'-azobis(2-methylpropionitrile) and 9.14 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 19 hours in a 70° C. oil bath, to obtain a viscous PGMEA solution containing a dissolved polymer compound (2-8) having repeating units and the composition represented by the following formula. The resultant polymer compound (2-8) had a polystyrene-equivalent number-average molecular weight of $1.8 \times 10^4$ and a polystyrene-equivalent weight-average molecular weight of $3.8 \times 10^4$.

The charging ratio of styrene unit:2-[O-[1'-methylpropylideneamino]carboxyamino]ethyl methacrylate unit:2-hydroxyethyl methacrylate unit in the polymer was 80% by mol:10% by mol:10% by mol.

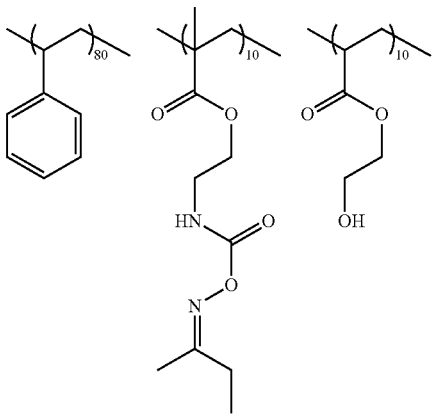

polymer compound (2-8)

Synthesis Example 2-9

Three hundred fifty one point zero grams (351.0 g, 3.37 mol) of styrene (manufactured by Junsei Chemical Co., Ltd.), 90.0 g (0.371 mol) of 2-[O-[1'-methylpropylideneamino]carboxyamino]ethyl methacrylate (manufactured by Showa Denko K.K., trade name "Karenz MOI-BM"), 2.25 g of 2,2'-azobis(2-methylpropionitrile) and 295.5 g of propylene glycol monomethyl ether acetate (PGMEA) (manufactured by Tokyo Chemical Industry Co., Ltd.) were charged in a 2 L separable flask, purged with a nitrogen gas, then, polymerized for 14 hours in a 60° C. oil bath, to obtain a viscous PGMEA solution containing a dissolved polymer compound (2-9) having repeating units and the composition represented by the following formula. The resultant polymer compound (2-9) had a polystyrene-equivalent number-average molecular weight of $6.4 \times 10^4$ and a polystyrene-equivalent weight-average molecular weight of $1.3 \times 10^5$.

The charging ratio of styrene unit:2-[O-[1'-methylpropylideneamino]carboxyamino]ethyl methacrylate unit in the polymer was 90% by mol:10% by mol.

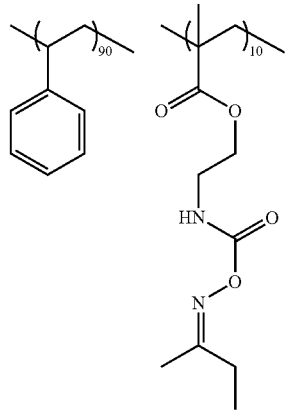

polymer compound (2-9)

Synthesis Example 2-10

Five point four nine grams (5.49 g, 52.7 mmol) of styrene (manufactured by Junsei Chemical Co., Ltd.), 1.21 g (9.30 mmol) of 2-hydroxyethyl methacrylate (manufactured by Tokyo Chemical Industry Co., Ltd.), 0.081 g of 2,2'-azobis(2-methylpropionitrile) and 10.2 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 18 hours in a 70° C. oil bath, to obtain a viscous PGMEA solution containing a dissolved polymer compound (2-10) having repeating units and the composition represented by the following formula. The resultant polymer compound (2-10) had a polystyrene-equivalent number-average molecular weight of $1.9 \times 10^4$ and a polystyrene-equivalent weight-average molecular weight of $3.8 \times 10^4$. The charging ratio of styrene unit:2-hydroxyethyl methacrylate unit in the polymer was 85% by mol:15% by mol.

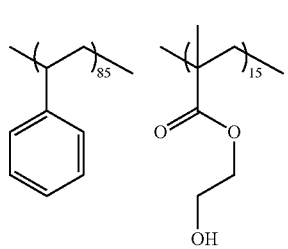

polymer compound (2-10)

Synthesis Example 2-11

Five point four zero grams (5.40 g, 51.9 mmol) of styrene (manufactured by Junsei Chemical Co., Ltd.), 1.36 g (9.15 mmol) of 4-vinylbenzoic acid (manufactured by Tosoh Corp.), 0.080 g of 2,2'-azobis(2-methylpropionitrile) and 10.3 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 18 hours in a 70° C. oil bath, to obtain a viscous PGMEA solution containing a dissolved polymer compound (2-11) having repeating units and the composition represented by the following formula. The resultant polymer compound (2-11) had a polystyrene-equivalent number-average molecular weight of $2.7 \times 10^4$ and a polystyrene-equivalent weight-average molecular weight of $5.3 \times 10^4$.
The charging ratio of styrene unit:4-vinylbenzoic acid unit in the polymer was 85% by mol:15% by mol.

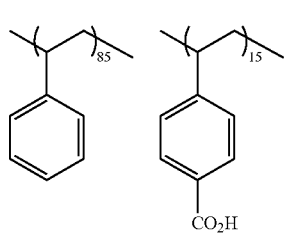

polymer compound (2-11)

Synthesis Example 2-12

Five point eight four grams (5.84 g, 56.1 mmol) of styrene (manufactured by Junsei Chemical Co., Ltd.), 0.85 g (9.90 mmol) of methacrylic acid (manufactured by Wako Pure Chemical Industries, Ltd.), 0.087 g of 2,2'-azobis(2-methylpropionitrile) and 10.17 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 18 hours in a 70° C. oil bath, to obtain a viscous PGMEA solution containing a dissolved polymer compound (2-12) having repeating units and the composition represented by the following formula. The resultant polymer compound (2-12) had a polystyrene-equivalent number-average molecular weight of $1.6 \times 10^4$ and a polystyrene-equivalent weight-average molecular weight of $3.4 \times 10^4$.
The charging ratio of styrene unit:methacrylic acid unit in the polymer was 85% by mol:15% by mol.

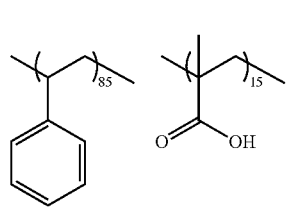

polymer compound (2-12)

Synthesis Example 2-13

Four point seven five grams (4.75 g, 45.6 mmol) of styrene (manufactured by Junsei Chemical Co., Ltd.), 0.31 g (2.40 mmol) of divinylbenzene (manufactured by Sigma Aldrich), 0.063 g of 2,2'-azobis(2-methylpropionitrile) and 12.0 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 2 hours in a 70° C. oil bath, to obtain a viscous PGMEA solution containing a dissolved polymer compound (2-13) having repeating units and the composition represented by the following formula. The resultant polymer compound (2-13) had a polystyrene-equivalent number-average molecular weight of $3.3 \times 10^4$ and a polystyrene-equivalent weight-average molecular weight of $6.9 \times 10^5$.

The charging ratio of styrene unit:divinylbenzene unit in the polymer was 85% by mol:15% by mol.

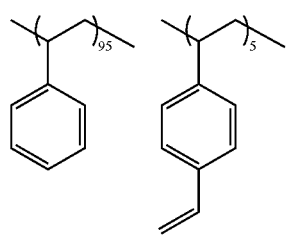

polymer compound (2-13)

Synthesis Example 2-14

Six point two zero grams (6.20 g, 59.5 mmol) of styrene (manufactured by Junsei Chemical Co., Ltd.), 1.33 g (10.5 mmol) of allyl methacrylate (manufactured by Tokyo Chemical Industry Co., Ltd.), 0.092 g of 2,2'-azobis(2-methylpropionitrile) and 11.4 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 18 hours in a 70° C. oil bath, to obtain a viscous PGMEA solution containing a dissolved polymer compound (2-14) having repeating units and the composition represented by the following formula. The resultant polymer compound (2-14) had a polystyrene-equivalent number-average molecular weight of $2.2 \times 10^4$ and a polystyrene-equivalent weight-average molecular weight of $8.8 \times 10^4$.

The charging ratio of styrene unit:allyl methacrylate unit in the polymer was 85% by mol:15% by mol.

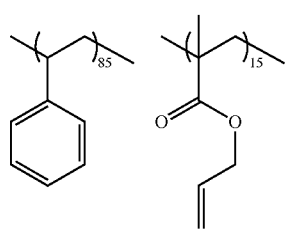

polymer compound (2-14)

Synthesis Example 2-15

Three point seven two grams (3.72 g) of styrene (manufactured by Junsei Chemical Co., Ltd.), 0.706 g of vinyl methacrylate (manufactured by Tokyo Chemical Industry Co., Ltd.), 0.055 g of 2,2'-azobis(2-methylpropionitrile) and 10.5 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 19 hours in a 70° C. oil bath, to obtain a viscous PGMEA solution containing a dissolved polymer compound (2-15) having repeating units and the composition represented by the following formula. The resultant polymer compound (2-15) had a polystyrene-equivalent number-average molecular weight of $2.0 \times 10^4$ and a polystyrene-equivalent weight-average molecular weight of $5.4 \times 10^4$.

The charging ratio of styrene unit:vinyl methacrylate unit in the polymer was 85% by mol:15% by mol.

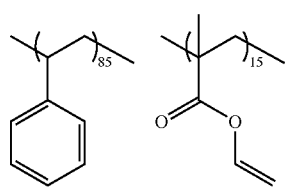

polymer compound (2-15)

Synthesis Example 2-16

Three point one nine grams (3.19 g, 30.6 mmol) of styrene (manufactured by Junsei Chemical Co., Ltd.), 1.406 g (5.40 mmol) of 3-[diethoxy (methyl)silyl]propyl methacrylate (manufactured by Tokyo Chemical Industry Co., Ltd.), 0.047 g of 2,2'-azobis(2-methylpropionitrile) and 10.8 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 19 hours in a 70° C. oil bath, to obtain a viscous PGMEA solution containing a dissolved polymer compound (2-16) having repeating units and the composition represented by the following formula. The resultant polymer compound (2-16) had a polystyrene-equivalent number-average molecular weight of $1.9 \times 10^4$ and a polystyrene-equivalent weight-average molecular weight of $3.9 \times 10^4$.

The charging ratio of styrene unit:3-[diethoxy (methyl)silyl]propyl methacrylate unit in the polymer was 85% by mol:15% by mol.

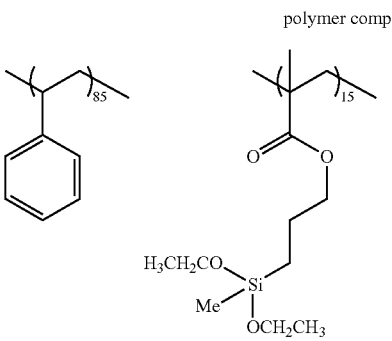

polymer compound (2-16)

Synthesis Example 2-17

Six point nine three grams (6.93 g, 66.5 mmol) of styrene (manufactured by Junsei Chemical Co., Ltd.), 0.498 g (3.50 mmol) of glycidyl methacrylate (manufactured by Tokyo Chemical Industry Co., Ltd.), 0.092 g of 2,2'-azobis(2-methylpropionitrile) and 11.3 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-17) having repeating units and the composition represented by the following formula. The resultant polymer compound (2-17) had a polystyrene-equivalent number-average molecular weight of $1.8 \times 10^4$ and a polystyrene-equivalent weight-average molecular weight of $3.7 \times 10^4$.

The charging ratio of styrene unit:glycidyl methacrylate unit in the polymer was 95% by mol:5% by mol.

polymer compound (2-17)

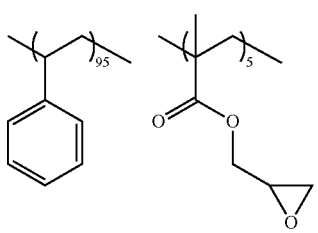

Synthesis Example 2-18

One point eight seven five grams (1.875 g, 18.0 mmol) of styrene (manufactured by Junsei Chemical Co., Ltd.), 2.907 g (12.0 mmol) of 2-[O-[1'-methylpropylideneamino]carboxyamino]ethyl methacrylate (manufactured by Showa Denko K.K., trade name "Karenz MOI-BM"), 0.039 g of 2,2'-azobis(2-methylpropionitrile) and 11.3 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-18) having repeating units and the composition represented by the following formula. The resultant polymer compound (2-18) had a polystyrene-equivalent number-average molecular weight of $1.7 \times 10^4$ and a polystyrene-equivalent weight-average molecular weight of $3.1 \times 10^4$.

The charging ratio of styrene unit:2-[O-[1'-methylpropylideneamino]carboxyamino]ethyl methacrylate unit in the polymer was 60% by mol:40% by mol.

polymer compound (2-18)

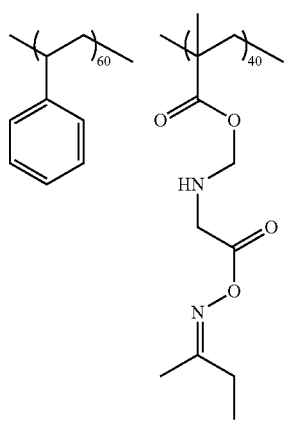

Synthesis Example 2-19

One point eight seven five grams (1.875 g, 18.0 mmol) of styrene (manufactured by Junsei Chemical Co., Ltd.), 1.454 g (6.0 mmol) of 2-[O-[1'-methylpropylideneamino]carboxyamino]ethyl methacrylate (manufactured by Showa Denko K.K., trade name "Karenz MOI-BM"), 0.889 g (6.0 mmol) of 4-vinylbenzoic acid (manufactured by Tosoh Corp.), 0.039 g of 2,2'-azobis(2-methylpropionitrile) and 9.93 g of 2-ethoxyethanol (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-19) having repeating units and the composition represented by the following formula. The resultant polymer compound (2-19) had a polystyrene-equivalent number-average molecular weight of $2.7 \times 10^4$ and a polystyrene-equivalent weight-average molecular weight of $5.6 \times 10^4$.

The charging ratio of styrene unit:2-[O-[1'-methylpropylideneamino]carboxyamino]ethyl methacrylate unit:4-vinylbenzoic acid unit in the polymer was 60% by mol:20% by mol:20% by mol.

polymer compound (2-19)

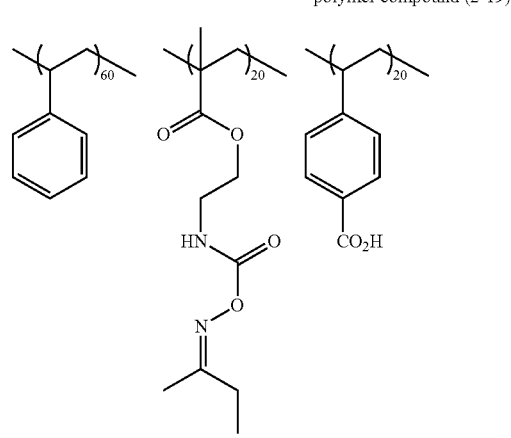

Synthesis Example 2-20

Two point one fine grams (2.19 g, 21.0 mmol) of styrene (manufactured by Junsei Chemical Co., Ltd.), 1.77 g (14.0 mmol) of allyl methacrylate (manufactured by Tokyo Chemical Industry Co., Ltd.), 0.046 g of 2,2'-azobis(2-methylpropionitrile) and 9.33 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 10 hours in a 70° C. oil bath, to obtain a viscous PGMEA solution containing a dissolved polymer compound (2-20) having repeating units and the composition represented by the following formula. The resultant polymer compound (2-20) had a polystyrene-equivalent number-average molecular weight of $2.4 \times 10^4$ and a polystyrene-equivalent weight-average molecular weight of $1.2 \times 10^5$.

The charging ratio of styrene unit:allyl methacrylate unit in the polymer was 60% by mol:40% by mol.

polymer compound (2-20)

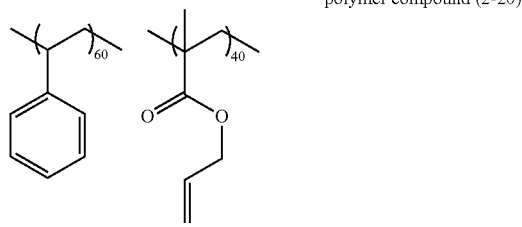

Synthesis Example 2-21

Five point two four nine grams (5.249 g, 50.40 mmol) of styrene (manufactured by Junsei Chemical Co., Ltd.), 0.678 g (2.80 mmol) of 2-[O-[1'-methylpropylideneamino]carboxyamino]ethyl methacrylate (manufactured by Showa Denko K.K., trade name "Karenz MOI-BM"), 0.415 g (2.80 mmol) of 4-vinylbenzoic acid (manufactured by Tosoh Corp.), 0.074 g of 2,2'-azobis(2-methylpropionitrile) and 9.62 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-21) having repeating units and the composition represented by the following formula. The resultant polymer compound (2-21) had a polystyrene-equivalent number-average molecular weight of $2.3 \times 10^4$ and a polystyrene-equivalent weight-average molecular weight of $4.8 \times 10^4$.

The charging ratio of styrene unit:2-[O-[1'-methylpropylideneamino]carboxyamino]ethyl methacrylate unit:4-vinylbenzoic acid unit in the polymer was 90% by mol:5% by mol:5% by mol.

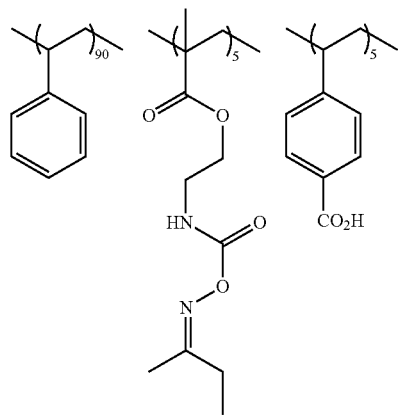

polymer compound (2-21)

Synthesis Example 2-22

Three point nine zero six grams (3.906 g, 37.50 mmol) of styrene (manufactured by Junsei Chemical Co., Ltd.), 1.817 g (7.500 mmol) of 2-[O-[1'-methylpropylideneamino]carboxyamino]ethyl methacrylate (manufactured by Showa Denko K.K., trade name "Karenz MOI-BM"), 0.741 g (5.00 mmol) of 4-vinylbenzoic acid (manufactured by Tosoh Corp.), 0.066 g of 2,2'-azobis(2-methylpropionitrile) and 15.23 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 19 hours in a 70° C. oil bath, to obtain a viscous PGMEA solution containing a dissolved polymer compound (2-22) having repeating units and the composition represented by the following formula. The resultant polymer compound (2-22) had a polystyrene-equivalent number-average molecular weight of $2.2 \times 10^4$ and a polystyrene-equivalent weight-average molecular weight of $4.6 \times 10^4$.

The charging ratio of styrene unit:2-[O-[1'-methylpropylideneamino]carboxyamino]ethyl methacrylate unit:4-vinylbenzoic acid unit in the polymer was 75% by mol:15% by mol:10% by mol.

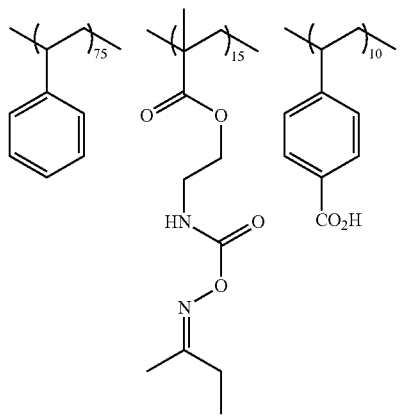

polymer compound (2-22)

Synthesis Example 2-23

Three point nine zero fix grams (3.906 g, 3.750 mmol) of styrene (manufactured by Junsei Chemical Co., Ltd.), 1.817 g (7.500 mmol) of 2-[O-[1'-methylpropylideneamino]carboxyamino]ethyl methacrylate (manufactured by Showa Denko K.K., trade name "Karenz MOI-BM"), 0.651 g (5.000 mmol) of 2-hydroxyethyl methacrylate (manufactured by Tokyo Chemical Industry Co., Ltd.), 0.066 g of 2,2'-azobis(2-methylpropionitrile) and 11.96 g of propylene glycol monomethyl ether acetate (PGMEA) (manufactured by Tokyo Chemical Industry Co., Ltd.) were charged in a 50 mL pressure-resistant vessel (manufactured by ACE GLASS), bubbled with a nitrogen gas, then, sealed tightly, and polymerized for 20 hours in a 70° C. oil bath, to obtain a viscous PGMEA solution containing a dissolved polymer compound (2-23) having repeating units and the composition represented by the following formula. The resultant polymer compound (2-23) had a polystyrene-equivalent number-average molecular weight of $2.0 \times 10^4$ and a polystyrene-equivalent weight-average molecular weight of $4.4 \times 10^4$.

The charging ratio of styrene unit:2-[O-[1'-methylpropylideneamino]carboxyamino]ethyl methacrylate unit:2-hydroxyethyl methacrylate unit in the polymer was 75% by mol:15% by mol:10% by mol.

polymer compound (2-23)

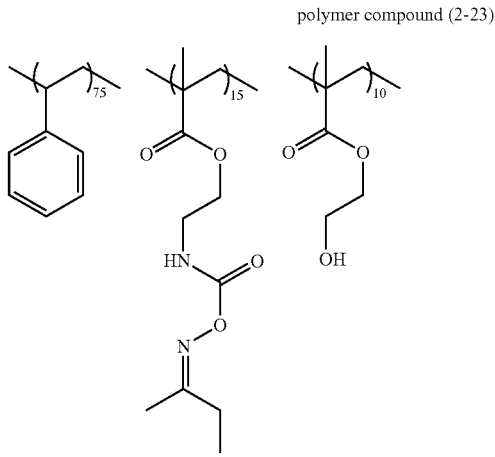

Example 1 (Fabrication and Evaluation of Organic Thin-Film Transistor (1))

A top gate bottom contact type organic thin-film transistor device (2-1) was produced using a solution containing the polymer compound (2-1) obtained in Synthesis Example 2-1. The procedure is specifically explained below.

First, a glass substrate was irradiated with ozone UV, then, washed with an alkali washing solution, and rinsed with pure water.

Next, on the glass substrate, chromium and gold were laminated by a sputtering method in this order from the substrate side, and patterned by photolithography, to form a source electrode and a drain electrode. On the source electrode and the drain electrode, the channel length was set to 20 μm and the channel width was set to 2 mm. Thereafter, the glass substrate was immersed in a solution of 2,3,5,6-tetrafluoro-4-trifluoromethylbenzenethiol diluted with isopropyl alcohol for 2 minutes, to modify the surface of the electrodes (particularly, gold) formed on the substrate.

Subsequently, the 0.5% by mass toluene solution of the polymer compound C obtained in Synthesis Example 1 was spin-coated on the side of the source electrode and the drain electrode, and heat-treated using a hot plate at 150° C. for 7 minutes, to form an organic semiconductor layer.

The solution obtained in Example 1 was, if necessary, diluted with propylene glycol monomethyl ether acetate (PGMEA) as the solvent used in synthesis, and then, coated on this organic thin-film semiconductor layer by a spin coat method, and the coated layer formed was heat-treated at 150° C. for 30 minutes, to form a gate insulation layer which is a hardened film obtained by hardening of the coated layer containing the polymer compound (2-1). The thickness of the gate insulation layer formed was 820 nm.

Further, on this gate insulation layer, a film of aluminum was formed by a vapor-deposition method to form a gate electrode, obtaining an organic thin-film transistor (1).

The property of the resultant organic thin-film transistor (1) was evaluated.

Specifically, voltage was applied to the gate electrode of the organic thin-film transistor (1), and the gate voltage Vg was changed from 20 V to −40V under condition of a source-drain voltage Vsd of −30V, and the carrier mobility was measured and evaluated using a semiconductor parameter analyzer (4200-PA; manufactured by Keithley).

The carrier mobility of the organic thin-film transistor (1) was 1.28 cm$^2$/Vs. The results are shown in Table 1.

Example 2 (Fabrication and Evaluation of Organic Thin-Film Transistor (2))

An organic thin-film transistor (2) was fabricated in the same manner as in Example 1, except that the solution containing the polymer compound (2-2) obtained in Synthesis Example 2-2 was used instead of the solution containing the polymer compound (2-1) obtained in Synthesis Example 2-1, and its carrier mobility was measured. The carrier mobility was 1.07 cm$^2$/Vs. The results are shown in Table 1.

Example 3 (Fabrication and Evaluation of Organic Thin-Film Transistor (3))

An organic thin-film transistor (3) was fabricated in the same manner as in Example 1, except that the solution containing the polymer compound (2-3) obtained in Synthesis Example 2-3 was used instead of the solution containing the polymer compound (2-1) obtained in Synthesis Example 2-1, and its carrier mobility was measured. The carrier mobility was 0.89 cm$^2$/Vs. The results are shown in Table 1.

Example 4 (Fabrication and Evaluation of Organic Thin-Film Transistor (4))

An organic thin-film transistor (4) was fabricated in the same manner as in Example 1, except that the solution containing the polymer compound (2-4) obtained in Synthesis Example 2-4 was used instead of the solution containing the polymer compound (2-1) obtained in Synthesis Example 2-1, and its carrier mobility was measured. The carrier mobility was 1.10 cm$^2$/Vs. The results are shown in Table 1.

Example 5 (Fabrication and Evaluation of Organic Thin-Film Transistor (5))

An organic thin-film transistor (5) was fabricated in the same manner as in Example 1, except that the solution containing the polymer compound (2-5) obtained in Synthesis Example 2-5 was used instead of the solution containing the polymer compound (2-1) obtained in Synthesis Example 2-1, and its carrier mobility was measured. The carrier mobility was 0.69 cm$^2$/Vs. The results are shown in Table 1.

Example 6 (Fabrication and Evaluation of Organic Thin-Film Transistor (6))

An organic thin-film transistor (6) was fabricated in the same manner as in Example 1, except that the solution containing the polymer compound (2-6) obtained in Synthesis Example 2-6 was used instead of the solution containing the polymer compound (2-1) obtained in Synthesis Example 2-1, and its carrier mobility was measured. The carrier mobility was 0.80 cm$^2$/Vs. The results are shown in Table 1.

Example 7 (Fabrication and Evaluation of Organic Thin-Film Transistor (7))

An organic thin-film transistor (7) was fabricated in the same manner as in Example 1, except that the solution containing the polymer compound (2-7) obtained in Synthesis Example 2-7 was used instead of the solution containing the polymer compound (2-1) obtained in Synthesis Example 2-1, and its carrier mobility was measured. The carrier mobility was 1.00 cm$^2$/Vs. The results are shown in Table 1.

Example 8 (Fabrication and Evaluation of Organic Thin-Film Transistor (8))

An organic thin-film transistor (8) was fabricated in the same manner as in Example 1, except that the solution containing the polymer compound (2-8) obtained in Synthesis Example 2-8 was used instead of the solution containing the polymer compound (2-1) obtained in Synthesis Example 2-1, and its carrier mobility was measured. The carrier mobility was 0.83 cm$^2$/Vs. The results are shown in Table 1.

Comparative Example 1 (Fabrication and Evaluation of Organic Thin-Film Transistor (9))

An organic thin-film transistor (9) was fabricated in the same manner as in Example 1, except that the solution containing the polymer compound (2-9) obtained in Synthesis Example 2-9 was used instead of the solution containing the polymer compound (2-1) obtained in Synthesis Example 2-1, and its carrier mobility was measured. The carrier mobility was 1.32 cm$^2$/Vs. The results are shown in Table 1.

Comparative Example 2 (Fabrication and Evaluation of Organic Thin-Film Transistor (10))

An organic thin-film transistor (10) was fabricated in the same manner as in Example 1, except that the solution containing the polymer compound (2-10) obtained in Synthesis Example 2-10 was used instead of the solution containing the polymer compound (2-1) obtained in Synthesis Example 2-1, and its carrier mobility was measured. The carrier mobility was 0.93 cm$^2$/Vs. The results are shown in Table 1.

Comparative Example 3 (Fabrication and Evaluation of Organic Thin-Film Transistor (11))

An organic thin-film transistor (11) was fabricated in the same manner as in Example 1, except that the solution containing the polymer compound (2-11) obtained in Synthesis Example 2-11 was used instead of the solution containing the polymer compound (2-1) obtained in Synthesis Example 2-1, and its carrier mobility was measured. The carrier mobility was 0.69 cm$^2$/Vs. The results are shown in Table 1.

Comparative Example 4 (Fabrication and Evaluation of Organic Thin-Film Transistor (12))

An organic thin-film transistor (12) was fabricated in the same manner as in Example 1, except that the solution containing the polymer compound (2-12) obtained in Synthesis Example 2-12 was used instead of the solution containing the polymer compound (2-1) obtained in Synthesis Example 2-1, and its carrier mobility was measured. The carrier mobility was 0.74 cm$^2$/Vs. The results are shown in Table 1.

Comparative Example 5 (Fabrication and Evaluation of Organic Thin-Film Transistor (13))

An organic thin-film transistor (13) was fabricated in the same manner as in Example 1, except that the solution containing the polymer compound (2-13) obtained in Synthesis Example 2-13 was used instead of the solution containing the polymer compound (2-1) obtained in Synthesis Example 2-1, and its carrier mobility was measured. The carrier mobility was 0.90 cm$^2$/Vs. The results are shown in Table 1.

Comparative Example 6 (Fabrication and Evaluation of Organic Thin-Film Transistor (14))

An organic thin-film transistor (14) was fabricated in the same manner as in Example 1, except that the solution containing the polymer compound (2-14) obtained in Synthesis Example 2-14 was used instead of the solution containing the polymer compound (2-1) obtained in Synthesis Example 2-1, and its carrier mobility was measured. The carrier mobility was 0.74 cm$^2$/Vs. The results are shown in Table 1.

Comparative Example 7 (Fabrication and Evaluation of Organic Thin-Film Transistor (15))

An organic thin-film transistor (15) was fabricated in the same manner as in Example 1, except that the solution containing the polymer compound (2-15) obtained in Synthesis Example 2-15 was used instead of the solution containing the polymer compound (2-1) obtained in Synthesis Example 2-1, and its carrier mobility was measured. The carrier mobility was 0.61 cm$^2$/Vs. The results are shown in Table 1.

Comparative Example 8 (Fabrication and Evaluation of Organic Thin-Film Transistor (16))

An organic thin-film transistor (16) was fabricated in the same manner as in Example 1, except that the solution containing the polymer compound (2-16) obtained in Synthesis Example 2-16 was used instead of the solution containing the polymer compound (2-1) obtained in Synthesis Example 2-1, and its carrier mobility was measured. The carrier mobility was 0.72 cm$^2$/Vs. The results are shown in Table 1.

Comparative Example 9 (Fabrication and Evaluation of Organic Thin-Film Transistor (17))

An organic thin-film transistor (17) was fabricated in the same manner as in Example 1, except that the solution containing the polymer compound (2-17) obtained in Synthesis Example 2-17 was used instead of the solution containing the polymer compound (2-1) obtained in Synthesis Example 2-1, and its carrier mobility was measured. The carrier mobility was 1.06 cm$^2$/Vs. The results are shown in Table 1.

Comparative Example 10 (Fabrication and Evaluation of Organic Thin-Film Transistor (18))

An organic thin-film transistor (18) was fabricated in the same manner as in Example 1, except that the solution containing the polymer compound (2-18) obtained in Synthesis Example 2-18 was used instead of the solution containing the polymer compound (2-1) obtained in Synthesis Example 2-1, and its carrier mobility was measured. The carrier mobility was 0.16 cm$^2$/Vs. The results are shown in Table 1.

Comparative Example 11 (Fabrication and Evaluation of Organic Thin-Film Transistor (19))

An organic thin-film transistor (19) was fabricated in the same manner as in Example 1, except that the solution containing the polymer compound (2-19) obtained in Synthesis Example 2-19 was used instead of the solution containing the polymer compound (2-1) obtained in Synthesis Example 2-1, and its carrier mobility was measured. The carrier mobility was 0.31 cm$^2$/Vs. The results are shown in Table 1.

Comparative Example 12 (Fabrication and Evaluation of Organic Thin-Film Transistor (20))

An organic thin-film transistor (20) was fabricated in the same manner as in Example 1, except that the solution containing the polymer compound (2-20) obtained in Synthesis Example 2-20 was used instead of the solution containing the polymer compound (2-1) obtained in Synthesis Example 2-1, and its carrier mobility was measured. The carrier mobility was 0.47 cm$^2$/Vs. The results are shown in Table 1.

Example 9 (Fabrication and Evaluation of Organic Thin-Film Transistor (21))

An organic thin-film transistor (21) was fabricated in the same manner as in Example 1, except that the solution containing the polymer compound (2-21) obtained in Synthesis Example 2-21 was used instead of the solution containing the polymer compound (2-1) obtained in Synthesis Example 2-1, and its carrier mobility was measured. The carrier mobility was 1.00 cm$^2$/Vs. The results are shown in Table 1.

Example 10 (Fabrication and Evaluation of Organic Thin-Film Transistor (22))

An organic thin-film transistor (22) was fabricated in the same manner as in Example 1, except that the solution containing the polymer compound (2-22) obtained in Synthesis Example 2-22 was used instead of the solution containing the polymer compound (2-1) obtained in Synthesis Example 2-1, and its carrier mobility was measured. The carrier mobility was 0.55 cm$^2$/Vs. The results are shown in Table 1.

Example 11 (Fabrication and Evaluation of Organic Thin-Film Transistor (23))

An organic thin-film transistor (23) was fabricated in the same manner as in Example 1, except that the solution containing the polymer compound (2-23) obtained in Synthesis Example 2-23 was used instead of the solution containing the polymer compound (2-1) obtained in Synthesis Example 2-1, and its carrier mobility was measured. The carrier mobility was 0.60 cm$^2$/Vs. The results are shown in Table 1.

Example 12 (Measurement of Film Remaining Rate Using Film Containing Polymer Compound (2-1))

The polymer compound (2-1) obtained in Synthesis Example 2-1 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 600 rpm/40 seconds), then, baked on a hot plate of 150° C. for 30 minutes, to obtain film A. The film thickness of the resultant film A was measured using a step meter, and its film thickness three-point average was 10241 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 10250 nm. Based on the ratio of the film thickness of film A and the film thickness of film B, the film remaining rate was 100.1%. The results are shown in Table 1.

Example 13 (Measurement of Film Remaining Rate Using Film Containing Polymer Compound (2-2))

The polymer compound (2-2) obtained in Synthesis Example 2-2 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 700 rpm/40 seconds), then, baked on a hot plate of 150° C. for 30 minutes, to obtain film A. The film thickness of the resultant film A was measured using a step meter, and its film thickness three-point average was 10249 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 10240 nm. Based on the ratio of the film thickness of film A and the film thickness of film B, the film remaining rate was 99.9%. The results are shown in Table 1.

Example 14 (Measurement of Film Remaining Rate Using Film Containing Polymer Compound (2-3))

The polymer compound (2-3) obtained in Synthesis Example 2-3 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 600 rpm/40 seconds), then, baked on a hot plate of 150° C. for 30 minutes, to obtain film A. The film thickness of the resultant film A was measured using a step meter, and its film thickness three-point average was 10395 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 10419 nm. Based on the ratio of the film thickness of film A and the film thickness of film B, the film remaining rate was 100.2%. The results are shown in Table 1.

Example 15 (Measurement of Film Remaining Rate Using Film Containing Polymer Compound (2-4))

The polymer compound (2-4) obtained in Synthesis Example 2-4 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 1600 rpm/40 seconds), then, baked on a hot plate of 150° C. for 30 minutes, to obtain film A. The film thickness of the resultant film A was measured using a step meter, and its film thickness three-point average was 9600 nm. Thereafter, propylene glycol monomethyl ether acetate (1.0 mL) was dropped on the film A, and spin-coated (rotational frequency 2000 rpm/40 seconds), to obtain film B. The film thickness of the resultant film B was measured using a step meter, and its film thickness three-point average was 9612 nm. Based on the ratio of the film thickness of film A and the film thickness of film B, the film remaining rate was 100.1%. The results are shown in Table 1.

Example 16 (Measurement of Film Remaining Rate Using Film Containing Polymer Compound (2-5))

The polymer compound (2-5) obtained in Synthesis Example 2-5 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 1000 rpm/40 seconds), then, baked on a hot plate of 150° C. for 30 minutes, to obtain film A. The film thickness of the resultant film A was measured using a step meter, and its film thickness three-point average was 10706 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 10603 nm. Based on the ratio of the film thickness of film A and the film thickness of film B, the film remaining rate was 99.0%. The results are shown in Table 1.

Example 17 (Measurement of Film Remaining Rate Using Film Containing Polymer Compound (2-6))

The polymer compound (2-6) obtained in Synthesis Example 2-6 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 500 rpm/40 seconds), then, baked on a hot plate of 150° C. for 30 minutes, to obtain film A. The film thickness of the resultant film A was measured using a step meter, and its film thickness three-point average was 9466 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 9403 nm. Based on the ratio of the film thickness of film A and the film thickness of film B, the film remaining rate was 99.3%. The results are shown in Table 1.

Example 18 (Measurement of Film Remaining Rate Using Film Containing Polymer Compound (2-7))

The polymer compound (2-7) obtained in Synthesis Example 2-7 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 500 rpm/40 seconds), then, baked on a hot plate of 150° C. for 30 minutes, to obtain film A. The film thickness of the resultant film A was measured using a step meter, and its film thickness three-point average was 10366 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 10318 nm. Based on the ratio of the film thickness of film A and the film thickness of film B, the film remaining rate was 99.5%. The results are shown in Table 1.

Example 19 (Measurement of Film Remaining Rate Using Film Containing Polymer Compound (2-8))

The polymer compound (2-8) obtained in Synthesis Example 2-8 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 550 rpm/40 seconds), then, baked on a hot plate of 150° C. for 30 minutes, to obtain film A. The film thickness of the resultant film A was measured using a step meter, and its film thickness three-point average was 10449 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 10406 nm. Based on the ratio of the film thickness of film A and the film thickness of film B, the film remaining rate was 99.6%. The results are shown in Table 1.

Comparative Example 13 (Measurement of Film Remaining Rate Using Film Containing Polymer Compound (2-9))

The polymer compound (2-9) obtained in Synthesis Example 2-9 and propylene glycol monomethyl ether acetate were mixed, to obtain a 10% by weight solution. This solution (0.5 mL) was spin-coated on a glass substrate (size 40×44 mm, thickness 0.7 mm) (rotational frequency 2000 rpm/40 seconds), then, baked on a hot plate of 150° C. for 30 minutes, to obtain film A. The film thickness of the resultant film A was measured using a step meter, and its film thickness three-point average was 12380 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 9297 nm. Based on the ratio of the film thickness of film A and the film thickness of film B, the film remaining rate was 75.1%. The results are shown in Table 1.

Comparative Example 14 (Measurement of Film Remaining Rate Using Film Containing Polymer Compound (2-10))

The polymer compound (2-10) obtained in Synthesis Example 2-10 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 2000 rpm/40 seconds), then, baked on a hot plate of 150° C. for 30 minutes, to obtain film A. The film thickness of the resultant film A was measured using a step meter, and its film thickness three-point average was 10293 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 1360 nm. Based on the ratio of the film thickness of film A and the film thickness of film B, the film remaining rate was 13.2%. The results are shown in Table 1.

Comparative Example 15 (Measurement of Film Remaining Rate Using Film Containing Polymer Compound (2-11))

The polymer compound (2-11) obtained in Synthesis Example 2-11 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 700 rpm/40 seconds), then, baked on a hot plate of 150° C. for 30 minutes, to obtain film A. The film thickness of the resultant film A was measured using a step meter, and its film thickness three-point average was 10225 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 6311 nm. Based on the ratio of the film thickness of film A and the film thickness of film B, the film remaining rate was 61.7%. The results are shown in Table 1.

Comparative Example 16 (Measurement of Film Remaining Rate Using Film Containing Polymer Compound (2-12))

The polymer compound (2-12) obtained in Synthesis Example 2-12 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 1000 rpm/40 seconds), then, baked on a hot plate of 150° C. for 30 minutes, to obtain film A. The film thickness of the resultant film A was measured using a step meter, and its film thickness three-point average was 13147 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 3141 nm. Based on the ratio of the film thickness of film A and the film thickness of film B, the film remaining rate was 23.9%. The results are shown in Table 1.

Comparative Example 17 (Measurement of Film Remaining Rate Using Film Containing Polymer Compound (2-13))

The polymer compound (2-13) obtained in Synthesis Example 2-13 and propylene glycol monomethyl ether acetate were mixed, to obtain a 30% by weight solution. This solution (0.5 mL) was spin-coated on a glass substrate (size 40×44 mm, thickness 0.7 mm) (rotational frequency 500 rpm/40 seconds), then, baked on a hot plate of 150° C. for 30 minutes, to obtain film A. The film thickness of the resultant film A was measured using a step meter, and its film thickness three-point average was 9959 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 7611 nm. Based on the ratio of the film thickness of film A and the film thickness of film B, the film remaining rate was 76.4%. The results are shown in Table 1.

Comparative Example 18 (Measurement of Film Remaining Rate Using Film Containing Polymer Compound (2-14))

The polymer compound (2-14) obtained in Synthesis Example 2-14 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 650 rpm/40 seconds), then, baked on a hot plate of 150° C. for 30 minutes, to obtain film A. The film thickness of the resultant film A was measured using a step meter, and its film thickness three-point average was 10480 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 7692 nm. Based on the ratio of the film thickness of film A and the film thickness of film B, the film remaining rate was 73.4%. The results are shown in Table 1.

Comparative Example 19 (Measurement of Film Remaining Rate Using Film Containing Polymer Compound (2-15))

The polymer compound (2-15) obtained in Synthesis Example 2-15 and propylene glycol monomethyl ether acetate were mixed, to obtain a 30% by weight solution. This solution (0.5 mL) was spin-coated on a glass substrate (size 40×44 mm, thickness 0.7 mm) (rotational frequency 1250 rpm/40 seconds), then, baked on a hot plate of 150° C. for 30 minutes, to obtain film A. The film thickness of the resultant film A was measured using a step meter, and its film thickness three-point average was 10315 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 831 nm. Based on the ratio of the film thickness of film A and the film thickness of film B, the film remaining rate was 8.1%. The results are shown in Table 1.

Comparative Example 20 (Measurement of Film Remaining Rate Using Film Containing Polymer Compound (2-16))

The polymer compound (2-16) obtained in Synthesis Example 2-16 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 500 rpm/40 seconds), then, baked on a hot plate of 150° C. for 30 minutes, to obtain film A. The film thickness of the resultant film A was measured using a step meter, and its film thickness three-point average was 8356 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 763 nm. Based on the ratio of the film thickness of film A and the film thickness of film B, the film remaining rate was 9.1%. The results are shown in Table 1.

Comparative Example 21 (Measurement of Film Remaining Rate Using Film Containing Polymer Compound (2-17))

The polymer compound (2-17) obtained in Synthesis Example 2-17 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 500 rpm/40 seconds), then, baked on a hot plate of 150° C. for 30 minutes, to obtain film A. The film thickness of the resultant film A was measured using a step meter, and its film thickness three-point average was 9852 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 1086 nm. Based on the ratio of the film thickness of film A and the film thickness of film B, the film remaining rate was 11.0%. The results are shown in Table 1.

Comparative Example 22 (Measurement of Film Remaining Rate Using Film Containing Polymer Compound (2-18))

The polymer compound (2-18) obtained in Synthesis Example 2-18 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 550 rpm/40 seconds), then, baked on a hot plate of 150° C. for 30 minutes, to obtain film A. The film thickness of the resultant film A was measured using a step meter, and its film thickness three-point average was 10000 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 10019 nm. Based on the ratio of the film thickness of film A and the film thickness of film B, the film remaining rate was 100.2%. The results are shown in Table 1.

Comparative Example 23 (Measurement of Film Remaining Rate Using Film Containing Polymer Compound (2-19))

The polymer compound (2-19) obtained in Synthesis Example 2-19 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 1250 rpm/40 seconds), then, baked on a hot plate of 150° C. for 30 minutes, to obtain film A. The film thickness of the resultant film A was measured using a step meter, and its film thickness three-point average was 9878 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 8833 nm. Based on the ratio of the film thickness of film A and the film thickness of film B, the film remaining rate was 89.4%. The results are shown in Table 1.

Comparative Example 24 (Measurement of Film Remaining Rate Using Film Containing Polymer Compound (2-20))

The polymer compound (2-20) obtained in Synthesis Example 2-20 and propylene glycol monomethyl ether acetate were mixed, to obtain a 30% by weight solution. This solution (0.5 mL) was spin-coated on a glass substrate (size 40×44 mm, thickness 0.7 mm) (rotational frequency 1800 rpm/40 seconds), then, baked on a hot plate of 150° C. for 30 minutes, to obtain film A. The film thickness of the resultant film A was measured using a step meter, and its film thickness three-point average was 11007 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 1258 nm. Based on the ratio of the film thickness of film A and the film thickness of film B, the film remaining rate was 11.4%. The results are shown in Table 1.

Example 20 (Measurement of Film Remaining Rate Using Film Containing Polymer Compound (2-21))

The polymer compound (2-21) obtained in Synthesis Example 2-21 and propylene glycol monomethyl ether acetate were mixed, to obtain a 15% by weight solution. This solution (0.5 mL) was spin-coated on a glass substrate (size 40×44 mm, thickness 0.7 mm) (rotational frequency 600 rpm/40 seconds), then, baked on a hot plate of 150° C. for 30 minutes, to obtain film A. The film thickness of the resultant film A was measured using a step meter, and its film thickness three-point average was 9862 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 9832 nm. Based on the ratio of the film thickness of film A and the film thickness of film B, the film remaining rate was 99.7%. The results are shown in Table 1.

Example 21 (Measurement of Film Remaining Rate Using Film Containing Polymer Compound (2-22))

The polymer compound (2-22) obtained in Synthesis Example 2-22 and propylene glycol monomethyl ether acetate were mixed, to obtain a 30% by weight solution. This solution (0.5 mL) was spin-coated on a glass substrate (size 40×44 mm, thickness 0.7 mm) (rotational frequency 2500 rpm/40 seconds), then, baked on a hot plate of 150° C. for 30 minutes, to obtain film A. The film thickness of the resultant film A was measured using a step meter, and its film thickness three-point average was 9853 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 9854 nm. Based on the ratio of the film thickness of film A and the film thickness of film B, the film remaining rate was 100.0%. The results are shown in Table 1.

Example 22 (Measurement of Film Remaining Rate Using Film Containing Polymer Compound (2-23))

The polymer compound (2-23) obtained in Synthesis Example 2-23 and propylene glycol monomethyl ether acetate were mixed, to obtain a 20% by weight solution. This solution (0.5 mL) was spin-coated on a glass substrate (size 40×44 mm, thickness 0.7 mm) (rotational frequency 1700 rpm/40 seconds), then, baked on a hot plate of 150° C. for 30 minutes, to obtain film A. The film thickness of the resultant film A was measured using a step meter, and its film thickness three-point average was 10731 nm. Thereafter, propylene glycol monomethyl ether acetate (1.0 mL) was dropped on the film A, and spin-coated (rotational frequency 2000 rpm/20 seconds), to obtain film B. The film thickness of the resultant film B was measured using a step meter, and its film thickness three-point average was 9953 nm. Based on the ratio of the film thickness of film A and the film thickness of film B, the film remaining rate was 92.7%. The results are shown in Table 1.

TABLE 1

| polymer compound | transistor | carrier mobility (cm$^2$/Vs) | film remaining rate (%) |
| --- | --- | --- | --- |
| 2-1 | transistor 1 | 1.28 | 100.1 |
| 2-2 | transistor 2 | 1.07 | 99.9 |
| 2-3 | transistor 3 | 0.89 | 100.2 |
| 2-4 | transistor 4 | 1.10 | 100.1 |
| 2-5 | transistor 5 | 0.69 | 99.0 |
| 2-6 | transistor 6 | 0.80 | 99.3 |
| 2-7 | transistor 7 | 1.00 | 99.5 |
| 2-8 | transistor 8 | 0.83 | 99.6 |
| 2-9 | transistor 9 | 1.32 | 75.1 |
| 2-10 | transistor 10 | 0.93 | 13.2 |
| 2-11 | transistor 11 | 0.69 | 61.7 |
| 2-12 | transistor 12 | 0.74 | 23.9 |
| 2-13 | transistor 13 | 0.90 | 76.4 |
| 2-14 | transistor 14 | 0.74 | 73.4 |
| 2-15 | transistor 15 | 0.61 | 8.1 |
| 2-16 | transistor 16 | 0.72 | 9.1 |
| 2-17 | transistor 17 | 1.06 | 11.0 |
| 2-18 | transistor 18 | 0.16 | 100.2 |
| 2-19 | transistor 19 | 0.31 | 89.4 |
| 2-20 | transistor 20 | 0.47 | 11.4 |
| 2-21 | transistor 21 | 1.00 | 99.7 |
| 2-22 | transistor 22 | 0.55 | 100.0 |
| 2-23 | transistor 23 | 0.60 | 92.7 |

An organic thin-film transistor having a carrier mobility of 0.5 cm$^2$/Vs or more is evaluated as having good carrier mobility, and one having a film remaining rate of 90% or more is evaluated as having high solvent resistance.

DESCRIPTION OF NUMERALS

1: substrate
2: gate electrode
3: gate insulation layer
4: organic semiconductor layer
5: source electrode
6: drain electrode
7: protective layer
10: organic thin-film transistor

The invention claimed is:
1. A gate insulation film comprising:
a polymer compound containing at least one repeating unit selected from the group consisting of a repeating unit represented by the formula (2) and a repeating unit represented by the formula (3); a repeating unit represented by the formula (4) and a repeating unit represented by the following formula (1), or a hardened product of the polymer compound, or a composition containing the polymer compound, or a hardened product of the composition, wherein the above-described polymer compound is a polymer compound in which the molar ratio of the repeating unit represented by the formula (4) to the sum of the repeating unit represented by the formula (2) and the repeating unit represented by the formula (3) is 50/100 to 200/100 with the total charging amount (molar quantity) of the repeating unit represented by the formula (2) and the repeating unit represented by the formula (3) being 100 and the content of the repeating unit represented by the following formula (1) is 75% by mol or more with the total content of all repeating units contained in the above-described polymer compound being 100% by mol, and in the above-described composition, the total mass of the above-described polymer compound is 80% by mass or more with respect to the whole composition and the total mass of compounds having two or more amino groups is 4.5% by mass or less with respect to the above-described polymer compound:

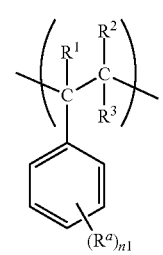

(1)

wherein, in the formula (1), R$^1$, R$^2$ and R$^3$ each independently represent a hydrogen atom or a methyl group, R$^a$ represents a monovalent hydrocarbon group having a number of carbon atoms of 1 to 6, and a plurality of R$^a$ may be combined together to form a ring together with carbon atoms to which they are attached, and n1 represents an integer of 0 to 5:

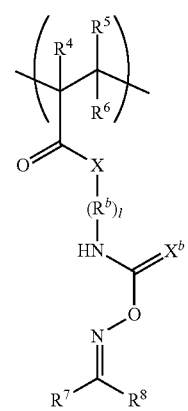

(2)

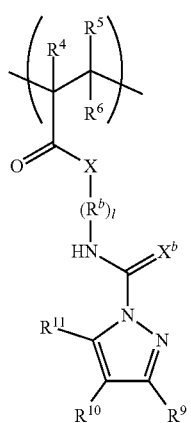

(3)

wherein, in the formulae (2) and (3),
R⁴, R⁵ and R⁶ each independently represent a hydrogen atom or a methyl group,
$X^b$ represents an oxygen atom or a sulfur atom,
R⁷ to R¹¹ each independently represent a hydrogen atom or a monovalent organic group having a number of carbon atoms of 1 to 20,
$R^b$ represents a divalent organic group having a number of carbon atoms of 1 to 20,
X represents an oxygen atom or a group represented by —NR"—,
R" represents a hydrogen atom or a monovalent organic group having a number of carbon atoms of 1 to 20,
l represents an integer of 1 to 6, and
a plurality of $R^b$ may be the same or different:

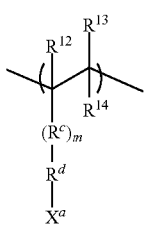

(4)

wherein, in the formula (4),
R¹², R¹³ and R¹⁴ each independently represent a hydrogen atom or a methyl group,
$R^C$ represents a divalent organic group having a number of carbon atoms of 1 to 20, a group represented by —O—, a group represented by —CO—, a group represented by —COO—, a group represented by —NHCO— or a group represented by —NHCOO—, any of respective two connecting bonds of these groups may be situated at the side of a carbon atom to which R¹² is bonded,
$R^d$ represents a single bond or a divalent organic group having a number of carbon atoms of 1 to 20,
m represents an integer of 0 to 6; and
$X^a$ represents a hydroxy group or a carboxy group, and a plurality of $R^C$ may be the same or different.

2. The gate insulation film according to claim 1, wherein the above-described polymer compound is a polymer compound in which the total content of a repeating unit represented by the formula (1), a repeating unit represented by the formula (2) or (3) and a repeating unit represented by the formula (4) is 90% by mol or more with the total content of all repeating units contained in the above-described polymer compound being 100% by mol.

3. An organic thin-film transistor having a gate electrode, a source electrode, a drain electrode, a semiconductor layer and a gate insulation layer, wherein the gate insulation layer is composed of the gate insulation film according to claim 1.

4. The organic thin-film transistor according to claim 3, wherein the above-described semiconductor layer is an organic semiconductor layer.

5. The organic thin-film transistor according to claim 4, wherein the above-described organic semiconductor layer contains a compound containing a structure represented by the following formula (5):

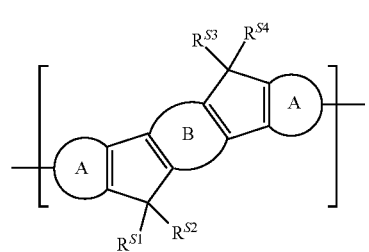

(5)

wherein, in the formula (5),
$R^{S1}$, $R^{S2}$, $R^{S3}$ and $R^{S4}$ each independently represent an alkyl group having a number of carbon atoms of 1 to 20 optionally having a substituent, an alkoxy group having a number of carbon atoms of 1 to 20 optionally having a substituent, an alkylthio group having a number of carbon atoms of 1 to 20 optionally having a substituent, an alkylcarbonyl group having a number of carbon atoms of 2 to 20 optionally having a substituent, an alkoxycarbonyl group having a number of carbon atoms of 2 to 20 optionally having a substituent, a dialkylamino group having a number of carbon atoms of 2 to 20 optionally having a substituent, a monovalent aromatic hydrocarbon group having a number of carbon atoms of 6 to 20 having an alkyl group as a substituent, a monovalent aromatic hydrocarbon group having a number of carbon atoms of 6 to 20 having an alkoxy group as a substituent, a monovalent heterocyclic group having a number of carbon atoms of 2 to 20 having an alkyl group as a substituent, a monovalent heterocyclic group having a number of carbon atoms of 2 to 20 having an alkoxy group as a substituent, an alkynyl group having a number of carbon atoms of 2 to 22 or an alkenyl group having a number of carbon atoms of 2 to 22,
ring A represents a thiophene ring, a benzothiophene ring or a thienothiophene ring, and two rings A may be the same or different; and
ring B represents an aromatic ring, an aromatic heterocyclic ring, or a condensed ring obtained by condensing 2 to 4 rings selected from the group consisting of aromatic rings and aromatic heterocyclic rings, and the foregoing rings optionally have a substituent.

6. The organic thin-film transistor according to claim 3, having a top gate type structure.

7. A gate insulation film comprising:
a polymer compound containing at least one repeating unit selected from the group consisting of a repeating unit represented by the formula (2) and a repeating unit represented by the formula (3); a repeating unit represented by the formula (6) and a repeating unit represented by the following formula (1), or a hardened product of the polymer compound, or a composition containing the polymer compound, or a hardened product of the composition, wherein the above-described polymer compound is a polymer compound in which the molar ratio of the repeating unit represented by the formula (6) to the sum of the repeating unit represented by the formula (2) and the repeating unit represented by the formula (3) is 50/100 to 200/100 with the total charging amount (molar quantity) of the repeating unit represented by the formula (2) and the repeating unit represented by the formula (3) being 100 and the content of the repeating unit represented by the following formula (1) is 75% by mol or more with the total content of all repeating units contained in the above-described polymer compound being 100% by mol, and in the above-described composition, the total mass of the above-described polymer compound is 80% by mass or more with respect to the whole composition and the total mass of compounds having two or more amino groups is 4.5% by mass or less with respect to the above-described polymer compound:

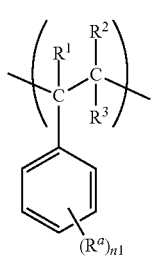
(1)

wherein, in the formula (1), $R^1$, $R^2$ and $R^3$ each independently represent a hydrogen atom or a methyl group, $R^a$ represents a monovalent hydrocarbon group having a number of carbon atoms of 1 to 6, and a plurality of $R^a$ may be combined together to form a ring together with carbon atoms to which they are attached, and n1 represents an integer of 0 to 5:

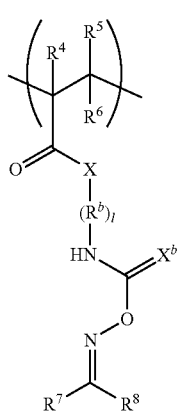
(2)

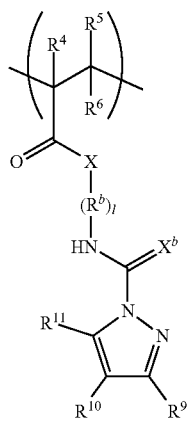
(3)

wherein, in the formulae (2) and (3), $R^4$, $R^5$ and $R^6$ each independently represent a hydrogen atom or a methyl group, $X^b$ represents an oxygen atom or a sulfur atom, $R^7$ to $R^{11}$ each independently represent a hydrogen atom or a monovalent organic group having a number of carbon atoms of 1 to 20, $R^b$ represents a divalent organic group having a number of carbon atoms of 1 to 20, X represents an oxygen atom or a group represented by —$NR^n$—, $R^n$ represents a hydrogen atom or a monovalent organic group having a number of carbon atoms of 1 to 20; and l represents an integer of 1 to 6, and a plurality of $R^b$ may be the same or different:

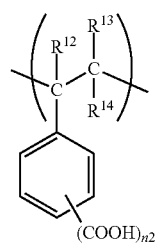
(6)

wherein, in the formula (6), $R^{12}$, $R^{13}$ and $R^{14}$ each independently represent a hydrogen atom or a methyl group, and n2 represents an integer of 1 to 5.

8. A polymer compound containing a repeating unit represented by the formula (1), at least one repeating unit selected from the group consisting of a repeating unit represented by the formula (2) and a repeating unit represented by the formula (3); and a repeating unit represented by the formula (6), wherein the content of the repeating unit represented by the following formula (1) is 75% by mol or more with the total content of all repeating units contained in the above-described polymer compound being 100% by mol:

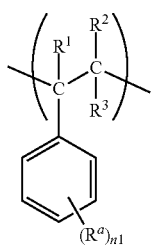
(1)

wherein, in the formula (1), $R^1$, $R^2$ and $R^3$ each independently represent a hydrogen atom or a methyl group, $R^a$ represents a monovalent hydrocarbon group having a number of carbon atoms of 1 to 6, and a plurality of $R^a$ may be combined together to form a ring together with carbon atoms to which they are attached; and n1 represents an integer of 0 to 5

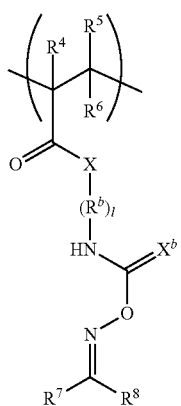
(2)

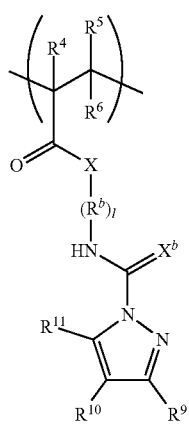
(3)

wherein, in the formulae (2) and (3), $R^4$, $R^5$ and $R^6$ each independently represent a hydrogen atom or a methyl group, $X^b$ represents an oxygen atom or a sulfur atom, $R^7$ to $R^{11}$ each independently represent a hydrogen atom or a monovalent organic group having a number of carbon atoms of 1 to 20, $R^b$ represents a divalent organic group having a number of carbon atoms of 1 to 20, X represents an oxygen atom or a group represented by —$NR^n$—, $R^n$ represents a hydrogen atom or a monovalent organic group having a number of carbon atoms of 1 to 20; and l represents an integer of 1 to 6, and a plurality of $R^b$ may be the same or different:

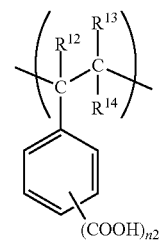
(6)

wherein, in the formula (6), $R^{12}$, $R^{13}$ and $R^{14}$ each independently represent a hydrogen atom or a methyl group and n2 represents an integer of 1 to 5.

9. An ink containing the polymer compound according to claim 8 and an organic solvent.

\* \* \* \* \*